United States Patent
Kusaka

(10) Patent No.: US 8,223,256 B2
(45) Date of Patent: Jul. 17, 2012

(54) CORRELATION CALCULATION METHOD, CORRELATION CALCULATION DEVICE, FOCUS DETECTION DEVICE AND IMAGE-CAPTURING APPARATUS

(75) Inventor: Yosuke Kusaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 552 days.

(21) Appl. No.: 12/385,446

(22) Filed: Apr. 8, 2009

(65) Prior Publication Data

US 2009/0256952 A1   Oct. 15, 2009

(30) Foreign Application Priority Data

Apr. 11, 2008 (JP) ................................. 2008-103300
Apr. 21, 2008 (JP) ................................. 2008-109970

(51) Int. Cl.
*G03B 13/00* (2006.01)
*G03B 3/00* (2006.01)
*H04N 5/232* (2006.01)
(52) U.S. Cl. .................... 348/349; 348/353; 396/128
(58) Field of Classification Search ............ 348/349, 348/353; 396/125, 128
See application file for complete search history.

(56) References Cited

U.S. PATENT DOCUMENTS

2007/0269127 A1   11/2007   Kusaka

FOREIGN PATENT DOCUMENTS

| JP | A-2007-333720 | 12/2007 |
| JP | A-2008-015157 | 1/2008 |

*Primary Examiner* — Rochelle-Ann J Blackman
(74) *Attorney, Agent, or Firm* — Oliff & Berridge, PLC

(57) ABSTRACT

A focus detection device includes: a light-receiving unit that receives a pair of images and outputs a first signal string and a second signal string; a decision-making unit that determines a condition assumed as the light-receiving unit receives the pair of images; a selection unit that selects a correlation operation expression among a plurality of correlation operation expressions in correspondence to the condition; a correlation calculation unit that calculates a correlation quantity between a plurality of first/second signals included in the first/second signal string by applying the correlation operation expression selected; a shift amount detection unit that detects a shift amount between the pair of images; and a focus detection unit that detects a focusing condition. The selection unit selects the correlation operation expression to reduce an extent to which signal intensity difference between the first and the second signal strings affects the correlation quantity.

20 Claims, 53 Drawing Sheets

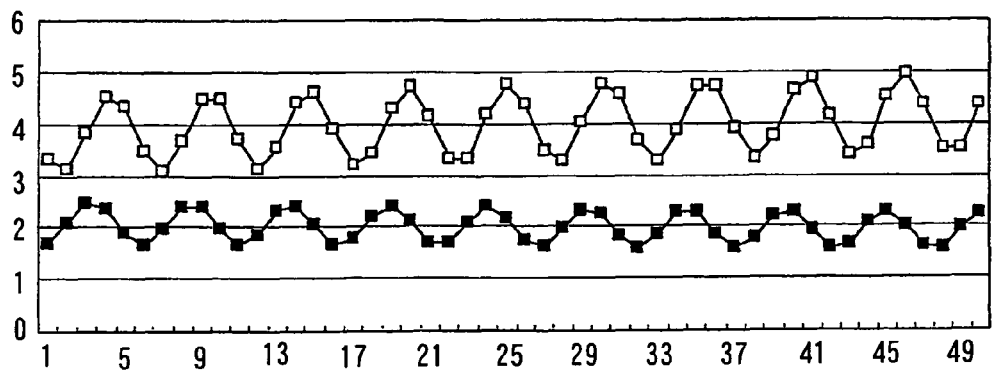
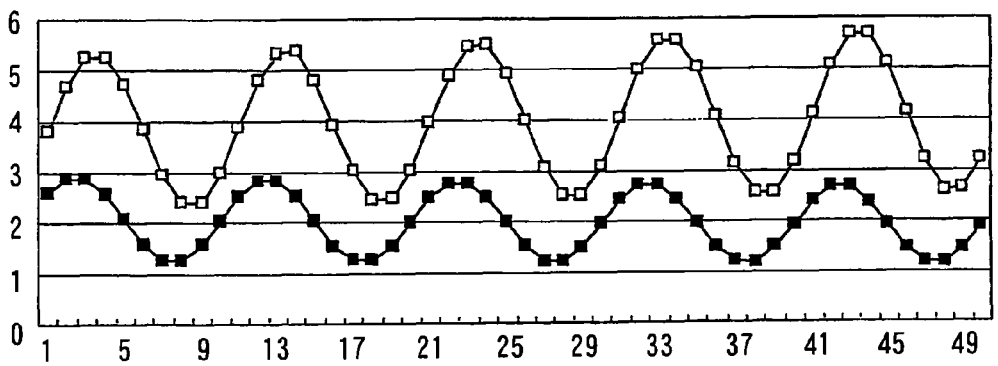
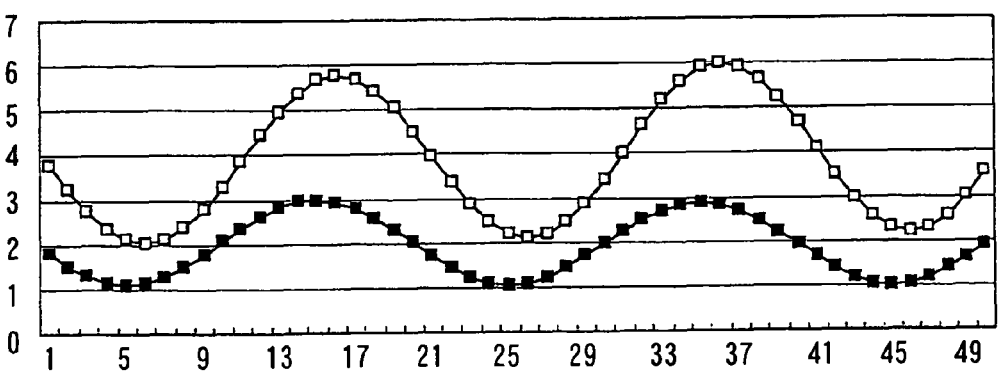

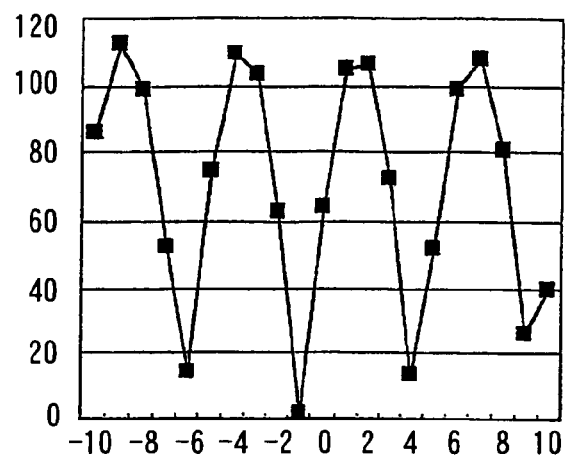
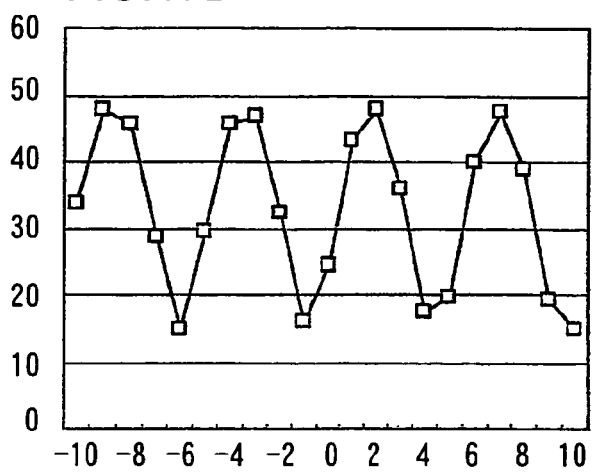
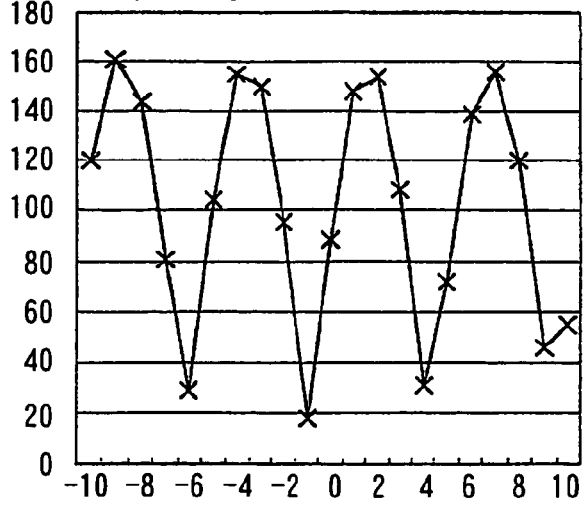

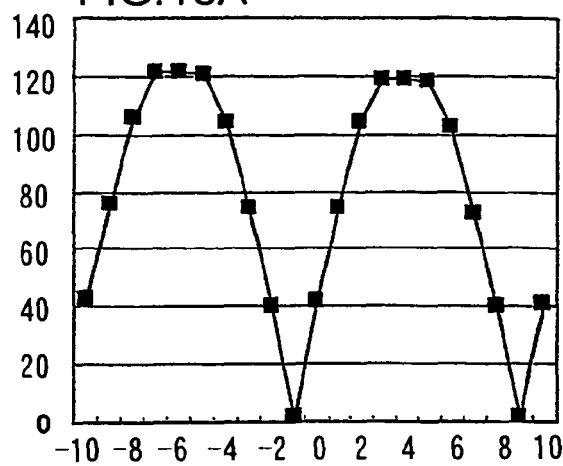
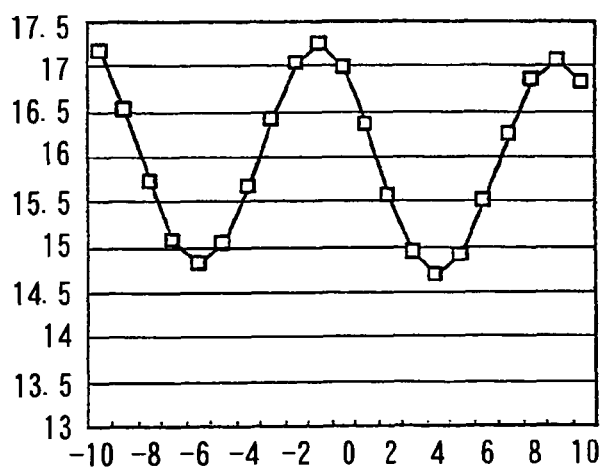
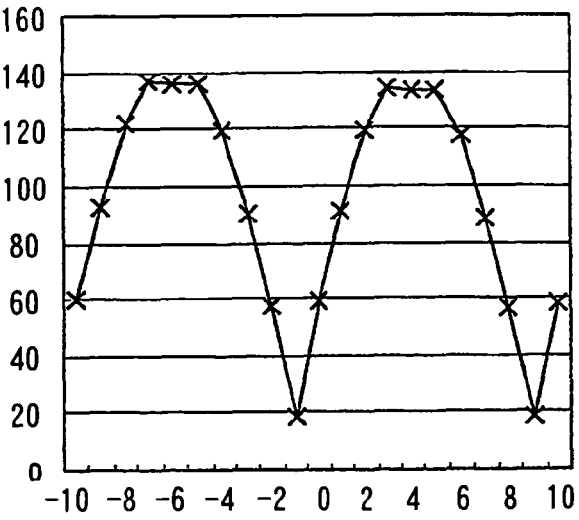

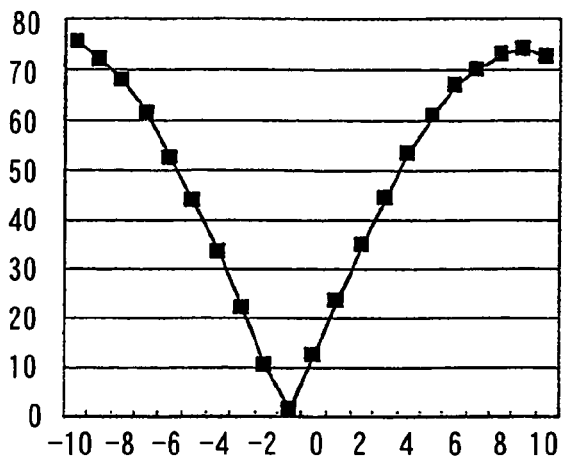
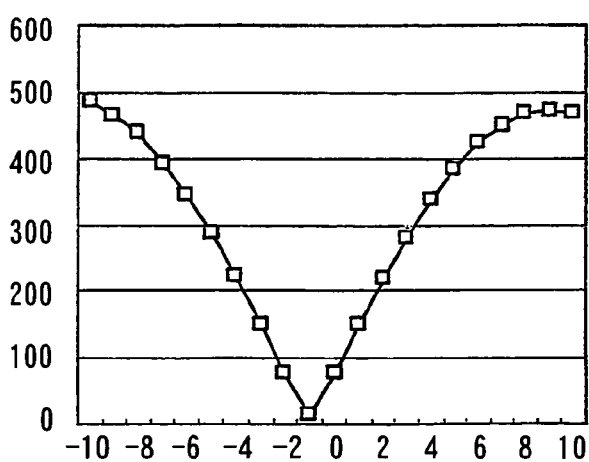
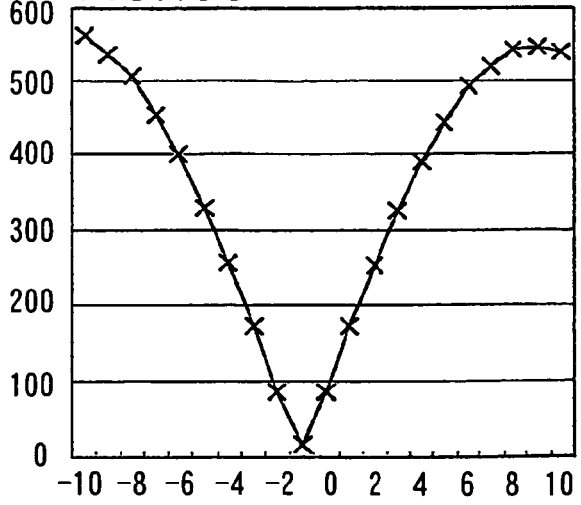

FIG.22

|  | CORRELATION OPERATION EXPRESSION EA | CORRELATION OPERATION EXPRESSION EB | CORRELATION OPERATION EXPRESSION EC |
|---|---|---|---|
| NO VIGNETTING | ◎ | ○ | ○ |
| 0TH ORDER VIGNETTING | × | ◎ | ○ |
| 1ST ORDER VIGNETTING | × | × | ◎ |

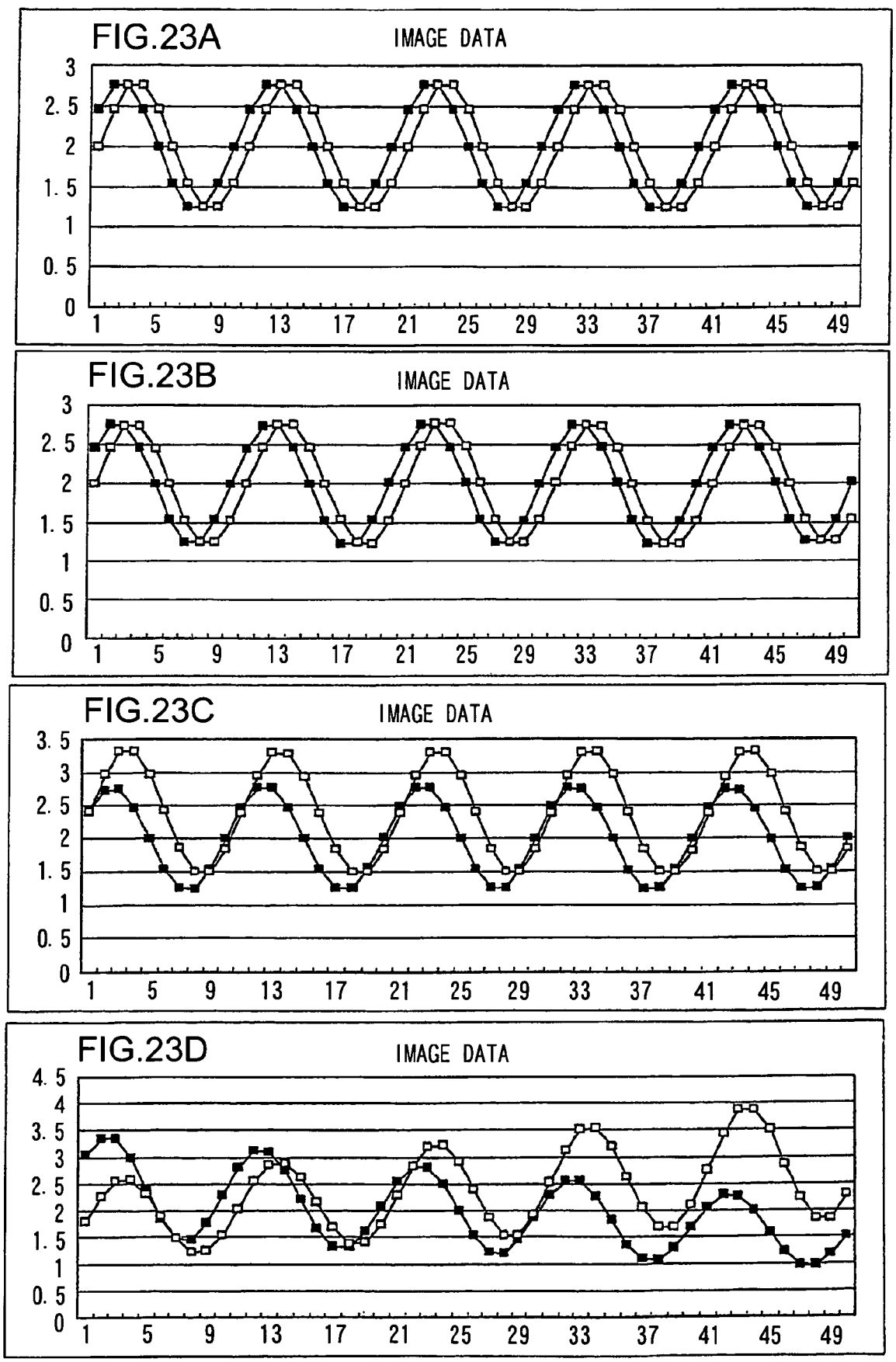

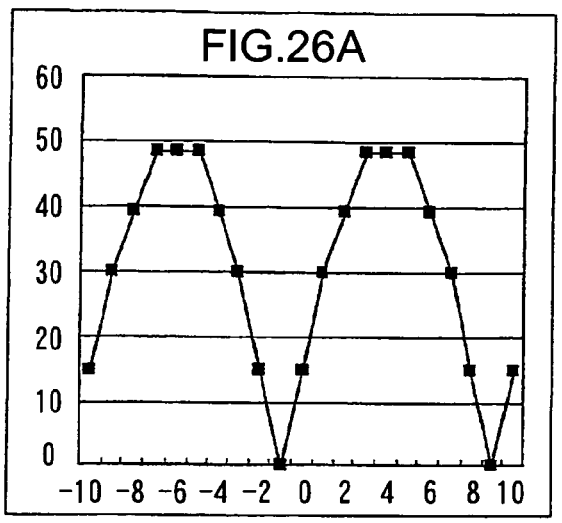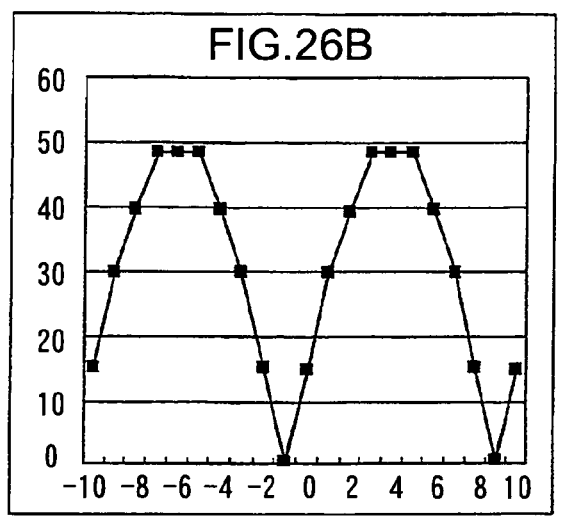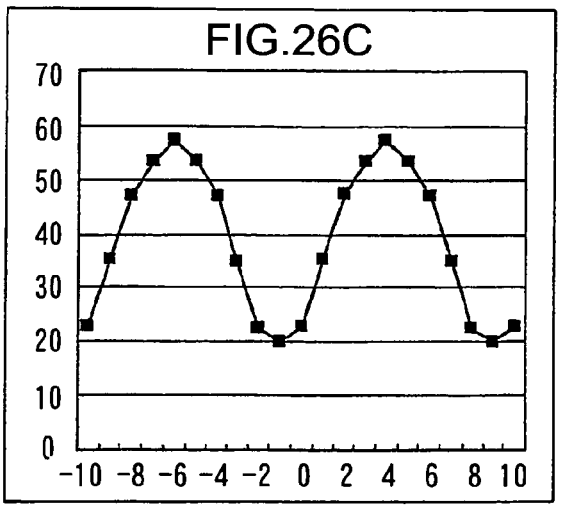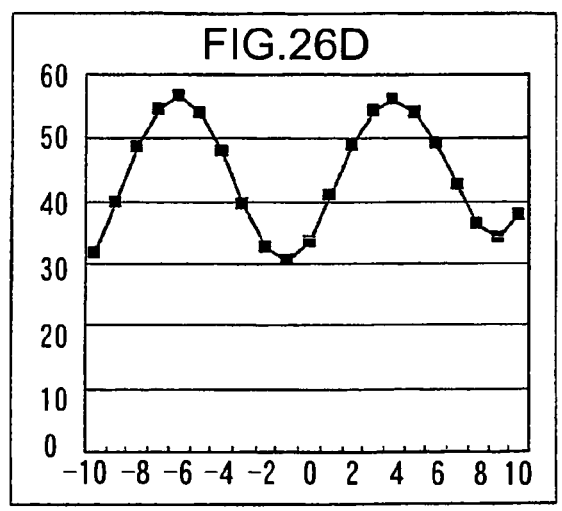

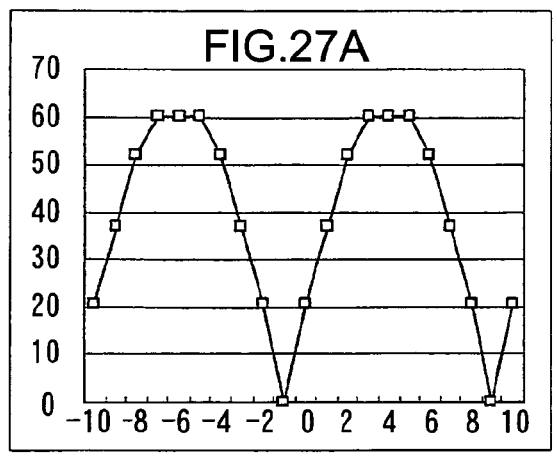
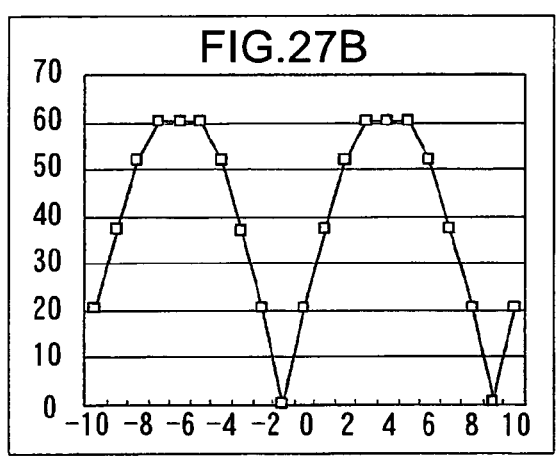
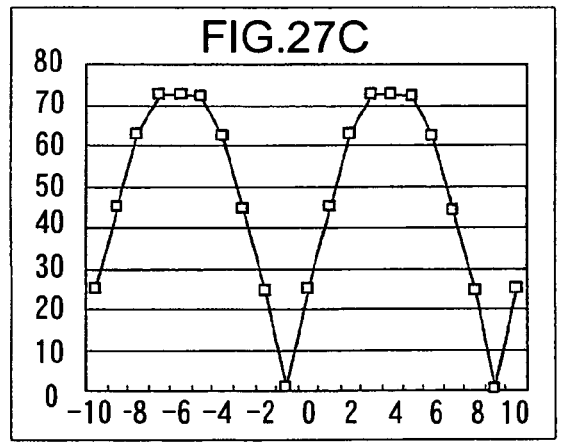
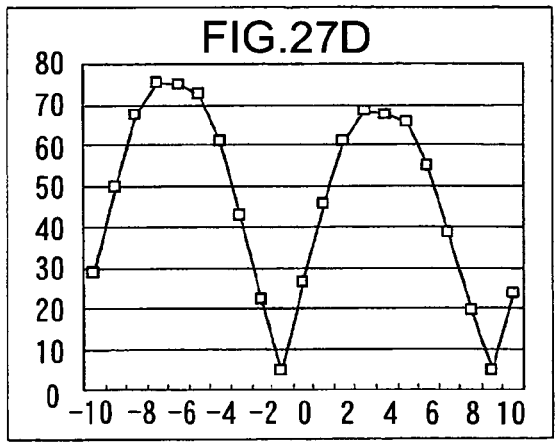

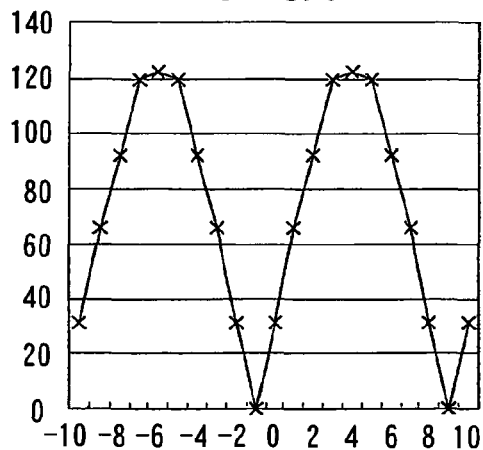
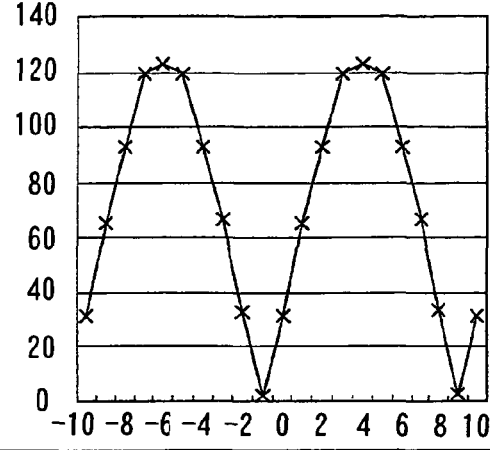
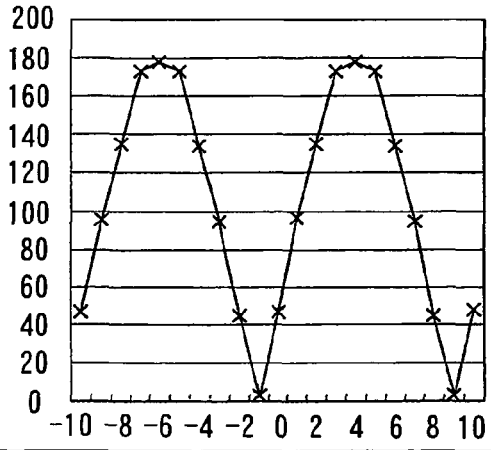
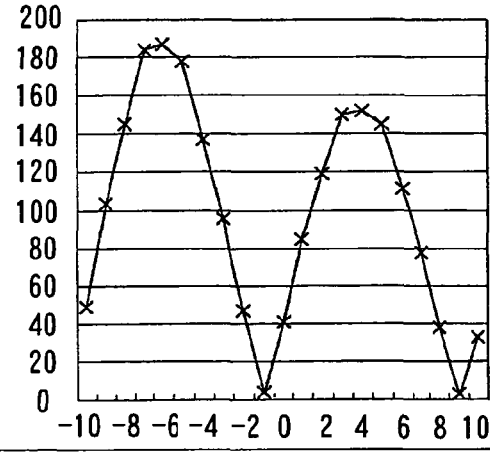

FIG.29

|  | SMALL spn | LARGE spn |
|---|---|---|
| LOW-FREQUENCY IMAGE | ○ | ◎ |
| HIGH-FREQUENCY IMAGE | ◎ | ○ |

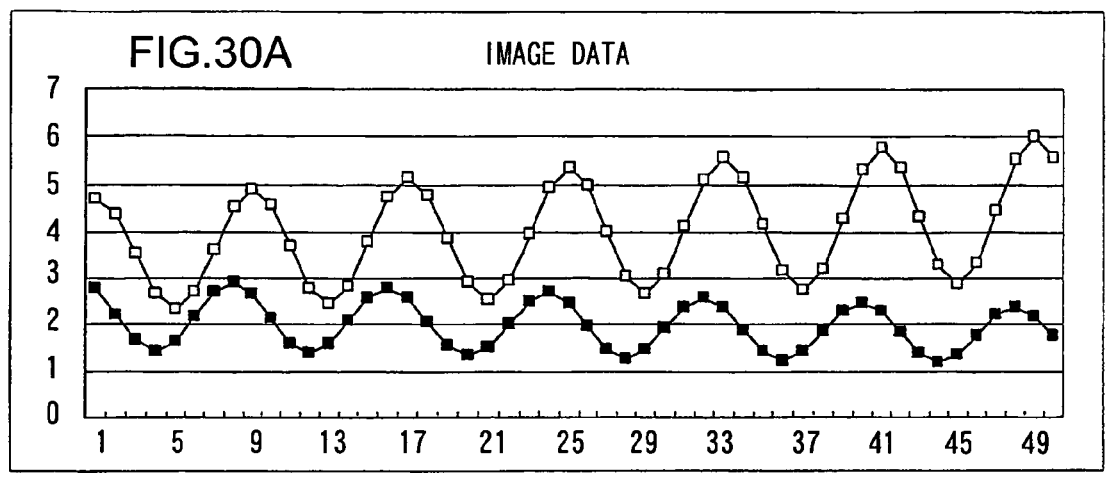
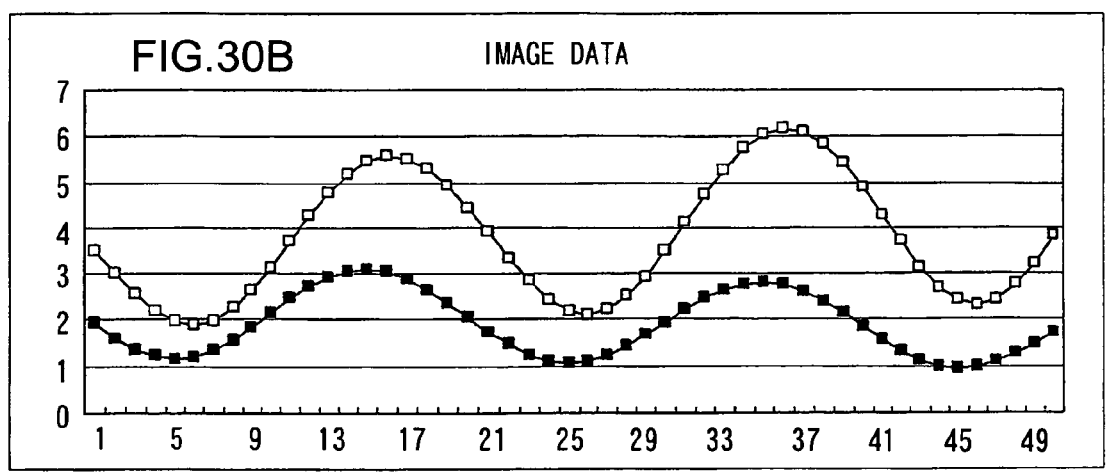

FIG.35

| GAIN | CORRELATION OPERATION EXPRESSION EA | CORRELATION OPERATION EXPRESSION EB | CORRELATION OPERATION EXPRESSION EC |
|---|---|---|---|
| HIGH | ◎ | | |
| MEDIUM | | ◎ | |
| LOW | | | ◎ |

FIG.36

| GAIN | SMALL spn | LARGE spn |
|---|---|---|
| HIGH |  | ◎ |
| LOW | ◎ |  |

FIG.37

| BRIGHTNESS | CORRELATION OPERATION EXPRESSION EA | CORRELATION OPERATION EXPRESSION EB | CORRELATION OPERATION EXPRESSION EC |
|---|---|---|---|
| HIGH | | | ◎ |
| MEDIUM | | ◎ | |
| LOW | ◎ | | |

FIG.38

| BRIGHTNESS | SMALL spn | LARGE spn |
|---|---|---|
| HIGH | ◎ | |
| LOW | | ◎ |

FIG.39

| CONTRAST | CORRELATION OPERATION EXPRESSION EA | CORRELATION OPERATION EXPRESSION EB | CORRELATION OPERATION EXPRESSION EC |
|---|---|---|---|
| HIGH | | | ◎ |
| MEDIUM | | ◎ | |
| LOW | ◎ | | |

FIG.40

| CONTRAST | SMALL spn | LARGE spn |
|---|---|---|
| HIGH | ◎ | |
| LOW | | ◎ |

FIG.41

| DEFOCUS | CORRELATION OPERATION EXPRESSION EA | CORRELATION OPERATION EXPRESSION EC | CORRELATION OPERATION EXPRESSION EC |
|---|---|---|---|
| SMALL | | | ◎ |
| MEDIUM | | ◎ | |
| LARGE | ◎ | | |

FIG.42

| DEFOCUS | SMALL spn | LARGE spn |
|---------|-----------|-----------|
| SMALL   | ◎         |           |
| LARGE   |           | ◎         | ed # CORRELATION CALCULATION METHOD, CORRELATION CALCULATION DEVICE, FOCUS DETECTION DEVICE AND IMAGE-CAPTURING APPARATUS

INCORPORATION BY REFERENCE

The disclosures of the following priority applications are herein incorporated by reference: Japanese Patent Application No. 2008-103300 filed Apr. 11, 2008 and Japanese Patent Application No. 2008-109970 filed Apr. 21, 2008.

BACKGROUND OF THE INVENTION

1. Field of the Invention

The present invention relates to a correlation calculation method, a correlation calculation device, a focus detection device and an image-capturing apparatus.

2. Description of Related Art

A focus detection device such as that disclosed in Japanese Laid Open Patent Publication No. 2007-333720, calculates the extent of displacement (image shift amount, shift amount) indicating the relative displacement between a pair of data strings corresponding to a pair of images manifesting distortion relative to each other. This device calculates a correlation quantity indicating the degree of correlation by adjusting a shift amount k based upon a correlation operation expression that includes multiplication of the data in the pair of data strings.

SUMMARY OF THE INVENTION

However, the correlation operation expression used in the focus detection device in the related art described above to calculate the correlation quantity does not sustain the optimal calculation characteristics in a certain image data state (depending upon the extent of vignetting, the noise level or the like). In other words, if the correlation operation expression is used indiscriminately, the image shift detection accuracy may be lowered.

According to the first aspect of the invention, a focus detection device comprises: a light-receiving unit that receives a pair of images formed with a pair of light fluxes passing through an optical system and outputs a first signal string and a second signal string corresponding to the pair of images; a decision-making unit that determines a condition assumed as the light-receiving unit receives the pair of images; a selection unit that selects a correlation operation expression among a plurality of correlation operation expressions, to be used to calculate a correlation between the first signal string and the second signal string, in correspondence to the condition determined by the decision-making unit; a correlation calculation unit that calculates a correlation quantity indicating an extent of correlation between a plurality of first signals included in the first signal string and a plurality of second signals included in the second signal string by applying the correlation operation expression selected by the selection unit to the plurality of first signals and the plurality of second signals; a shift amount detection unit that detects a shift amount indicating an extent of shift between the pair of images based upon an extent of relative shift between the first signal string and the second signal string manifesting when the correlation quantity calculated by the correlation calculation unit assumes an extreme value; and a focus detection unit that detects a focusing condition for the optical system based upon the shift amount detected by the shift amount detection unit. The selection unit selects the correlation operation expression so as to reduce an extent to which signal intensity difference between the first signal string and the second signal string affects the correlation quantity indicating the extent of correlation between the plurality of first signals and the plurality of second signals.

According to the second aspect of the invention, in the focus detection device according to the first aspect it is preferred that at least one correlation operation expression among the plurality of correlation operation expressions includes a multiplication operation in which at least one of the plurality of first signals is multiplied by at least one of the plurality of second signals.

According to the third aspect of the invention, in the focus detection device according to the second aspect, it is preferred that the plurality of correlation operation expressions differ from one another in the number of times the multiplication operation is executed.

According to the fourth aspect of the invention, in the focus detection device according to the second aspect, it is preferred that the multiplication operation is an operation in which one of the plurality of first signals is multiplied by one of the plurality of second signals.

According to the fifth aspect of the invention, in the focus detection device according to the second aspect, it is preferred that the plurality of first signals and the plurality of second signals each include at least three signals. The multiplication operation is an operation in which at least three signals are multiplied, including at least one of the plurality of first signals and at least one of the plurality of second signals.

According to the sixth aspect of the invention, in the focus detection device according to the first aspect, it is preferred that the signal intensity difference is attributable to signal distortion having occurred in at least either the first signal string or the second signal string. The selection unit selects a plurality of correlation operation expressions assuming different characteristics in relation to the signal distortion from one another.

According to the seventh aspect of the invention, in the focus detection device according to the first aspect, it is preferred that the signal intensity difference is related to noise having occurred in at least either the first signal string or the second signal string. The selection unit selects a plurality of correlation operation expressions assuming different characteristics in relation to the noise from one another.

According to the eighth aspect of the invention, in the focus detection device according to the first aspect, it is preferred that the condition is at least one of: a state of vignetting of the pair of light fluxes manifesting in the optical system, an image height assumed at the light-receiving unit that receives the pair of images, noise having occurred in at least either the first signal string or the second signal string, a brightness level of a subject, the focusing condition for the optical system, a spatial frequency component in the pair of images and characteristics of the pair of images.

According to the ninth aspect of the invention, in the focus detection device according to the first aspect, it is preferred that a plurality of focus detection pixels are arrayed at the light-receiving unit. The plurality of focus detection pixels each include a micro lens and a photoelectric conversion unit that receives light from the optical system via the micro lens. The light-receiving unit generates the first signal string and the second signal string based upon outputs from the plurality of focus detection pixels.

According to the tenth aspect of the invention, an image-capturing apparatus comprises: a focus detection device according to the ninth aspect; and an image sensor.

According to the eleventh aspect of the invention, in the image-capturing apparatus according to the tenth aspect, it is preferred that a plurality of imaging pixels that capture an image formed via the optical system and the plurality of focus detection pixels are arrayed on a single substrate. The image sensor includes the single substrate.

According to the twelfth aspect of the invention, a correlation calculation method comprises: creating a relative displacement one-dimensionally in a positional relationship between a first signal string that includes a plurality of first signals arranged one-dimensionally and a second signal string that includes a plurality of second signals arranged one-dimensionally; and calculating correlation quantities between the first signal string and the second signal string, by using a plurality of correlation operation expressions as a displacement extent of the relative displacement is altered.

According to the thirteenth aspect of the invention, in the correlation calculation method according to the twelfth aspect, it is preferred that at least one correlation operation expression among the plurality of correlation operation expressions includes a multiplication operation in which at least one of the plurality of first signals is multiplied by at least one of the plurality of second signals.

According to the fourteenth aspect of the invention, in the correlation calculation method according to the thirteenth aspect, it is preferred that the plurality of correlation operation expressions include a first correlation operation expression containing a multiplication operation, in which a given first signal among the plurality of first signals in the first signal string and a specific second signal in the second signal string assuming a position separated from the given first signal by a first displacement quantity are multiplied by each other, and a second correlation operation expression containing a multiplication operation, in which the given first signal is multiplied by a specific second signal in the second signal string assuming a position separated from the given first signal by a second displacement quantity.

According to the fifteenth aspect of the invention, in the correlation calculation method according to the twelfth aspect, it is preferred that the correlation calculation method further comprises determining a total sum of the correlation quantities calculated with the plurality of correlation operation expressions.

According to the sixteenth aspect of the invention, in the correlation calculation method according to the twelfth aspect, it is preferred that the correlation calculation method further comprises judging reliability of each of the correlation quantities calculated by using the plurality of correlation operation expressions; and extracting a correlation quantity judged to be highly reliable.

According to the seventeenth aspect of the invention, in the correlation calculation method according to the sixteenth aspect, it is preferred that the correlation quantities are calculated by using the plurality of correlation operation expressions in a predetermined order. Once the correlation quantity judged to be highly reliable is extracted, calculation of the correlation quantities ends.

According to the eighteenth aspect of the invention, a correlation calculation device comprises: a calculation unit that calculates the correlation quantities by adopting the correlation calculation method according to the twelfth aspect and then calculates the displacement extent corresponding to an extreme value of the correlation quantities.

According to the nineteenth aspect of the invention, a focus detection device comprises: a light-receiving unit that receives a pair of light fluxes passing through an optical system to form a pair of images and outputs pairs of light reception signals with each pair of light reception signals made up with one of a plurality of first signals included in a first signal string corresponding to one of the pair of images and one of a plurality of second signals included in a second signal string corresponding to another image in the pair, each assuming a displacement relative to one of the first signals; the correlation calculation device according to the tenth aspect that calculates the displacement extent corresponding to the extreme value; and a focus detection unit that detects a focusing condition for the optical system based upon the displacement extent.

BRIEF DESCRIPTION OF THE DRAWINGS

FIGS. 16A~16C each present a graph of a pair of sets of image data;

FIGS. 17A~17C respectively present graphs of correlation quantities C1($k$), C2($k$) and C($k$) calculated in a state of image shift achieved by shifting the pair of sets of image data in FIG. 16A relative to each other by −1 when the shift increment unit is set to match the data pitch;

FIGS. 18A~18C respectively present graphs of correlation quantities C1($k$), C2($k$) and C($k$) calculated in a state of image shift achieved by shifting the pair of sets of image data in FIG. 16B relative to each other by −1 when the shift increment unit is set to match the data pitch;

FIGS. 19A~19C respectively present graphs of correlation quantities C1($k$), C2($k$) and C(k) calculated in a state of image shift achieved by shifting the pair of sets of image data in FIG. 16C relative to each other by −1 when the shift increment unit is set to match the data pitch;

FIG. 22 is a table comparing the characteristics of the correlation operation expressions EA, EB and EC;

FIGS. 23A~23D each show a pair of sets of image data;

FIGS. 26A~26D each present a graph of the correlation quantity C(k) calculated using the correlation operation expression EA on image data manifesting a state of image shift achieved by shifting a given pair of sets of image data in FIG. 23 relative to each other by −1 when the shift increment unit is set to match the data pitch;

FIGS. 27A~27D each present a graph of the correlation quantity C(k) calculated using the correlation operation expression EB on image data manifesting a state of image shift achieved by shifting a given pair of sets of image data in FIG. 23 relative to each other by −1 when the shift increment unit is set to match the data pitch;

FIGS. 28A~28D each present a graph of the correlation quantity C(k) calculated using the correlation operation expression EC on image data manifesting a state of image shift achieved by shifting a given pair of sets of image data in FIG. 23 relative to each other by −1 when the shift increment unit is set to match the data pitch;

FIG. 29 is a table comparing the relation between the parameter spn in the correlation operation expression EB and the data frequency component with the relation between the parameter spn in the correlation calculation EC and the data frequency component;

FIGS. 30A and 30B each show a pair of sets of image data;

FIG. 35 shows how the correlation operation expression EA, EB or EC may be selected in correspondence to the gain assumed at the amplifier;

FIG. 36 shows how the parameter spn in the correlation operation expressions EB and EC may be adjusted in correspondence to the gain assumed at the amplifier;

FIG. 37 shows how the correlation operation expression EA, EB or EC may be selected in correspondence to the brightness;

FIG. 38 shows how the parameter spn in the correlation operation expressions EB and EC may be adjusted in correspondence to the brightness;

FIG. 39 shows how the correlation operation expression EA, EB or EC may be selected in correspondence to the contrast;

FIG. 40 shows how the parameter spn in the correlation operation expressions EB and EC may be adjusted in correspondence to the contrast;

FIG. 41 shows how the correlation operation expression EA, EB or EC may be selected in correspondence to the defocus amount;

FIG. 42 shows how the parameter spn in the correlation operation expressions EB and EC may be adjusted in correspondence to the defocus amount;

DESCRIPTION OF PREFERRED EMBODIMENTS

First Embodiment

Figure 1:
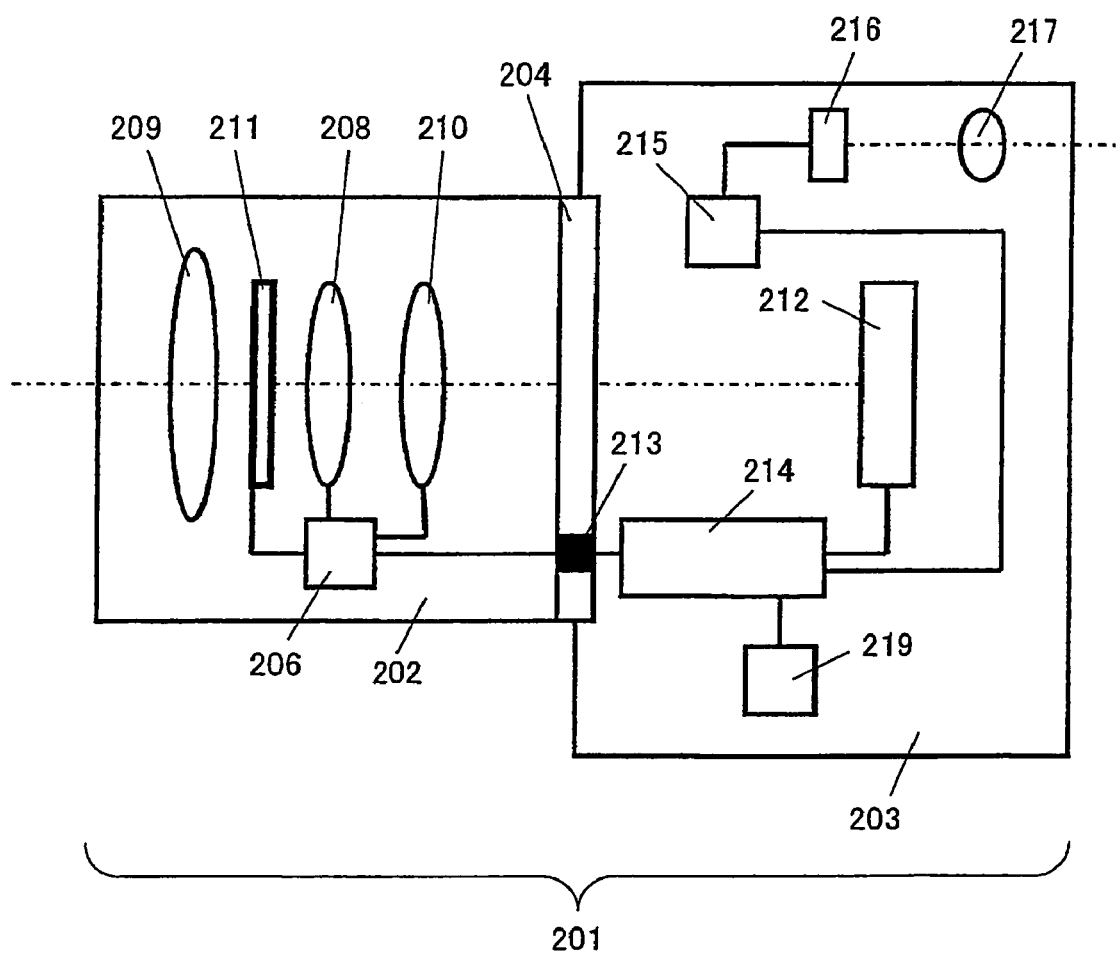
FIG. 1 is a lateral sectional view showing the structure adopted in a camera in an embodiment.

A digital still camera used in conjunction with exchangeable lenses, representing an example of an image-capturing apparatus equipped with the focus detection device achieved in an embodiment of the present invention is now explained. FIG. 1 is a lateral sectional view of the structure adopted in the camera in the embodiment. A digital still camera 201 achieved in the embodiment includes an exchangeable lens 202 and a camera body 203. The exchangeable lens 202 is mounted at the camera body 203 via a mount unit 204. Any one of exchangeable lenses 202 that includes various image forming optical systems can be mounted at the camera body 203 via the mount unit 204.

The exchangeable lens 202 includes a zooming lens 208, a focusing lens 210, an aperture 211, a lens drive control device 206 and the like. The lens drive control device 206 is constituted with a microcomputer, a memory, a drive control circuit and the like (none shown). The lens drive control device 206 engages in communication with a body drive control device 214 to be detailed later to transmit lens information to the body drive control device and receive camera information from the body drive control device, as well as executing drive control of the focusing lens 210 and the aperture 211 and detecting the states of the zooming lens 208, the focusing lens 210 and the aperture 211. The aperture 211 forms an opening with a variable opening diameter, centered on the optical axis, so as to adjust the amount of light and adjust the extent of blurring.

An image sensor 212, the body drive control device 214, a liquid crystal display element drive circuit 215, a liquid crystal display element 216, an eyepiece lens 217, a memory card 219 and the like are disposed at the camera body 203. Imaging pixels are two-dimensionally arrayed at the image sensor 212 and focus detection pixels are also built into the image sensor over areas corresponding to focus detection positions. The image sensor 212 is to be described in detail later.

The body drive control device 214 includes a microcomputer, a memory, a drive control circuit and the like. It executes drive control of the image sensor 212, reads out image signals and focus detection signals, repeatedly executes focus detection calculation based upon focus detection signals and adjusts focus in the exchangeable lens 202, processes and records the image signals and controls camera operations. In addition, the body drive control device 214 engages in communication with the lens drive control device 206 via an electrical contact point 213 to receive the lens information and transmit the camera information (indicating the defocus amount, the aperture value and the like).

The liquid crystal display element 216 functions as an electronic viewfinder (EVF). A live image (through image) provided by the image sensor 212, brought up on display at the liquid crystal display element 216 by the liquid crystal display element drive circuit 215, can be observed by the photographer via the eyepiece lens 217. The memory card 219 is an image storage medium in which an image captured by the image sensor 212 is stored.

A subject image is formed on the light receiving surface of the image sensor 212 with a light flux having passed through the exchangeable lens 202. The subject image undergoes photoelectric conversion at the image sensor 212 and subsequently, image signals and focus detection signals are transmitted to the body drive control device 214.

The body drive control device 214 calculates the defocus amount indicating the extent of defocus based upon focus detection signals output from the focus detection pixels at the image sensor 212 and transmits this defocus amount to the lens drive control device 206. In addition, the body drive control device 214 processes the image signals provided from the image sensor 212 and stores the processed image signals into the memory card 219. It also provides through image signals from the image sensor 212 to the liquid crystal display element drive circuit 215 so as to bring up a through image on display at the liquid crystal display element 216. Moreover, the body drive control device 214 provides aperture control information to the lens drive control device 206 to enable control of the aperture 211.

The lens drive control device 206 updates the lens information in correspondence to the current focusing state, zooming state and aperture setting state, F number for the maximum aperture and the like. More specifically, the lens drive control device 206 detects the positions of the zooming lens 208 and the focusing lens 210 and the aperture value set for the aperture 211, and calculates correct lens information based upon the lens positions and the aperture value. Alternatively, it may select the lens information corresponding to the lens positions and the aperture value from a lookup table prepared in advance.

The lens drive control device 206 calculates a lens drive quantity indicating the extent to which the lens is to be driven based upon the defocus amount having been received and drives the focusing lens 210 to a focusing position based upon the lens drive quantity. The lens drive control device 206 also drives the aperture 211 in correspondence to the aperture value it has received.

Figure 2:
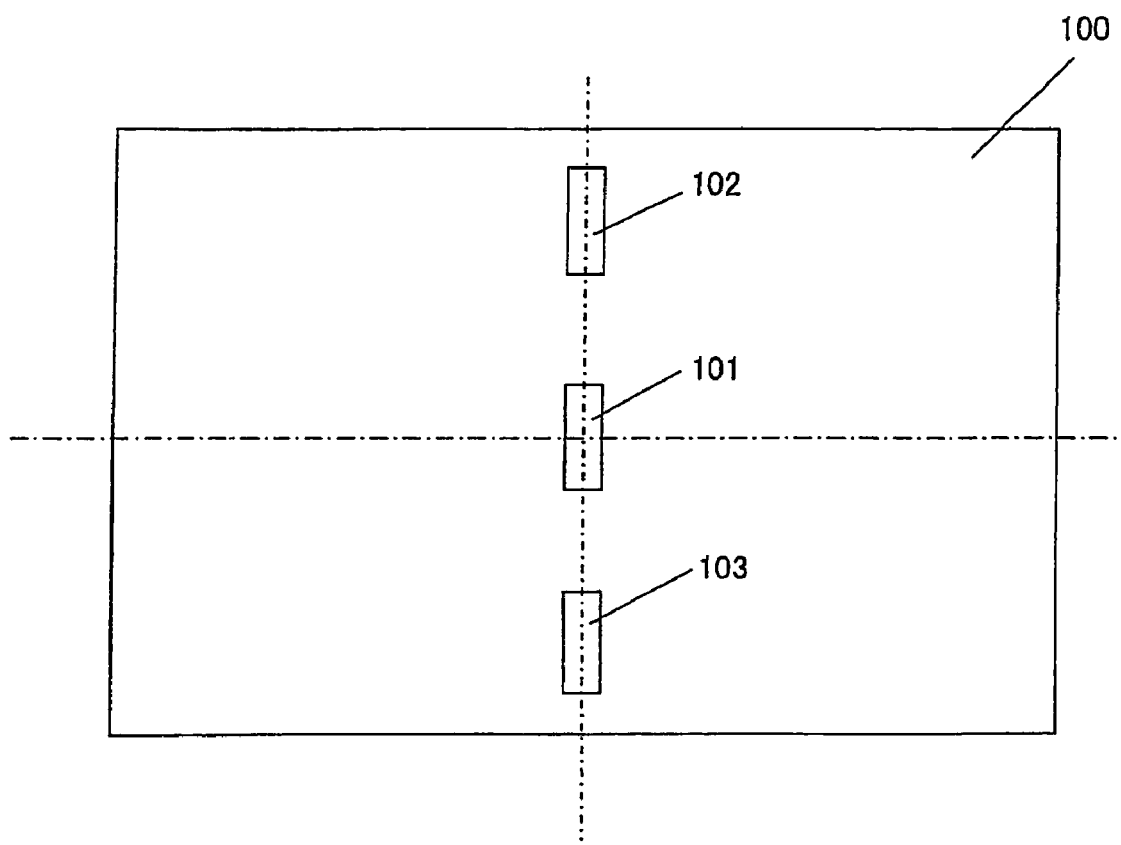
FIG. 2 shows focus detection positions set on the photographic image plane of the exchangeable lens.

Focus detection positions (focus detection areas) set on the photographic image plane of the exchangeable lens 202, at which an image is sampled on the photographic image plane for focus detection via focus detection pixel rows to be detailed later, are shown in FIG. 2. In this example, three focus detection areas 101 through 103 are set at the center, on the upper side and on the lower side of a rectangular photographic image plane 100. Focus detection pixels are arrayed along a straight line along the longer side of each of the focus detection areas indicated as rectangular areas.

It is to be noted that as described in detail later, focus detection light fluxes tend to be readily vignetted in the focus detection areas 102 and 103 set along the radial directions from the image plane center and taking up positions in the peripheral areas of the image plane among the focus detection areas 101~103 in FIG. 2, compared to focus detection light fluxes arriving at the focus detection area 101 at the image plane center, resulting in relative distortion manifested in the individual pairs of focus detection signal data strings (signal data rows, signal data columns) detected in the focus detection areas 102 and 103, which ultimately disrupts the uniformity between the focus detection signal data strings. However, even when a relative distortion manifested in the signal data strings in a given pair disrupts the data uniformity, the correlation calculation method achieved in the embodiment enables accurate calculation of the correlational relationship, which ultimately makes it possible to obtain accurate focus detection results.

Figure 3:
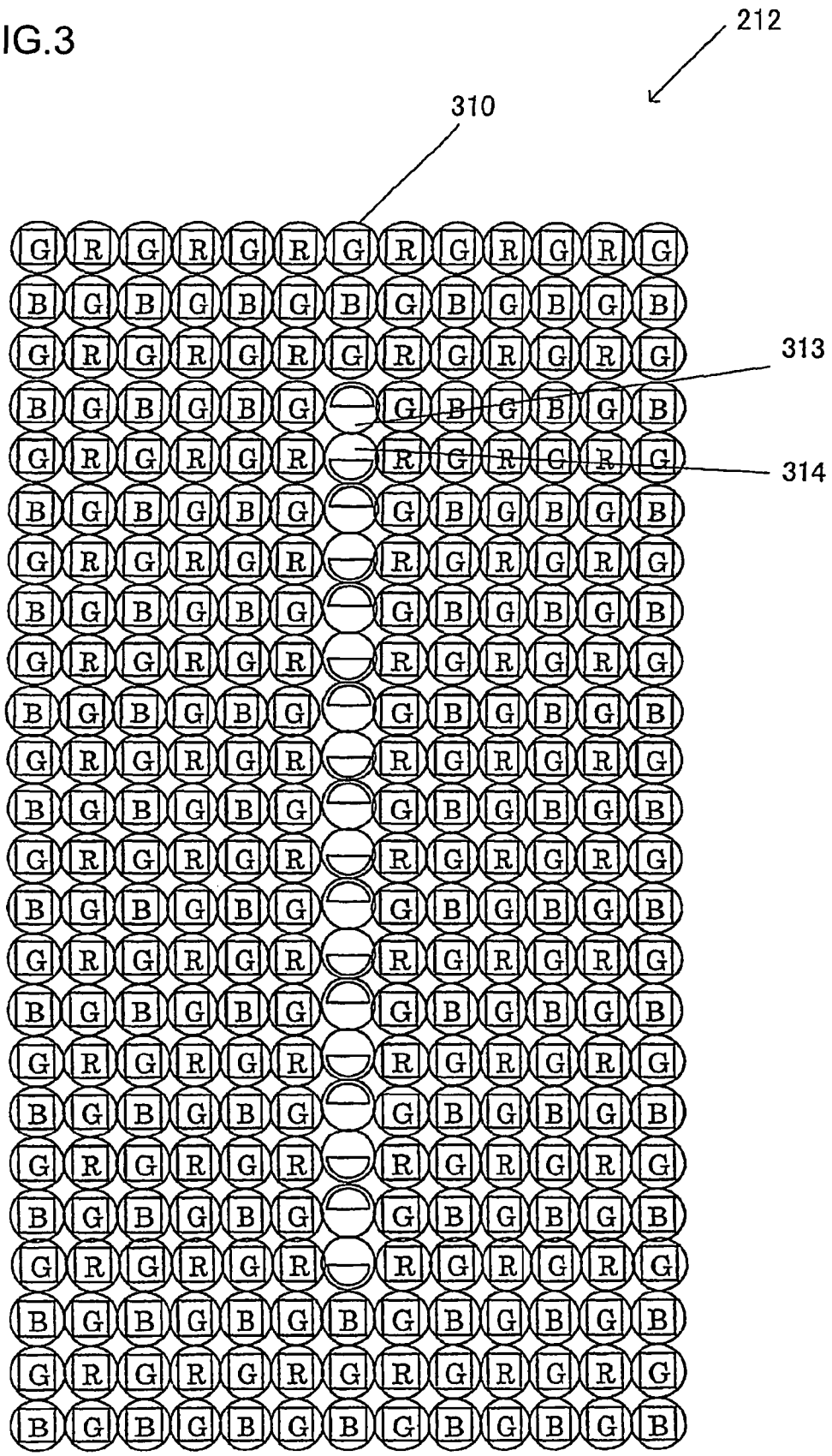
FIG. 3 is a front view showing in detail the structure of the image sensor.

FIG. 3 is a front view showing in detail the structure adopted in the image sensor 212, in an enlargement of the vicinity of the focus detection area 101 at the image sensor 212. The image sensor 212 includes imaging pixels 310 disposed in a dense two-dimensional square grid array and focus detection pixels 313 and 314 engaged in focus detection are disposed alternately to each other so that a focus detection pixel 313 takes up a position next to a focus detection pixel 314 in a reiterative pattern along a vertical straight line over an area corresponding to the focus detection area 101. It is to be noted that although not shown, the image sensor assumes structures similar to that shown in FIG. 3 in the vicinity of the focus detection areas 102 and 103.

Figure 4:
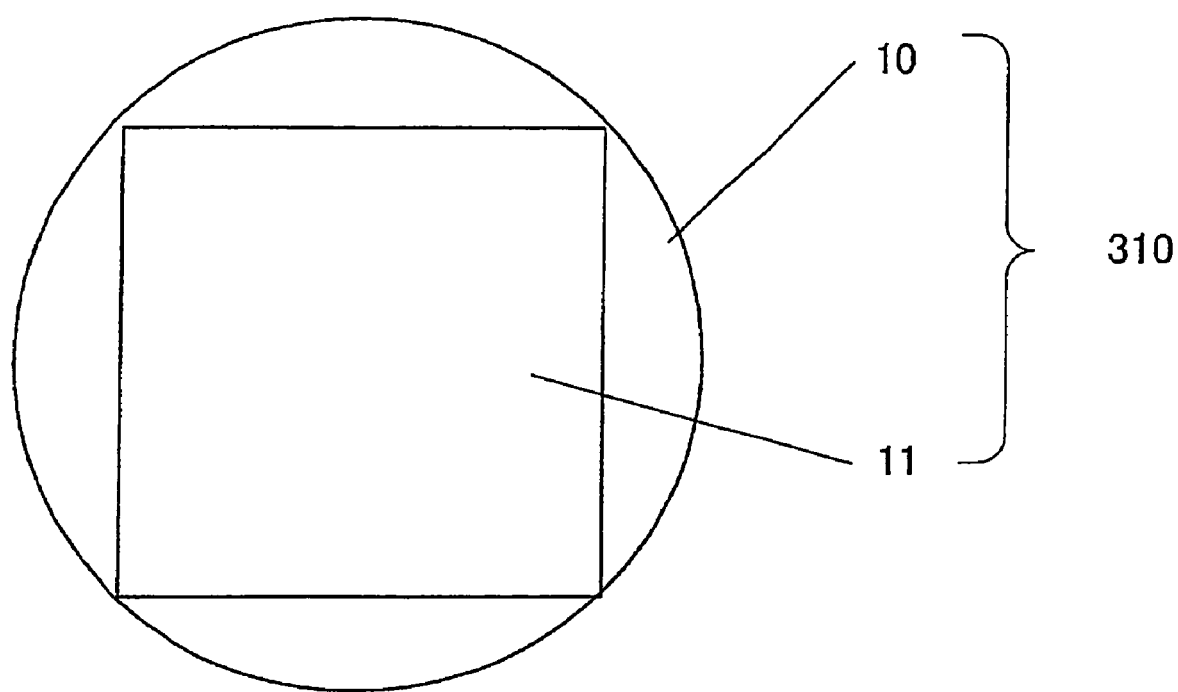
FIG. 4 is a front view of the structure adopted in the imaging pixels.
Figure 6:
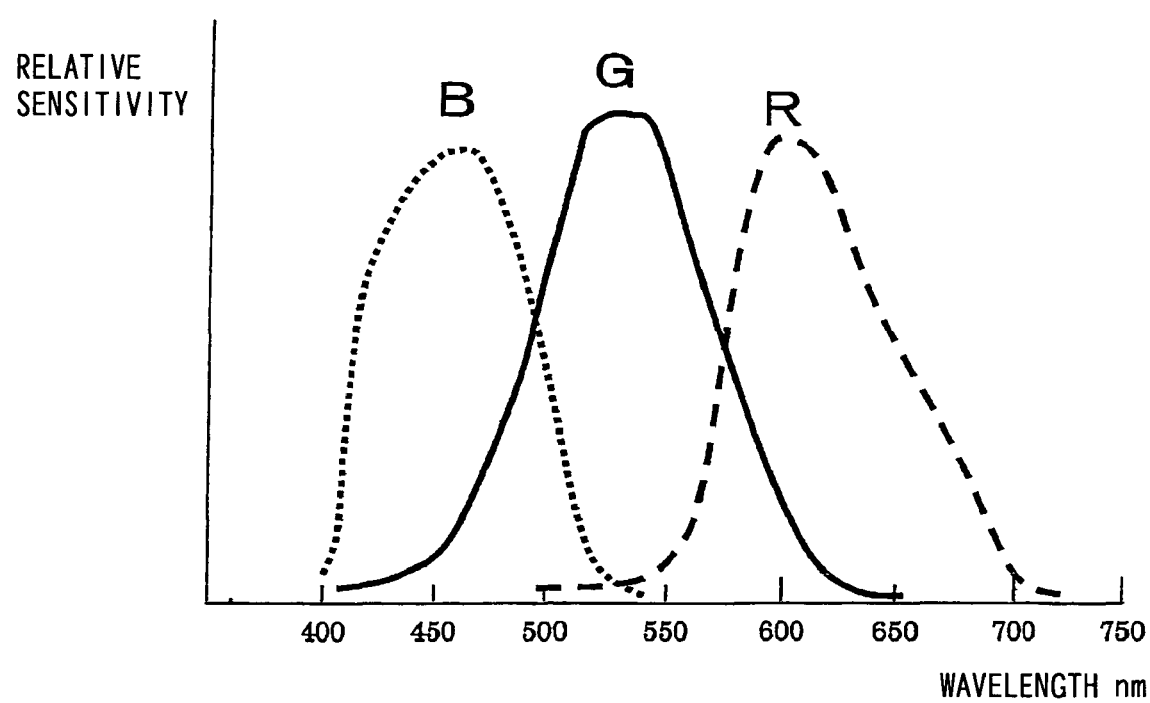
FIG. 6 shows the spectral characteristics of the imaging pixels.

As shown in FIG. 4, the imaging pixels 310 each include a micro-lens 10, a photoelectric conversion unit 11 and a color filter (not shown). The color filters at the individual imaging pixels each assume one of the three colors, red (R), green (G) and blue (B). The red, green and blue color filters assume spectral sensitivity characteristics shown in FIG. 6. The imaging pixels, each equipped with a red, green or blue color filter, are arranged in a Bayer array at the image sensor 212.

Figure 5A:
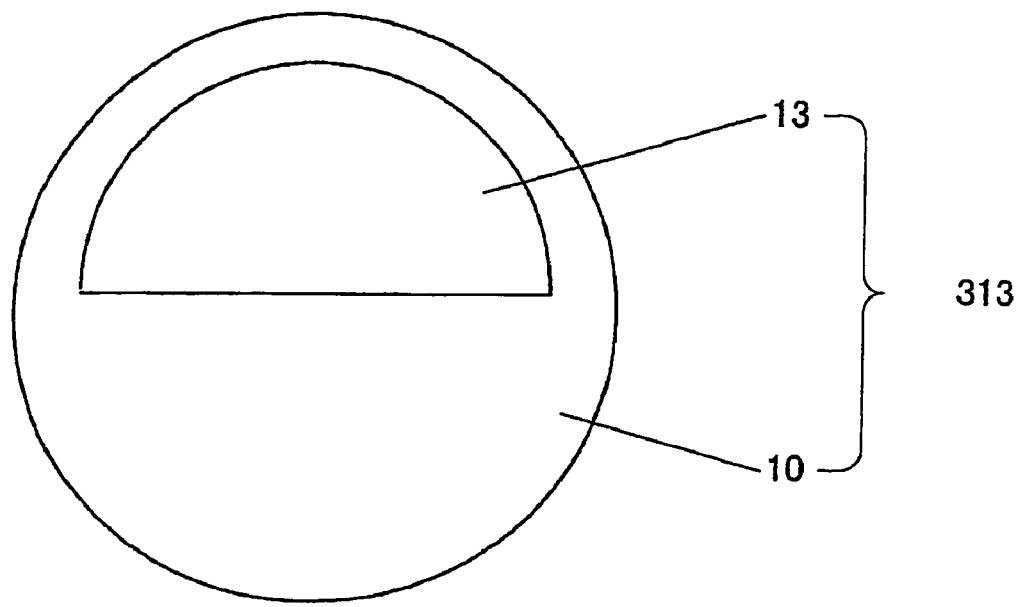
FIGS. 5A and 5B are front views showing the structures adopted in the focus detection pixels.
Figure 5B:
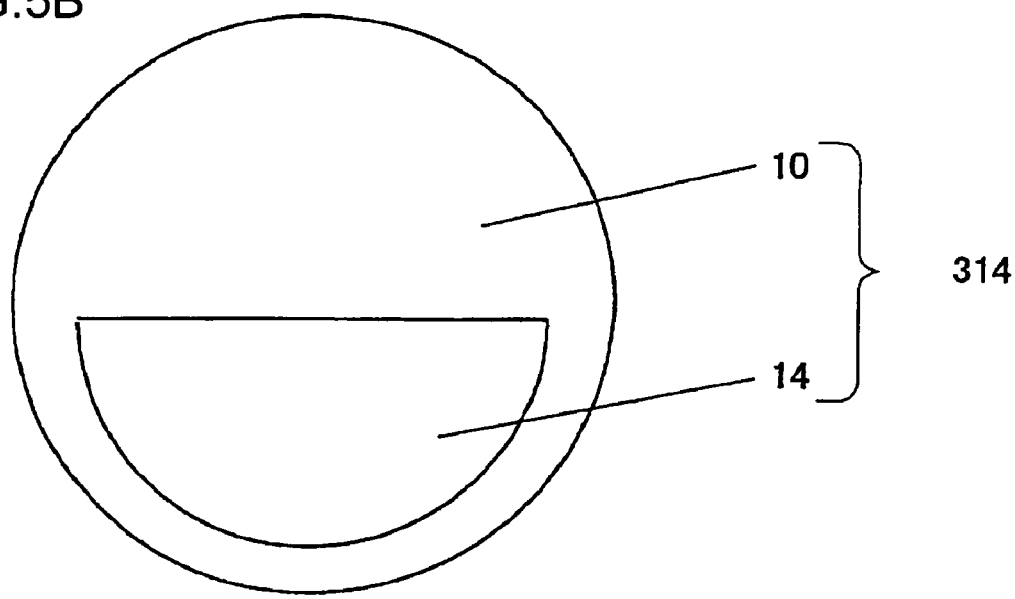

As shown in FIG. 5A, the focus detection pixels 313 each include a micro-lens 10 and a photoelectric conversion unit 13 assuming a semicircular shape. In addition, as shown in FIG. 5B, the focus detection pixels 314 each include a micro-lens 10 and a photoelectric conversion unit 14 assuming a semicircular shape. When the focus detection pixel 313 and the focus detection pixel 314 are set one on top of the other by aligning their micro-lenses 10, the photoelectric conversion units 13 and 14 shall range side by side along the vertical direction. The focus detection pixels 313 and the focus detection pixels 314 are disposed alternately to each other along the vertical direction (along the direction in which the photoelectric conversion units 13 and 14 range side-by-side) in the focus detection areas 101~103.

Figure 7:
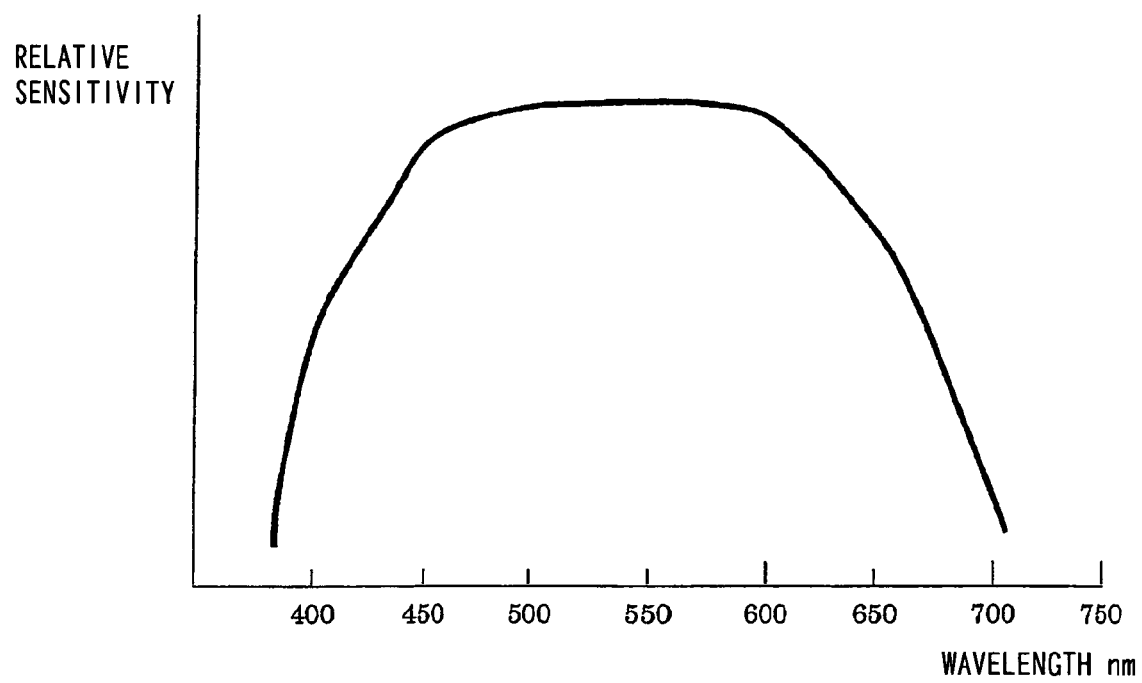
FIG. 7 shows the spectral characteristics of the focus detection pixels.

In order to assure a sufficient light quantity, no color filters are disposed at the focus detection pixels 313 and 314. The focus detection pixels have the spectral sensitivity characteristics (see FIG. 7), which are achieved by integrating the spectral sensitivity characteristics of the photodiodes engaged in photoelectric conversion and the spectral sensitivity characteristics of the infrared filters (not shown). Namely, the spectral sensitivity characteristics are similar to the sum of the spectral sensitivity characteristics of the green pixels, the red pixels and the blue pixels shown in FIG. 6, which indicate sensitivity in a light wavelength range containing the light wavelength ranges corresponding to the sensitivity characteristics of all the pixels, i.e., the green pixels, the red pixels and the blue pixels.

The focus detection pixels 313 and 314 engaged in focus detection are disposed in a vertical row that would otherwise be entirely taken up by imaging pixels 310 assuming B and G colors, since human visual perception is such that an interpolation error resulting from pixel interpolation processing does not show up in blue pixels as much as in red pixels.

The photoelectric conversion unit 11 at the imaging pixel 310 is designed in a shape that allows the photoelectric conversion unit to receive the entire light flux passing through the exit pupil of a highest-speed exchangeable lens (e.g., equivalent to F 1.0) via the micro-lens 10. In addition, the photoelectric conversion units 13 and 14 at the focus detection pixels 313 and 314 are designed so as to receive the entire light flux passing through a specific exit pupil area (e.g., F2.8) of the exchangeable lens via the micro-lenses 10.

Figure 8:
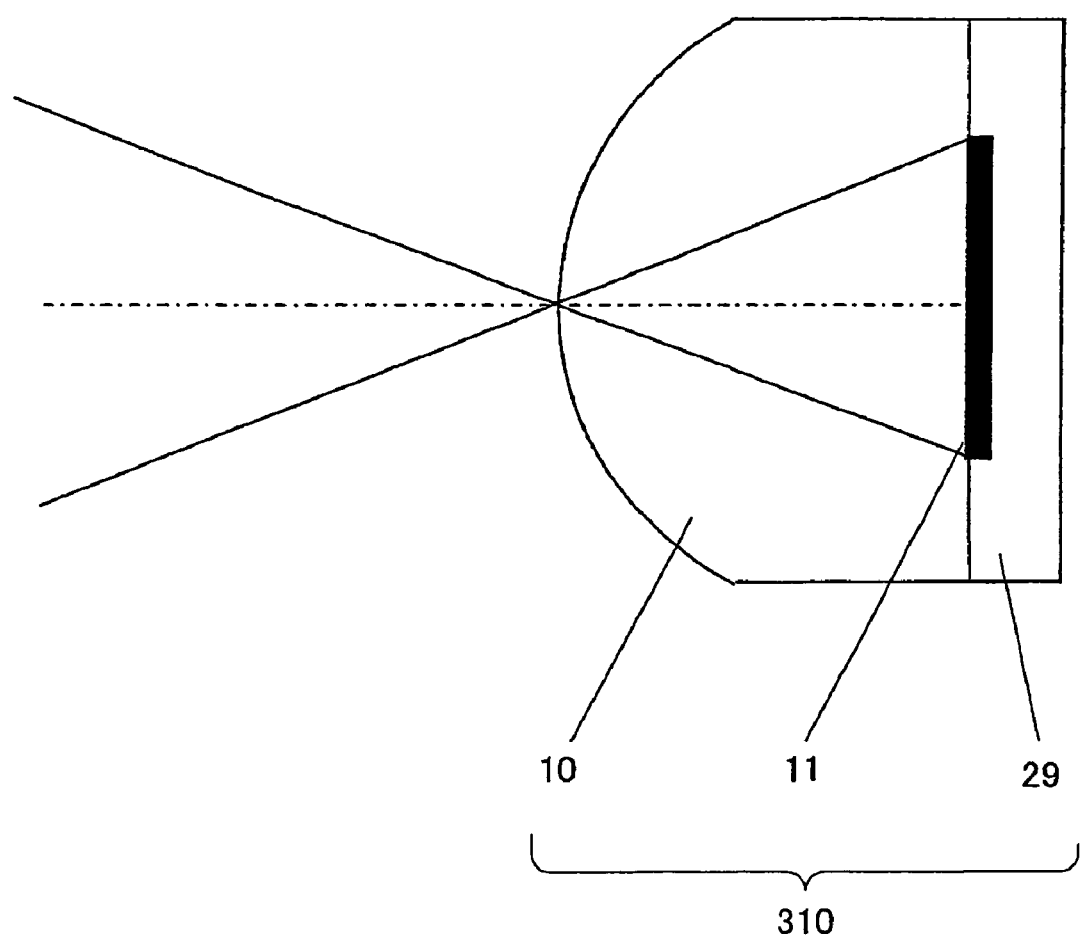
FIG. 8 is a sectional view of an imaging pixel.

FIG. 8 is a sectional view of an imaging pixel 310. The micro-lens 10 is set to the front of the imaging photoelectric conversion unit 11 at the imaging pixel 310 and, as a result, an image of the photoelectric conversion unit 11 is projected frontward via the micro-lens 10. The photoelectric conversion unit 11 is formed on a semiconductor circuit substrate 29. It is to be noted that the color filter (not shown) is disposed between the micro-lens 10 and the photoelectric conversion unit 11.

Figure 9A:
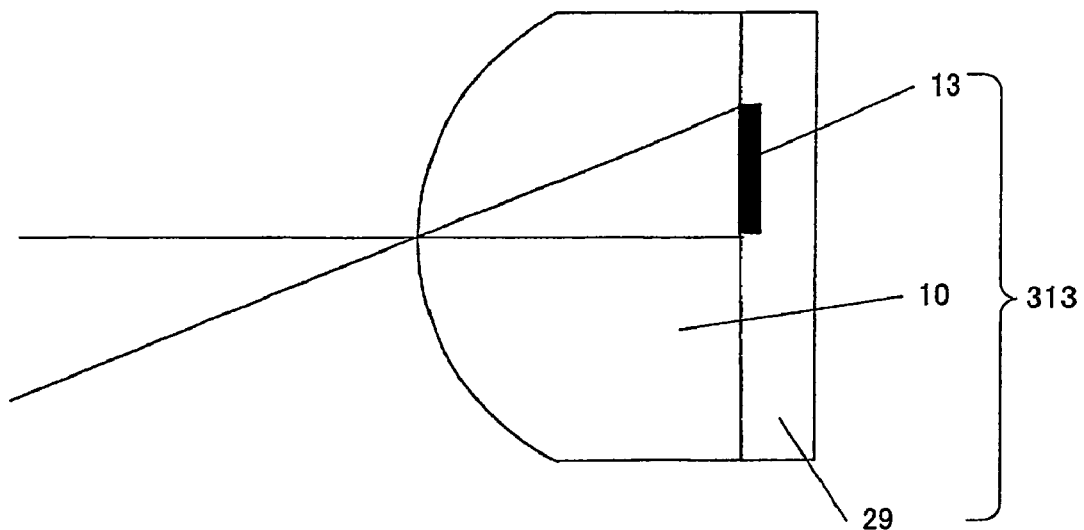
FIGS. 9A and 9B are sectional views of focus detection pixels.

FIG. 9A presents a sectional view of a focus detection pixel 313. The micro-lens 10 is disposed to the front of the photoelectric conversion unit 13 at the focus detection pixel 313 disposed in the focus detection area 101 at the image plane center so as to project the photoelectric conversion unit 13 along the frontward direction via the micro-lens 10. The photoelectric conversion unit 13 is formed on the semiconductor circuit substrate 29 and the micro-lens 10 is fixed over the photoelectric conversion unit as an integrated part thereof through a semiconductor image sensor manufacturing process. It is to be noted that focus detection pixels 313 disposed in the focus detection areas 102 and 103 on the upper side and the lower side of the image plane assume structures similar to that shown in a sectional view in FIG. 9A.

Figure 9B:
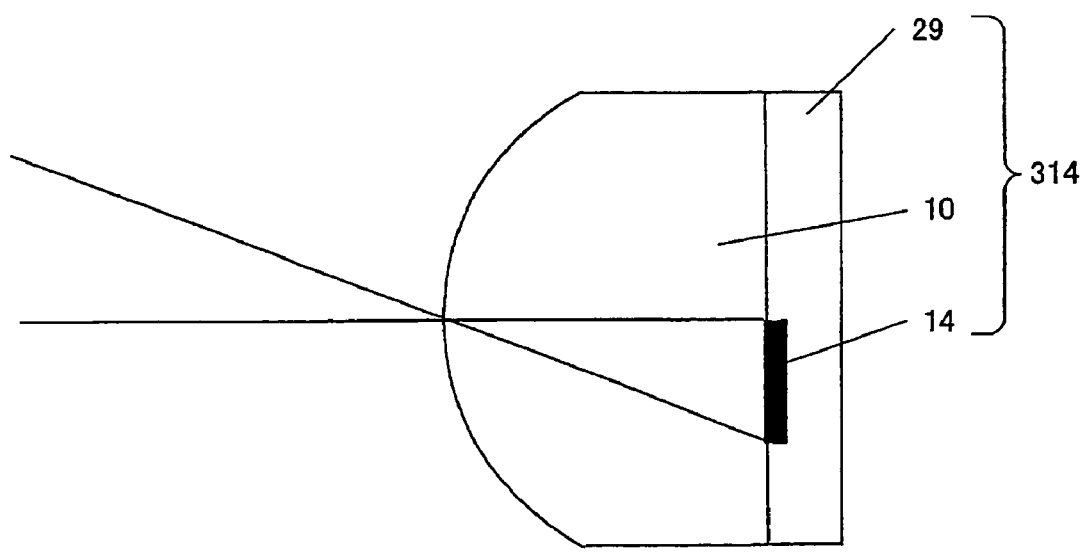

FIG. 9B presents a sectional view of a focus detection pixel 314. The micro-lens 10 is disposed to the front of the photoelectric conversion unit 14 at the focus detection pixel 314 disposed in the focus detection area 101 at the image plane center so as to project the photoelectric conversion unit 14 along the frontward direction via the micro-lens 10. The photoelectric conversion unit 14 is formed on the semiconductor circuit substrate 29 and the micro-lens 10 is fixed over the photoelectric conversion unit as an integrated part thereof through a semiconductor image sensor manufacturing process. It is to be noted that focus detection pixels 314 disposed in the focus detection areas 102 and 103 on the upper side and the lower side of the image plane assume structures similar to that shown in a sectional view in FIG. 9B.

Figure 10:
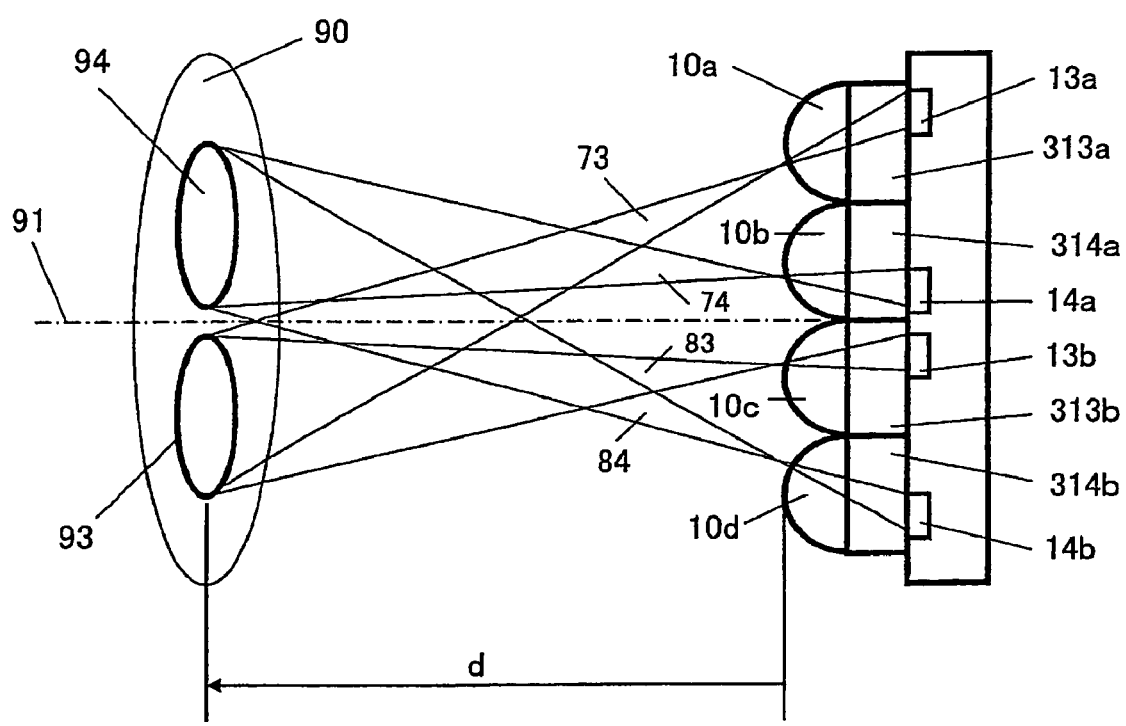
FIG. 10 shows the structure of a focus detection optical system adopting a split-pupil phase difference detection method whereby focus detection is executed via micro lenses.

FIG. 10 shows the structure of a focus detection optical system used to detect the focus condition through the split-pupil phase difference detection method by using micro-lenses. It is to be noted that the focus detection pixels are shown in an enlargement. Reference numeral 90 in the figure indicates the exit pupil set over a distance d along the frontward direction from the micro-lenses disposed at the predetermined imaging plane of the exchangeable lens 202 (see FIG. 1). The distance d is determined in correspondence to the curvature of the micro-lenses, the refractive index of the micro-lenses, the distance between the micro-lenses and the photoelectric conversion units and the like, and is referred to as a focus detection distance in this description. Reference numeral 91 indicates the optical axis of the exchangeable lens, reference numerals 10*a*~10*d* each indicate a micro-lens, reference numerals 13*a*, 13*b*, 14*a* and 14*b* indicate photoelectric conversion units, reference numerals 313*a*, 313*b*, 314*a* and 314*b* indicate focus detection pixels and reference numerals 73, 74, 83 and 84 indicate focus detection light fluxes.

Reference numeral 93 indicates a range defined by the photoelectric conversion units 13*a* and 13*b* projected via the micro-lenses 10*a* and 10*c*, and this range is hereafter referred to as a focus detection pupil in the description. While the focus detection pupil is shown as an elliptical area in FIG. 10 so as to simplify the illustration, the focus detection pupil actually assumes the shape of the photoelectric conversion units projected onto the exit pupil in an enlarged state. Likewise, reference numeral 94 indicates a range defined by the photoelectric conversion units 14*a* and 14*b* projected via the micro-lenses 10*b* and 10*d*, and this range is hereafter referred to as a focus detection pupil in the description. While FIG. 10 shows the area as an elliptical area so as to simplify the illustration, the area actually assumes the shape of the photoelectric conversion units projected in an enlarged state.

While FIG. 10 schematically illustrates the four focus detection pixels 313*a*, 313*b*, 314*a* and 314*b* disposed around the photographic optical axis, the photoelectric conversion units of other focus detection pixels in the focus detection area 101 and the focus detection pixels in the focus detection areas 102 and 103 at the periphery of the image plane, too, receive light fluxes arriving at their micro-lenses from the corresponding focus detection pupils 93 and 94. It is to be noted that the focus detection pixels are arrayed in a direction matching the direction in which the pair of focus detection pupils are set side-by-side, i.e., the direction along which the pair of photo electric conversion units are set side-by-side.

The micro-lenses 10*a*~10*d* are disposed near the predetermined imaging plane of the exchangeable lens 202 (see FIG. 1). Images of the photoelectric conversion units 13*a*, 13*b*, 14*a* and 14*b* disposed behind the micro-lenses 10*a*~10*d* are projected via the micro-lenses onto the exit pupil 90 set apart from the micro-lenses 10*a* and 10*c* by the focus detection pupil distance d, and the projected shapes define the focus detection pupils 93 and 94. Namely, the positional relationship between the micro-lens and the photoelectric conversion unit at each focus detection pixel is determined so that the projected shapes (focus detection pupils 93 and 94) of the photoelectric conversion units at the various focus detection pixels are aligned on the exit pupil 90 located over the focus detection pupil distance d, and the directions along which the photoelectric conversion units at the individual focus detection pixels are projected are determined accordingly.

The photoelectric conversion unit 13*a* outputs a signal corresponding to the intensity of an image formed on the micro-lens 10*a* with the focus detection light flux 73 having passed through the focus detection pupil 93 and having advanced toward the micro-lens 10*a*. Likewise, the photoelectric conversion unit 13*b* outputs a signal corresponding to the intensity of an image formed on the micro-lens 10*c* with the focus detection light flux 83 having passed through the focus detection pupil 93 and having advanced toward the micro-lens 10c. The photoelectric conversion unit 14a outputs a signal corresponding to the intensity of an image formed on the micro-lens 10b with the focus detection light flux 74 having passed through the focus detection pupil 94 and having advanced toward the micro-lens 10b. Likewise, the photoelectric conversion unit 14b outputs a signal corresponding to the intensity of an image formed on the micro-lens 10d with the focus detection light flux 84 having passed through the focus detection pupil 94 and having advanced toward the micro-lens 10d.

By linearly disposing a large number of the two types of focus detection pixels each structured as described above and integrating the outputs from the photoelectric conversion units at the individual focus detection pixels into output groups each corresponding to one of the two focus detection pupils 93 and 94, information related to the intensity distribution of the pair of images formed on the focus detection pixel row with the individual focus detection light fluxes passing through the focus detection pupil 93 and the focus detection pupil 94 is obtained. Image shift detection arithmetic processing (correlation arithmetic processing, phase difference detection processing), to be detailed later, is subsequently executed by using the information thus obtained so as to detect the image shift amount manifested by the pair of images through the split-pupil phase difference detection method. Then, by executing a conversion operation corresponding to the distance between the gravitational centers of the pair of focus detection pupils on the image shift amount, the deviation (defocus amount) of the current imaging plane (the actual imaging plane at the focus detection position set on the imaging plane 100), relative to the predetermined imaging plane (the position of the micro-lens array), is calculated.

Figure 11:
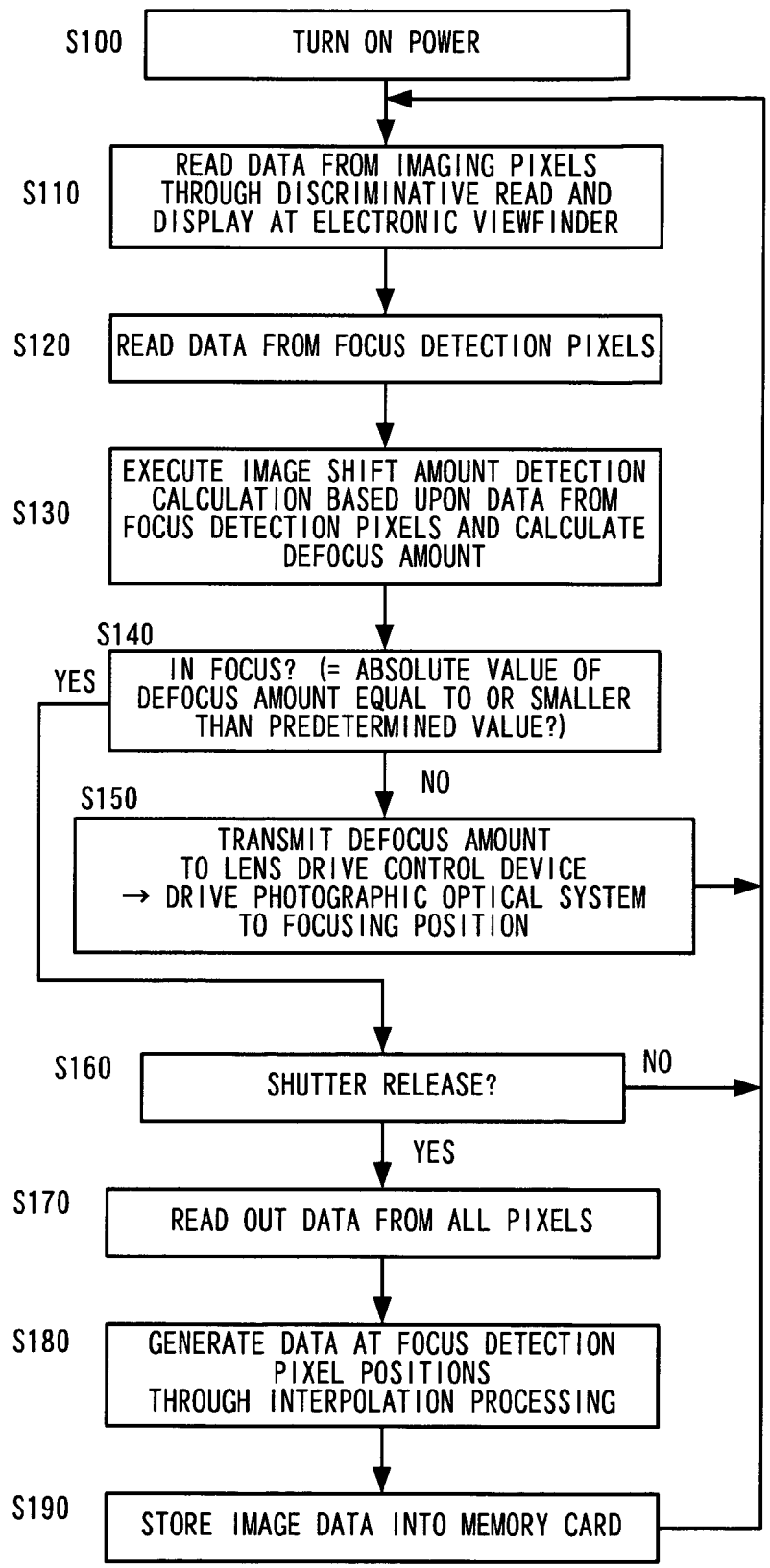
FIG. 11 presents a flowchart of the imaging operation executed in the digital still camera (image-capturing apparatus) in the embodiment.

FIG. 11 presents a flowchart of the imaging operation executed in the digital still camera (image-capturing apparatus) in the embodiment. The processing steps in FIG. 11 are executed by the body drive control device 214. The body drive control device 214 starts the imaging operation in step S110 and subsequent steps as the power to the camera is turned on in step S100. In step S110, the data from the imaging pixels are read out through a discriminative read and the data from the imaging pixels are displayed at the electronic viewfinder. In the following step S120, a pair of sets of image data corresponding to a pair of images, are read out from a focus detection pixel row. It is to be noted that a specific focus detection area among the focus detection areas 101~103 has been selected by the photographer via a focus detection area selector member (not shown).

In step S130, the image shift detection arithmetic processing (correlation arithmetic processing) to be detailed later is executed based upon the pair of sets of image data having been read, to calculate an image shift amount and ultimately calculate the defocus amount. In step S140, a decision is made as to whether or not the current condition is close to being in focus, i.e., whether or not the absolute value of the defocus amount having been calculated is equal to or less than a predetermined value. If it is decided that the current condition is not close to being in focus, the operation proceeds to step S150 to transmit the calculated defocus amount to the lens drive control device 206 which then drives the focusing lens 210 at the exchangeable lens 202 to the focusing position. Then, the operation returns to step S110 to repeatedly execute the operation described above.

It is to be noted that the operation also branches to this step if focus detection is not possible to transmit a scan drive instruction to the lens drive control device 206. In response, the lens drive control device drives the focusing lens 210 at the exchangeable lens 202 to scan between the infinity position and the close-up position. Subsequently, the operation returns to step S110 to repeatedly execute the operation described above.

If, on the other hand, it is decided in step S140 that the current condition is close to being in focus, the operation proceeds to step S160 to make a decision as to whether or not a shutter release has occurred in response to an operation of the shutter release button (not shown). If it is decided that a shutter release has not yet occurred, the operation returns to step S110 to repeatedly execute the operation described above. If it is decided that a shutter release has occurred, the operation proceeds to step S170 to transmit an aperture adjust instruction to the lens drive control device 206 and thus set the aperture value at the exchangeable lens 202 to the control F number (an F number selected by the photographer or an automatically set F number). As the aperture control ends, the image sensor 212 is engaged in an imaging operation and image data originating from the imaging pixels 310 and all the focus detection pixels 313 and 314 at the image sensor 212 are read out.

In step S180, image data at positions assumed by the individual pixels in the focus detection pixel rows are generated through pixel interpolation based upon the data at imaging pixels present around the focus detection pixels. In the following step S190, image data constituted with the data at the imaging pixels and the interpolated data are recorded into the memory card 219, and then the operation returns to step S110 to repeatedly execute the operation described above.

Figure 12A:
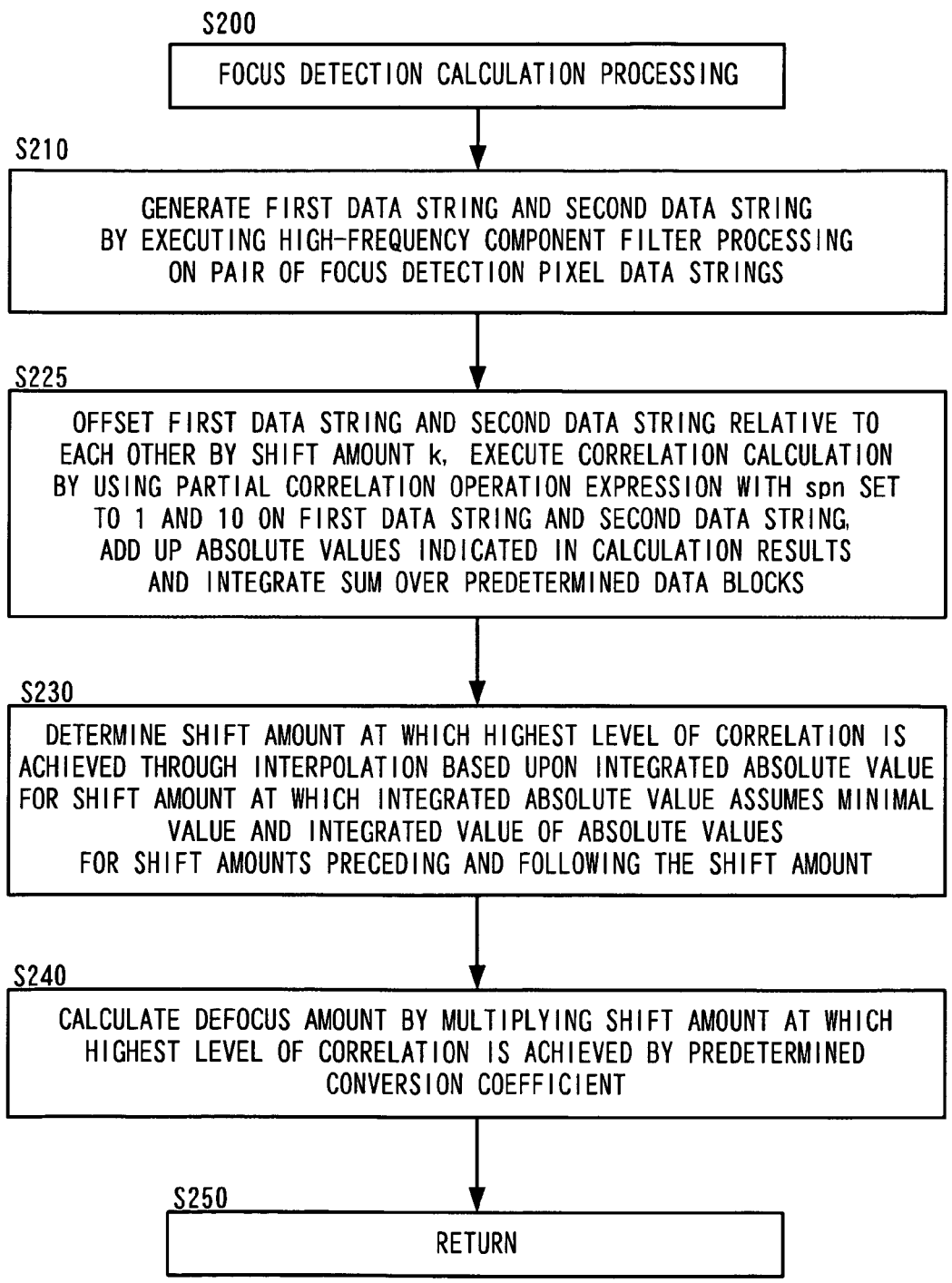
FIGS. 12A and 12B each present a detailed flowchart of focus detection calculation processing that may be executed in step S130 in FIG. 11.

FIG. 12A presents a detailed flowchart of focus detection calculation process that may be executed in step S130 in FIG. 11. The individual processing steps in FIG. 12A are executed by the body drive control device 214. The body drive control device 214 executes the focus detection calculation processing (correlation arithmetic processing) starting in step S200.

In step S210, high-frequency filter processing such as that expressed in (1) below is executed on a pair of data strings ($\alpha_1 \sim \alpha_m$ and $\beta_1 \sim \beta_m$: m indicates the number of sets of data) output from the focus detection pixel row, so as to generate a first data string ($A_1 \sim A_N$) and a second data string ($B_1 \sim B_N$), from which a high-frequency noise component or other high-frequency components that would adversely affect the correlation processing has been eliminated. It is to be noted that the processing in step S210 may be skipped if the arithmetic operation needs to be completed faster or if the defocus amount is already significant and thus it is obvious that only a very small high-frequency component is present.

$$A_n = \alpha_n + 2 \cdot \alpha_{n+1} + \alpha_{n+2}, B_n = \beta_n + 2 \cdot \beta_{n+1} + \beta_{n+2} \tag{1}$$

In expression (1) above, n=1~N−2.

Ideally, the state of the data strings $A_n$ and $B_n$ should be that of identical data strings shifted relative to each other. However, the pair of data strings obtained via the focus detection pixels adopting the split-pupil phase difference detection method described above may not sustain such uniformity due to vignetting of the focus detection light fluxes.

Figure 13:
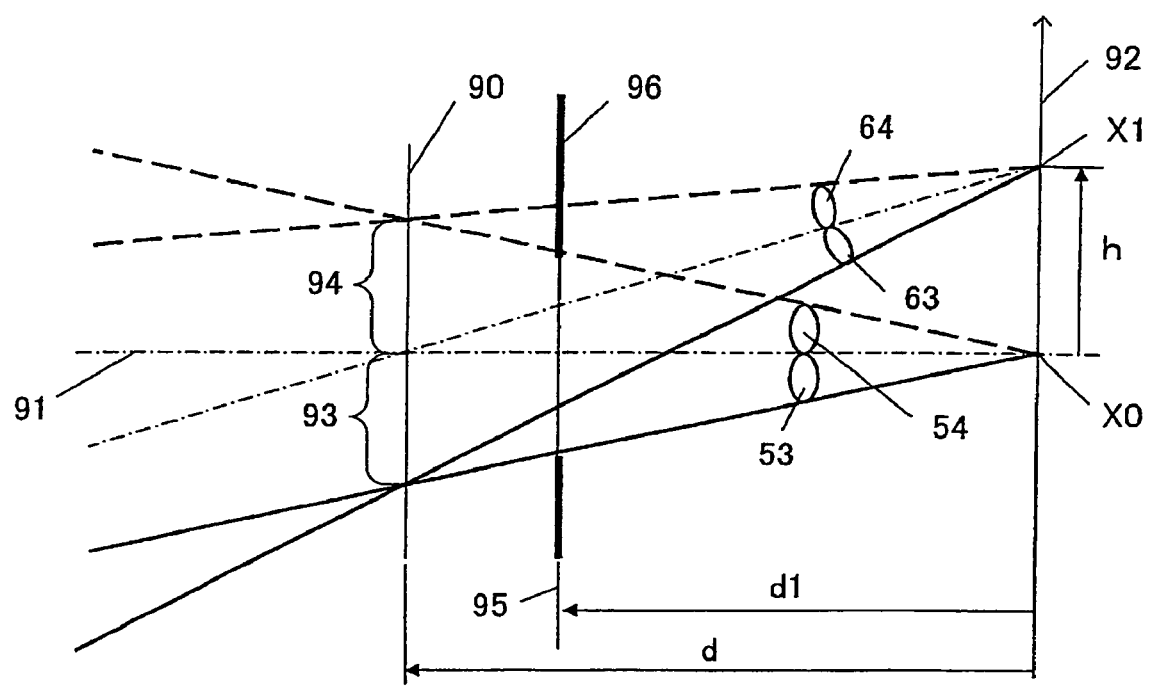
FIG. 13 illustrates how focus detection light fluxes may be vignetted (how vignetting may occur)

FIG. 13 illustrates how the focus detection light fluxes may become vignetted (vignetting may occur). FIG. 13 shows a pair of focus detection pixels assuming a position x0 (image height: 0) and a pair of focus detection pixels assuming a position x1 (image height: h) with a pair of focus detection light fluxes 53 and 54 having passed through the focus detection pupil areas 93 and 94 at the focus detection pupil plane 90 set over the distance d along the forward direction relative to the predetermined focusing plane 92, and a pair of focus detection light fluxes 63 and 64, having passed through the focus detection pupil areas 93 and 94 at the focus detection pupil plane 90, respectively received at the pair of focus detection pixels at the position x0 and the pair of focus detection pixels at the position x1. When the aperture opening 96 of the optical system is present at a plane 95 set over a distance d1 (<d) along the frontward direction relative to the predetermined focusing plane 92, the amounts of light in the pair of focus detection light fluxes 53 and 54 received at the pair of focus detection pixels at the position x0 (image height: 0) are in balance since vignetting occurs at the aperture opening 96 in symmetry relative to the optical axis 91.

However, the amounts of light in the pair of focus detection light fluxes 63 and 64 received at the pair of focus detection pixels at the position x1 (image height: h) are not in balance, since vignetting at the aperture opening 96 is not in symmetry.

Figure 14:
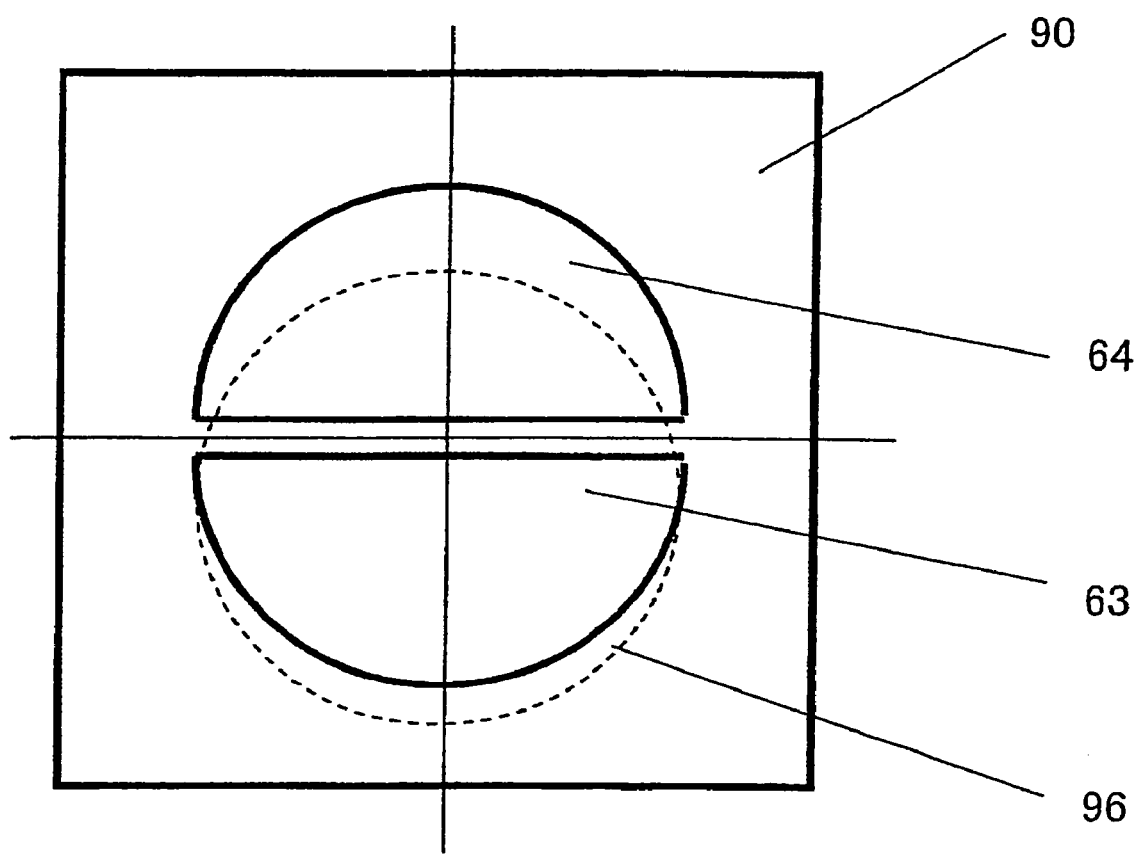
FIG. 14 shows the focus detection pupil planes viewed along the optical axis from the predetermined focusing plane.

FIG. 14 shows the focus detection pupil plane 90 viewed along the optical axis 91 from the predetermined focusing plane 92. While the focus detection light flux 64 is significantly vignetted at the aperture opening 96, the focus detection light flux 63 is only slightly vignetted at the aperture opening 96.

Figure 15A:
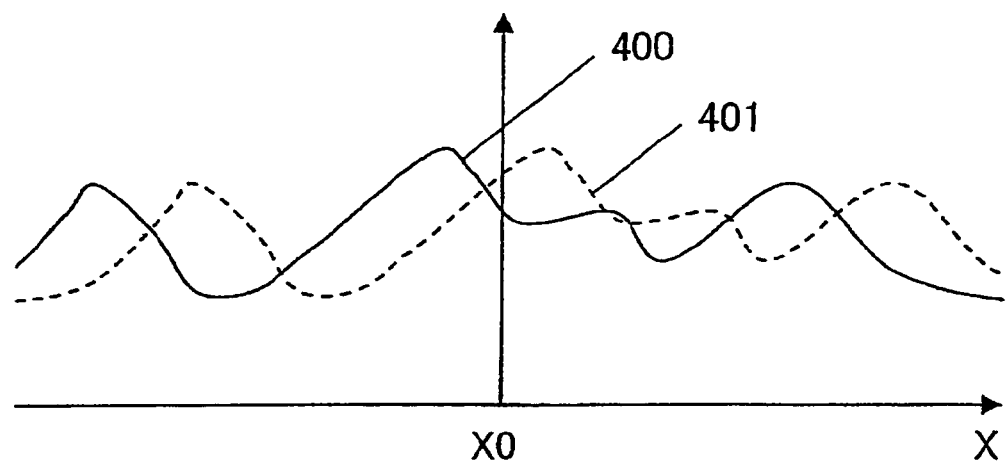
FIGS. 15A and 15B show the intensity distributions (the quantity of light indicated along the vertical axis and the position assumed on the photographic image plane indicated along the horizontal axis) as observed in the conditions shown in FIGS. 13 and 14, respectively with regard to the pair of images received via a focus detection pixel row in the vicinity of position x0 (image height: 0) and the pair of images received via a focus detection pixel row in the vicinity of position x1 (image height h)
Figure 15B:
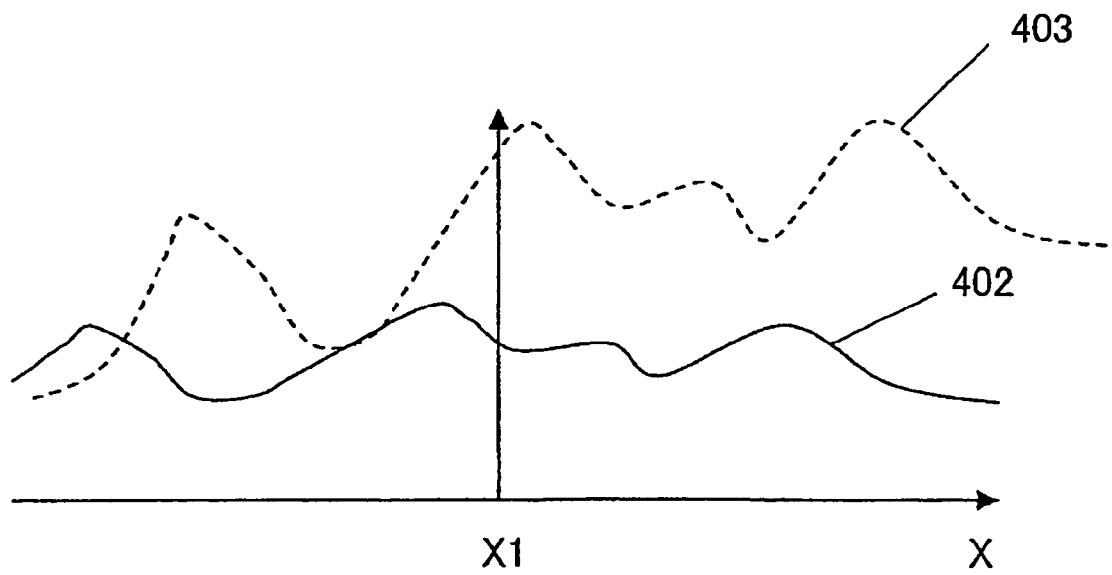

FIGS. 15A and 15B show the signal intensity distributions (the quantity of light indicated along the vertical axis and the position assumed on the photographic image plane indicated along the horizontal axis) as observed in the conditions shown FIGS. 13 and 14, respectively with regard to the pair of images received at the focus detection pixel row in the vicinity of the position x0 (image height: 0) and the pair of images received at a focus detection pixel row in the vicinity of the position x1 (image height: h). When the extents of focus detection light flux vignetting are in balance, a pair of image signals 400 and 401 expressed by identical image signal functions simply shifted relative to each other along the lateral direction, as shown in FIG. 15A, are obtained. However, a pair of image signals 402 and 403 obtained when the extents of focus detection light flux vignetting are not in balance cannot be expressed by identical image signal functions shifted relative to each other, as shown in FIG. 15B.

Either of the following two relationships shall be observed between a pair of image signal data strings A(x) and B(x) obtained by using focus detection light fluxes subjected to vignetting. When the extent of vignetting is slight, the pair of image signals shall assume a relationship expressed as a ratio, i.e., one image signal expressed as a specific multiple of the other, as indicated below.

$$A(x)=b0 \cdot B(x) \quad (2)$$

b0 in expression (2) represents a constant. When the pair of data strings A(x) and B(x) have the relationship expressed in (2), the pair of data strings are described as manifesting "$0^{th}$ order vignetting" in reference to the embodiment. When the extent of vignetting is significant, the pair of image signals assume a relationship expressed by a linear function of the position x, as indicated below.

$$A(x)=(b1+a1 \cdot x) \cdot B(x) \quad (3)$$

a1 and b1 (>b0) in expression (3) each represent a constant.

When the pair of data strings A(x) and B(x) have the relationship expressed in (3), the pair of data strings are described as manifesting "$1^{st}$_order vignetting" in reference to the embodiment. While the following explanation pertains to processing executed for purposes of focus detection when $1^{st}$ order vignetting occurs, it is assumed that the following expression is adopted as a partial correlation operation expression with which image shift detection is enabled. spn represents an operation parameter related to the range centered on the pair of sets of target data and containing nearby data in the data strings and the data strings falling within this range are used in the correlation arithmetic processing.

$$E(k)=A_i \cdot B_{i+spn+k} - B_{i+k} \cdot A_{i+spn} \quad (4)$$

To resume the explanation given in reference to FIG. 12A, the body drive control device 214 shifts a first data string $A_1$ through $A_n$ and the second data string $B_1$ through $B_n$ relative to each other (by the shift amount k) and also executes correlation calculation on the first data string and the second data string by using a plurality of partial correlation operation expressions E1(k) and E2(k) (corresponding to spn=1 and spn=10 assumed for expression (4)), calculates the sum of the absolute values indicated in the calculation results and integrates the sum over a predetermined data blocks in step S220.

Namely, assuming that the results of calculation executed by using the plurality of correlation operation expressions indicate a partial correlation quantity E1(k) and a partial correlation quantity E2(k), the overall correlation quantity C(k) indicating the overall level of correlation between the pair of data strings at the shift amount k can be calculated as expressed in (7) below.

$$E1(k)=A_i \cdot B_{i+1+k} - B_{i+k} \cdot A_{i+1} \quad (5)$$

$$E2(k)=A_i \cdot B_{i+10+k} - B_{i+k} \cdot A_{i+10} \quad (6)$$

$$C(k)=\Sigma(|E1(k)|+|E2(k)|) \quad (7)$$

It is to be noted that the shift amount k is an integer representing a relative shift amount taking on a value assumed in an incremental unit corresponding to the detection pitch with which the pair of sets of data are detected. In addition, the integration operation ($\Sigma$) expressed in (7) is executed over the predetermined data string blocks.

The advantages of the overall correlation quantity C(k) determined by calculating the sum of the absolute values indicated by the calculation results of the calculation executed based upon the two partial correlation operation expressions assuming different values for the operation parameter spn and integrating the sum as expressed in (7) are explained in comparison to an overall correlation quantity C1(k) and an overall correlation quantity C2(k), calculated respectively through integration of the absolute value of E1(k) and integration of the absolute value of E2(k).

$$C1(k)=\Sigma(|E1(k)|) \quad (8)$$

$$C2(k)=\Sigma(|E2(k)|) \quad (9)$$

FIGS. 16A~20F present simulation data provided to facilitate an explanation of the characteristics of the correlation quantities C(k), C1(k) and C2(k). FIGS. 16A~16C each present a graph of a pair of sets of image data (indicated by symbol "■" and symbol "□") with the data position indicated along the horizontal axis and the data value indicated along the vertical axis. It is to be noted that one set of image data is offset relative to the other set of image data in each pair of sets of image data by a single data position to provide a clearer presentation without any overlap of the sets of image data in FIGS. 16A~16C. FIG. 16A shows a pair of sets of image data (sine waveform: high frequency) manifesting $1^{st}$ order vignetting, FIG. 16B shows a pair of sets of image data (sine waveform: mid frequency) manifesting 1st order vignetting and FIG. 16C shows a pair of sets of image data (sine waveform: low frequency) manifesting $1^{st}$ order vignetting. It is to be noted that the cycle of the image data shown in FIG. 16B is 10 times the data pitch and matches the operation parameter spn=10 assumed in conjunction with C2(k).

FIGS. 17A~19C present graphs of correlation quantities C1(k), C2(k) and C(k) calculated in a state of image shift achieved by shifting the pairs of sets of image data in FIGS. 16A~16C relative to each other by −1 (with the shift increment unit set to match the data pitch), with the shift amount k (unit: data pitch) indicated along the horizontal axis and the correlation quantities C1(k), C2(k) and C(k) indicated along the vertical axis.

FIGS. 17A, 17B and 17C present graphs of the correlation quantities C1(k), C2(k) and C(k) calculated in conjunction with the image data (high frequency) shown in FIG. 16A. FIGS. 18A, 18B and 18C present graphs of the correlation quantities C1(k), C2(k) and C(k) calculated in conjunction with the image data (mid frequency) shown in FIG. 16B. FIGS. 19A, 19B and 19C present graphs of the correlation quantities C1(k), C2(k) and C(k) calculated in conjunction with the image data (low frequency) shown in FIG. 16C.

Figures 20A, 20B:
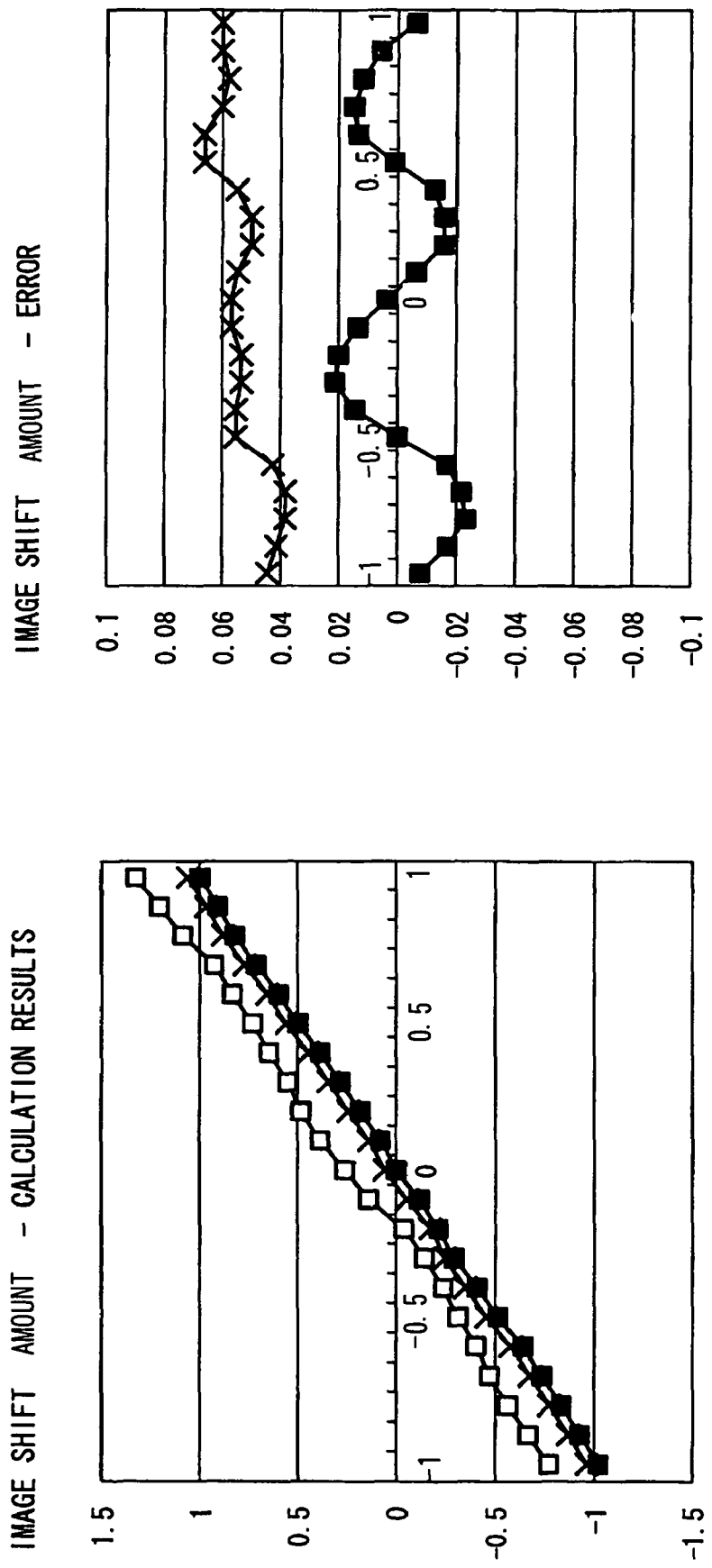
FIGS. 20A~20F present graphs of calculation results (C1 (k) indicated by symbol "■", C2(k) indicated by symbol "□" and C(k) indicated by symbol "X" in the figures) obtained from image shift detection executed based upon the correlation quantity extreme values in conjunction with the correlation quantities C1(k), C2(k) and C(k) in states of image shift achieved by shifting the pairs of sets of image data in FIGS. 16A~16C relative to each other by −1~+1 when the shift increment unit is set to match the data pitch.
Figure 20D:
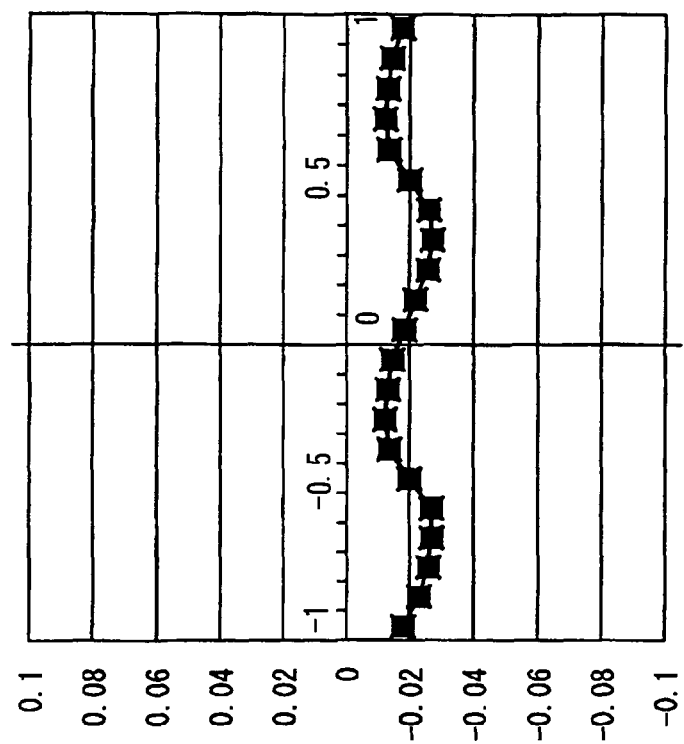
Figure 20C:
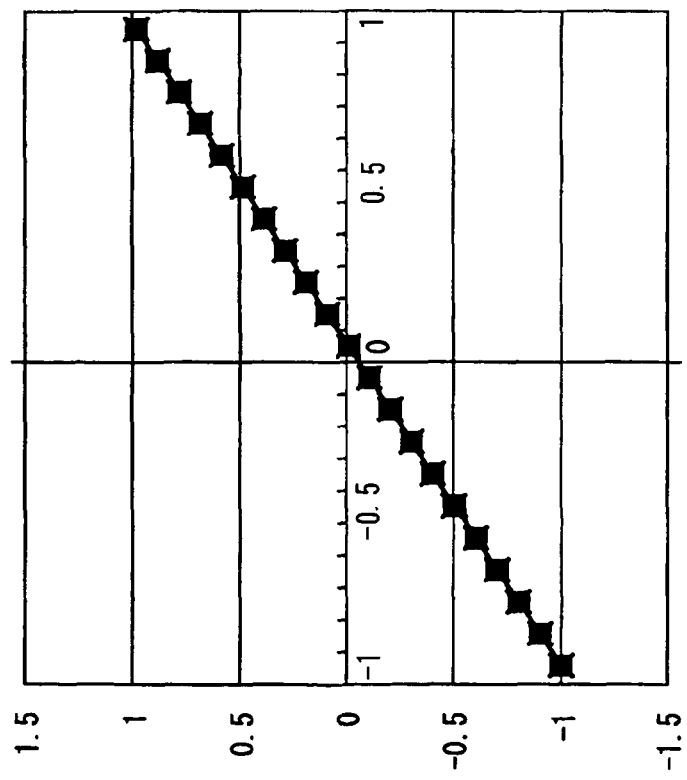
Figure 20F:
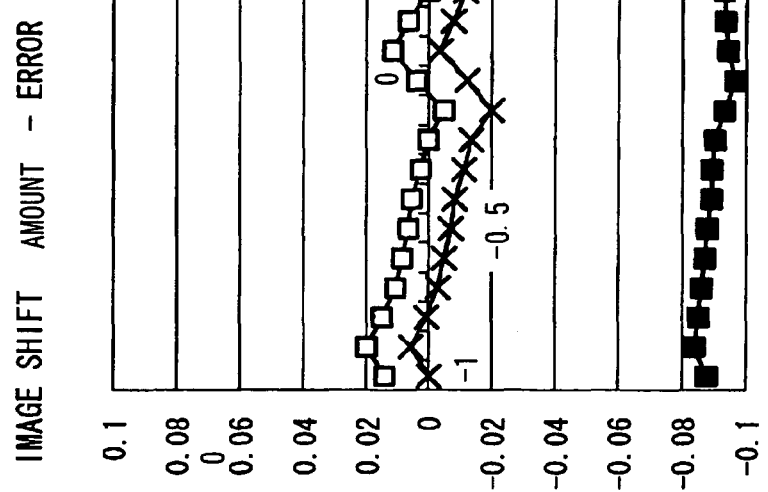
Figure 20E:
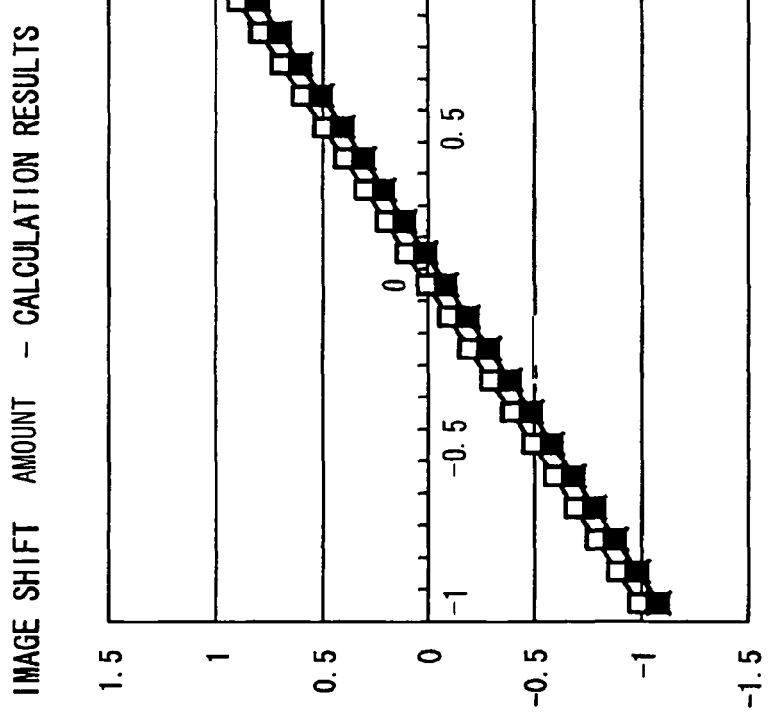

FIGS. 20A, 20C and 20E present graphs of calculation results (C1(k) indicated by symbol "■", C2(k) indicated by symbol "□" and C(k) indicated by symbol "x" in the figures) obtained by executing image shift detection based upon the correlation quantity extreme values through the three-point interpolation method to be detailed later, to calculate the correlation quantities C1(k), C2(k) and C(k) in a state of image shift achieved by shifting the pairs of sets of image data in FIGS. 16A~16C relative to each other by −1~+1 when the shift increment unit is set to match the data pitch. It is to be noted that the actual image shift amount (unit: data pitch) is indicated along the horizontal axis and the image shift amount ascertained based upon the calculation results is indicated along the vertical axis in these figures.

In addition, FIGS. 20B, 20D and 20F present graphs respectively indicating the errors of the image shift amounts indicated by the calculation results relative to the actual image shift amounts shown in FIGS. 20A, 20C and 20E (C1(k) is indicated by symbol "■", C2(k) is indicated by symbol "□" and C(k) is indicated by symbol "x" in the figures). It is to be noted that the actual image shift amounts (unit: data pitch) are indicated along the horizontal axis and the extents of error (unit: data pitch) are indicated along the vertical axis in these figures.

FIGS. 20A and 20B present graphs respectively indicating the image shift amounts and the errors corresponding to the image data (high frequency) shown in FIG. 16A. In addition, FIGS. 20C and 20D present graphs respectively indicating the image shift amounts and the errors corresponding to the image data (mid frequency) shown in FIG. 16B. In addition, FIGS. 20E and 20F present graphs that indicate the image shift amounts and the errors corresponding to the image data (low frequency) shown in FIG. 16C.

In reference to FIGS. 16A~20F, the characteristics of the correlation quantities C1(k), C2(k) and C(k) are described in further detail. The graph of the correlation quantity C1(k) presented in FIG. 17A, calculated by using the pair of sets of image data constituted with a high-frequency component shown in FIG. 16A, which manifests $1^{st}$ order vignetting, contains a distinct minimal value at which the true image shift amount dips sharply and the extent of error in the image shift amount calculation results is slight, as indicated by symbol "■" in FIGS. 20A and 20B. The graph of the correlation quantity C2(k) in FIG. 17B, however, does not contain a distinct minimal value and the extent of error in the image shift amount calculation results is significant, as indicated by symbol "□" in FIGS. 20A and 20B. The graph of the correlation quantity C(k) presented in FIG. 17C, on the other hand, contains a minimal value with a more prominent dip and the extent of error in the image shift amount calculation results is not as pronounced as that indicated by symbol "x" in FIGS. 20A and 20B.

The graph of the correlation quantity C1(k) presented in FIG. 18A, calculated by using the pair of sets of image data constituted with a mid-frequency component shown in FIG. 16B, which manifests $1^{st}$ order vignetting, contains a distinct minimal value at which the true image shift amount dips sharply and the extent of error in the image shift amount calculation results is slight, as indicated by symbol "■" in FIGS. 20C and 20D. However, in the graph of the correlation quantity C2(k) in FIG. 18B, the minimal value position is taken up by a maximal value and the image shift amount calculation results indicated by symbol "□" in FIGS. 20C and 20D completely deviate from the graph. The graph of the correlation quantity C(k) presented in FIG. 18C, on the other hand, contains a minimal value with a more prominent dip and the extent of error in the image shift amount calculation results is not as pronounced as that indicated by symbol "x" in FIGS. 20C and 20D (the results corresponding to C(k) shown in FIGS. 20C and 20D are substantially identical to those corresponding to C1(k)). When the data cycle matches the operation parameter spn used in the correlation calculation, an extremely large error occurs, as described above, and thus, reliable image shift detection results cannot be obtained.

The graph of the correlation quantity C1(k) presented in FIG. 19A, calculated by using the pair of sets of image data constituted with a low-frequency component shown in FIG. 16C, which manifests $1^{st}$ order vignetting, contains a distinct minimal value at which the true image shift amount dips sharply but the extent of error in the image shift amount calculation results is significant, as indicated by symbol "■" in FIGS. 20E and 20F. However, the graph of the correlation quantity C2(k) presented in FIG. 19B contains a distinct minimal value at which the true image shift amount dips sharply and the extent of error in the image shift amount calculation results is slight, as indicated by symbol "□" in FIGS. 20E and 20F. In addition, the graph of the correlation quantity C(k) presented in FIG. 19C also contains a distinct minimal value at which the true image shift amount dips sharply and the extent of error in the image shift amount calculation results is slight, as indicated by symbol "x" in FIGS. 20E and 20F.

As described above, while highly accurate image shift detection for high-frequency data is enabled based upon the correlation quantity C1(k) calculated by setting the operation parameter spn to 1, the accuracy of image shift detection executed on low-frequency data based upon the correlation quantity C1(k) is lowered. While highly accurate image shift detection for low-frequency data is enabled based upon the correlation quantity C2(k) calculated by setting the operation parameter spn to 10, the accuracy of image shift detection executed on high-frequency data based upon the correlation quantity C2(k) is lowered and, furthermore, if the data cycle matches the operation parameter spn (spn=10), reliable image shift detection results cannot be obtained.

C(k), which is the correlation quantity calculated by adding the absolute values of the partial correlation quantities calculated with the operation parameter spn set to 1 and 10 and integrating the sum as expressed in (7), enables image shift detection with a predetermined accuracy level or higher both for high-frequency data and low-frequency data. Accordingly, by using the correlation quantity C(k) calculated as expressed in (7) at all times, reliable image shift detection can be executed regardless of the spatial frequency component of the subject data and, at the same time, the need to detect the spatial frequency component of the data and adjust the value of the operation parameter spn in correspondence to the detected spatial frequency component is eliminated.

Figure 21A:
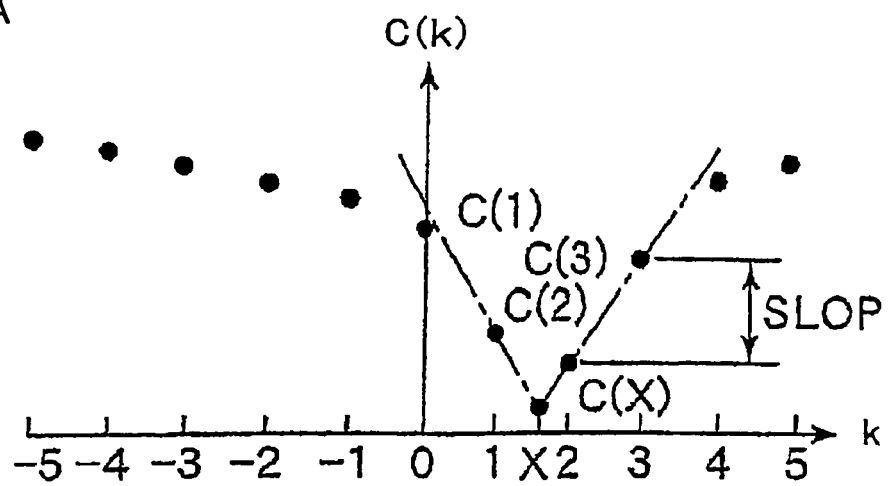
FIG. 21A~21C illustrate a method that may be adopted when evaluating the focus detection results.

The explanation given in reference to FIG. 12A is now resumed. The graph of the correlation quantity C(k) calculated as expressed in the correlation operation expression (7) assumes the smallest value (the smaller the value, the higher the correlation level) at the shift amount at which the pair of sets of data achieve a high level of correlation (when $k=k_j=2$ in FIG. 21A), as indicated in FIG. 21A. The shift amount x, which gives the smallest value C(x) in the continuous correlation quantity graph, is determined by adopting a three-point interpolation method expressed in (10)~(13) below in step S230.

$$x=k_j+D/SLOP \quad (10)$$

$$C(x)=C(k_j)-|D| \quad (11)$$

$$D=\{C(k_j-1)-C(k_j+1)\}/2 \quad (12)$$

$$SLOP=MAX\{C(k_j+1)-C(k_j),C(k_j-1)-C(k_j)\} \quad (13)$$

In step S240, a defocus amount DEF indicating the defocus amount at the subject image plane relative to the predetermined imaging plane is calculated as expressed below based upon the shift amount x calculated as expressed in (10).

$$DEF=KX\cdot PY\cdot x \quad (14)$$

PY in expression (14) indicates the detection pitch, whereas KX in expression (14) represents a conversion coefficient determined based upon the opening angle formed by the gravitational centers of the pair of focus detection pupils.

Figure 21B:
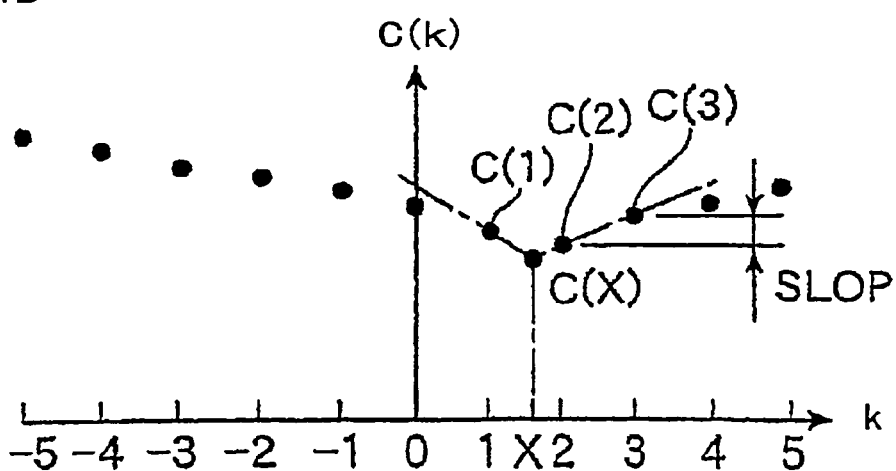
Figure 21C:
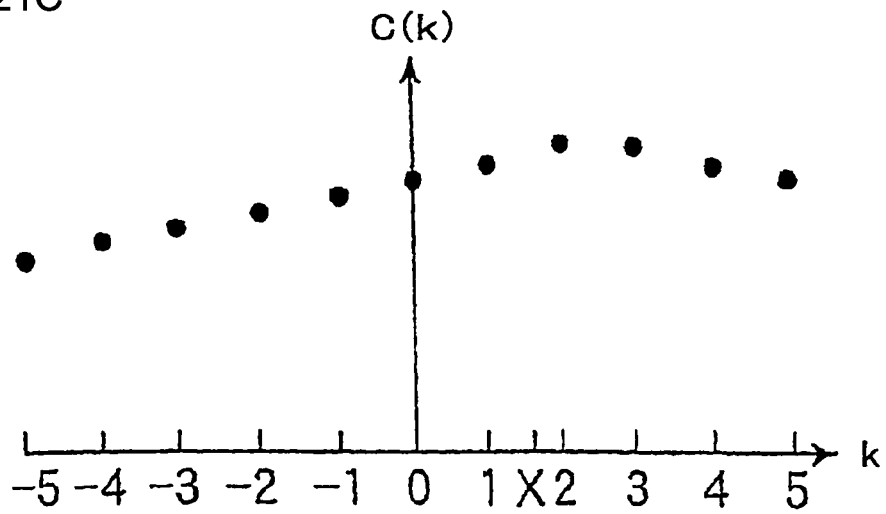

The judgment as to whether or not the defocus amount DEF is reliable is made as follows. As shown in FIG. 21B, the interpolated minimum value C(x) of the correlation quantity increases when the level of correlation between the pair of sets of data is lower. Accordingly, if C(x) is equal to or greater than a predetermined value, the calculated defocus amount is judged to be less reliable. Alternatively, C(x) may be standardized with regard to the data contrast, and in such a case, if the value obtained by dividing C(x) by SLOP indicating a value in proportion to the contrast is equal to or greater than a predetermined value, the calculated defocus amount shall be judged to be unreliable. As a further alternative, if SLOP indicating the value in proportion to the contrast is equal to or less than a predetermined value, the subject should be judged to be a low-contrast subject and the calculated defocus amount DEF shall be judged to be unreliable. If the level of correlation between the pair of sets of data is low and the correlation quantity C(k) does not dip at all over the shift range $k_{min}$ to $k_{max}$, as shown in FIG. 21C, the minimum value C(x) cannot be determined. In this case, it is decided that focus detection cannot be executed. If, on the other hand, focus detection is possible, the defocus amount is calculated by multiplying the calculated image shift amount by a predetermined conversion coefficient.

In step S250, the focus detection calculation processing (correlation arithmetic processing) ends before the operation returns to step S140 in FIG. 11.

Image shift detection is executed in the embodiment described above based upon the correlation quantity C(k) calculated by adding up the absolute values of the partial correlation quantities determined with the operation parameter spn in a single correlation operation expression set to different values and then integrating the sum as expressed in (7), the combination of values assumed for the operation parameter spn may be other than 1 and 10 or partial correlation quantities determined by setting the operation parameter spn to three or more values may be added up. In addition, a correlation operation expression other than expression (7) may be used. For instance, a correlation operation expression, such as expression (17) with the operation parameter spn set to different values may be used.

Second Embodiment

Next, an embodiment in which image shift detection is executed by using a plurality of correlation operation expressions assuming forms different from one another is described. The partial correlation operation expression (4), which enables image shift detection as described above, can be used in processing other than the correlation arithmetic processing executed for purposes of focus detection in the state of $1^{st}$ order vignetting. In the following description, processing executed when no vignetting has occurred, when $0^{th}$ order vignetting has occurred and when $1^{st}$ order vignetting has occurred is described. The following correlation operation expressions EA, EB and EC are defined as typical examples of the partial correlation operation expression E(k). Namely, the calculation expression enclosed by the vertical lines indicating the absolute value in the right side of expression (15) is designated as the correlation operation expression EA, the calculation expression enclosed by the vertical lines indicating the absolute value in the right side of expression (16) is designated as the correlation operation expression EB and the calculation expression enclosed by the vertical lines indicating the absolute value in the right side of expression (17) is designated as the correlation operation expression EC. The following is an explanation of the characteristics of these calculation expressions.

$$C(k)=\Sigma|A_i-B_{i+k}| \quad (15)$$

$$C(k)=\Sigma|A_i\cdot B_{i+spn+k}-B_{i+k}\cdot A_{i+spn}| \quad (16)$$

$$C(k)=\Sigma|A_i^2\cdot B_{i-spn+k}\cdot B_{i+spn+k}-B_{i+k}^2\cdot A_{i-spn}\cdot A_{i+spn}| \quad (17)$$

In expressions (15)~(17), the integrating operation (Σ) is executed by sequentially shifting the suffix i over predetermined blocks in the data strings.

FIG. 22 presents a table comparing the characteristics of the correlation operation expressions EA, EB and EC described above. When no vignetting manifests (when the pair of images are not distorted due to vignetting), highly accurate image shift detection can be executed by using any of the calculation expressions. However, the correlation operation expression EA, which does not include any data multiplication in the arithmetic operation executed therein, is particularly advantageous in that the length of time required for the arithmetic processing can be reduced and also assures better noise withstanding characteristics (characteristics whereby the image shift detection results are not readily affected by noise that may be added into the data) over the correlation operation expressions EB and EC.

When $0^{th}$ order vignetting manifests, highly accurate image shift detection can be executed by using either the correlation operation expression EB or the correlation operation expression EC, but the accuracy of the image shift detection executed by using the calculation expression EA is compromised. The calculation expression EB assures better noise withstanding characteristics over the calculation expression EC. When $1^{st}$ order vignetting manifests, highly accurate image shift detection is enabled by using the correlation operation expression EC but the accuracy of image shift detection executed by using the calculation expression EA or EB is lowered.

FIGS. 23A~28D present simulation data indicating the characteristics of the correlation operation expressions EA, EB and EC. FIGS. 23A~23D presents graphs each showing a pair of sets of image data (indicated by symbol "■" and symbol "□") with the data position indicated along the horizontal axis and the data value indicated along the vertical axis. It is to be noted that one set of image data is offset relative to the other set of image data in each pair of sets of image data by a single data position to provide a clearer presentation without any overlap of the sets of image data in FIGS. 23A~23D.

FIG. 23A shows a pair of sets of image data (sine waveform) manifesting no vignetting (images can be completely aligned by offsetting them relative to each other). FIG. 23B presents a graph showing the pair of sets of image data (sine waveform) in FIG. 23A with random noise present therein. FIG. 23C presents a graph of a pair of sets of image data (sine waveform) manifesting $0^{th}$ order vignetting with random noise present therein. FIG. 23D presents a graph of a pair of sets of image data (sine waveform) manifesting $1^{st}$ order vignetting with random noise present therein.

FIGS. 24A~24D present graphs of the calculation results of image shift detection executed using the correlation operation expressions EA, EB and EC on image data in a state of image shift achieved by shifting pairs of sets of image data in FIGS. 23A~23D relative to each other by −1~+1 when the shift increment unit is set to match the data pitch (the results obtained by using the correlation operation expression EA indicated by symbol "■", the results obtained by using the correlation operation expression EB indicated by symbol "□" and the results obtained by using the correlation operation expression EC indicated by symbol "x" in the figure), with the actual image shift amount (unit: data pitch) indicated along the horizontal direction and the image shift amount ascertained based upon the calculation results indicated along the vertical direction. FIGS. 24A~24D present the image shift amount calculations results obtained respectively corresponding to the image data in FIGS. 23A~23D.

FIGS. 25A~25D present graphs respectively indicating the errors of the image shift amounts indicated by the calculation results relative to the actual image shift amounts shown in FIG. 24 (the error of the correlation arithmetic expression EA indicated by symbol "■", the error of the correlation arithmetic expression EB indicated by symbol "□" and error of the correlation arithmetic expression EC indicated by symbol "x" in the figure). The actual image shift amounts (unit: data pitch) are indicated along the horizontal axis and the extents of error (unit: data pitch) are indicated along the vertical axis in these graphs. FIGS. 25A~25D respectably indicate the extents of error corresponding to the calculation results shown in FIGS. 24A~24D.

FIGS. 26A~26D present graphs of the correlation quantity C(k) calculated using the correlation operation expression EA on image data manifesting a state of image shift achieved by shifting each pair of sets of image data in FIGS. 23A~23D relative to each other by −1 with the shift increment unit set to match the data pitch, with the shift amount k (unit: data pitch) indicated along the horizontal axis and the value of the correlation quantity C(k) indicated along the vertical axis. FIGS. 26A~26D present graphs of the correlation quantity C(k) calculated in correspondence to the image data in FIGS. 23A~23D respectively.

FIGS. 27A~27D presents graphs of the correlation quantity C(k) calculated using the correlation operation expression EB on image data manifesting a state of image shift achieved by shifting each pair of sets of image data in FIGS. 23A~23D relative to each other by −1 with the shift increment unit set to match the data pitch, with the shift amount k (unit: data pitch) indicated along the horizontal axis and the value of the correlation quantity C(k) indicated along the vertical axis. FIGS. 27A~27D present graphs of the correlation quantity C(k) calculated in correspondence to the image data in FIGS. 23A~23D respectively.

FIGS. 28A~28D present graphs of the correlation quantity C(k) calculated using the correlation operation expression EC on image data manifesting a state of image shift achieved by shifting each pair of sets of image data in FIGS. 23A~23D relative to each other by −1 with the shift increment unit set to match the data pitch, with the shift amount k (unit: data pitch) indicated along the horizontal axis and the value of the correlation quantity C(k) indicated along the vertical axis. FIGS. 28A~28D present graphs of the correlation quantity C(k) calculated in correspondence to the image data in FIGS. 23A~23D respectively.

In reference to FIGS. 23A~28D, the characteristics of the correlation operation expressions EA, EB and EC are described in further detail. When a pair of sets of image data manifest no vignetting, as shown in FIG. 23A, the correlation graphs presented in FIGS. 26A, 27A and 28A, respectively obtained by using the correlation operation expressions EA, EB and EC, each contain a distinct minimal value indicating a sharp dip at the true image shift amount and there is only a slight extent of error in the image shift amount calculation results, as indicated in FIGS. 24A and 25A.

Figure 24A:
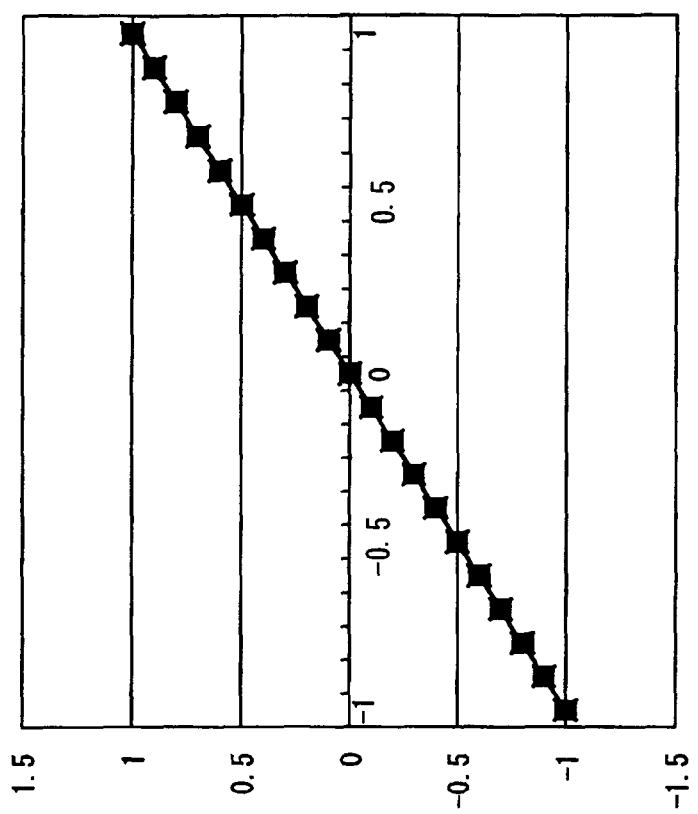
FIGS. 24A~24D each present the calculation results obtained from image shift detection executed using the correlation operation expressions EA, EB and EC on image data in a state of image shift achieved by shifting a given pair of sets of image data in FIG. 23 relative to each other by −1~+1 when the shift increment unit is set to match the data pitch.
Figure 24B:
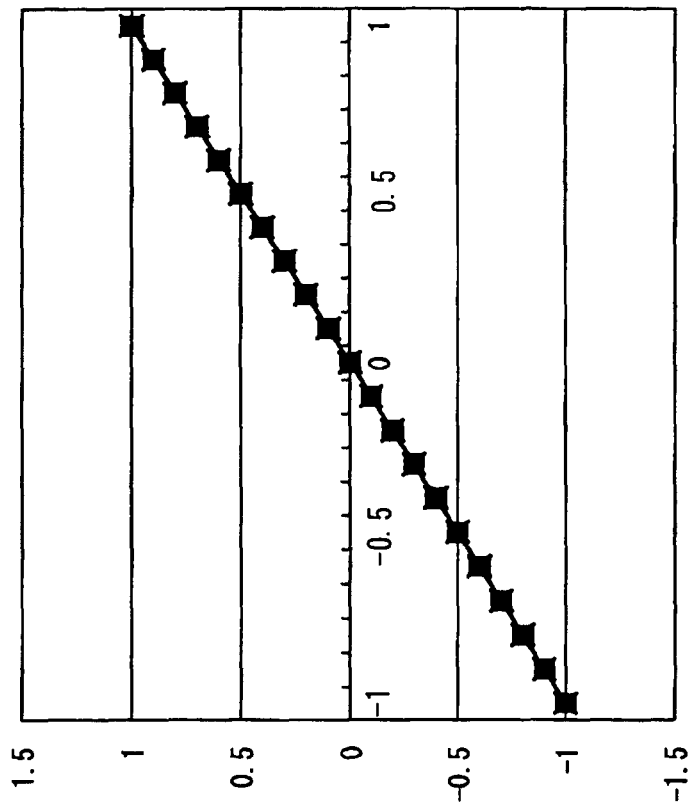
Figure 25A:
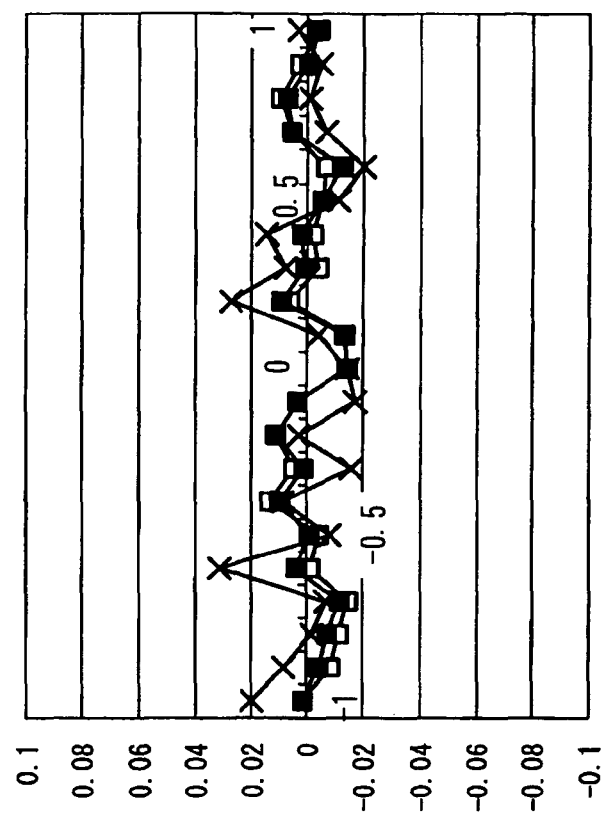
FIGS. 25A~25D each show the error between the actual image shift amount and the image shift amount indicated by the calculation results in FIG. 24.
Figure 25B:
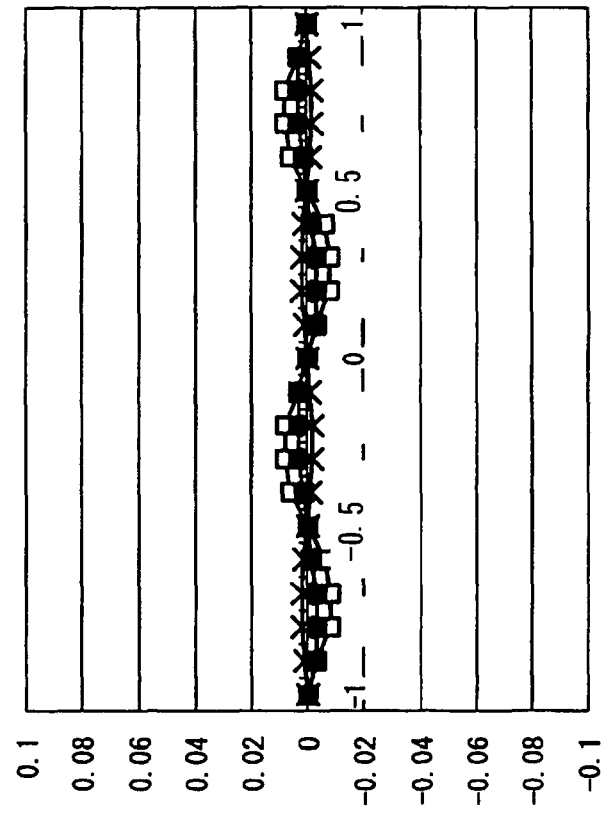

When a pair of sets of image data manifesting no vignetting contain noise, as shown in FIG. 23B, the correlation graphs presented in FIGS. 26B, 27B and 28B, respectively obtained by using the correlation operation expressions EA, EB and EC, each contain a distinct minimal value indicating a sharp dip at the true image shift amount and there is only a slight extent of error in the image shift amount calculation results, but there is some increase in the extent of error in the image shift amount calculation results obtained by using the correlation operation expression EC, as indicated in FIGS. 24B and 25B.

Figure 24D:
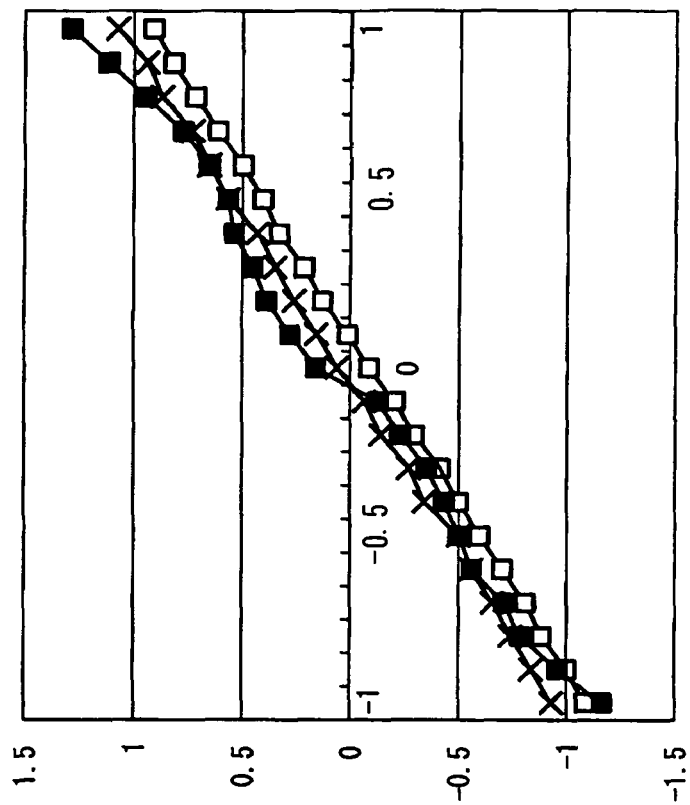
Figure 24C:
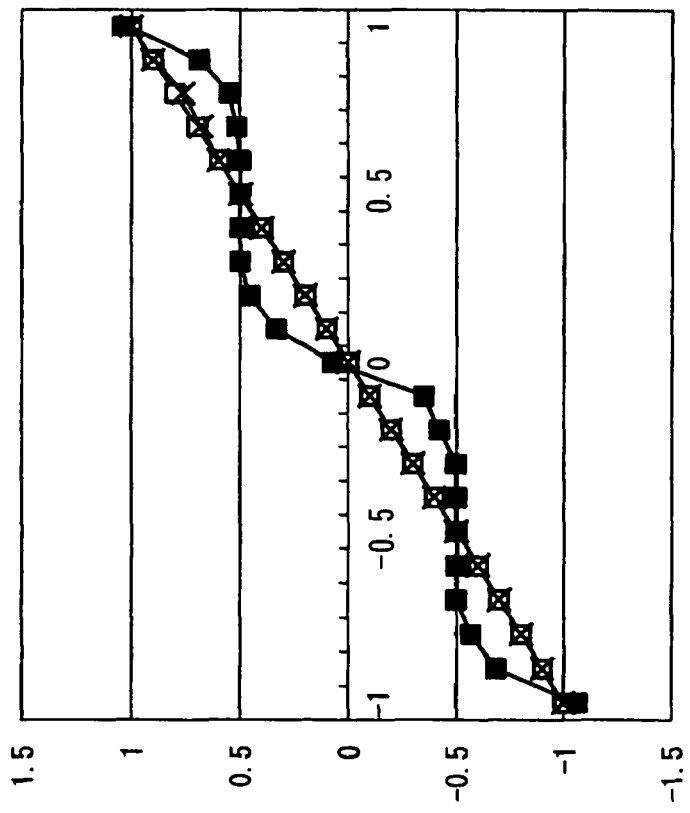
Figure 25D:
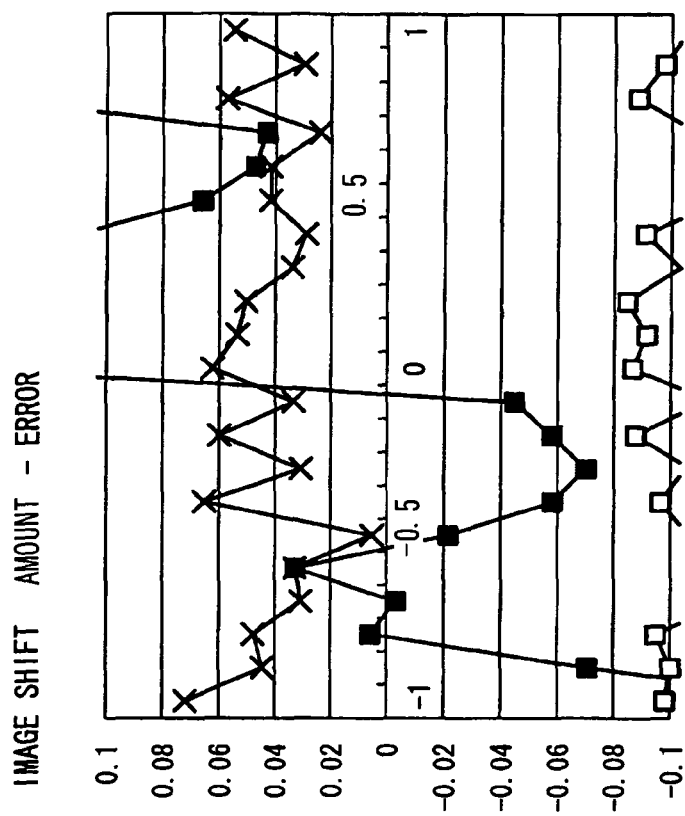
Figure 25C:
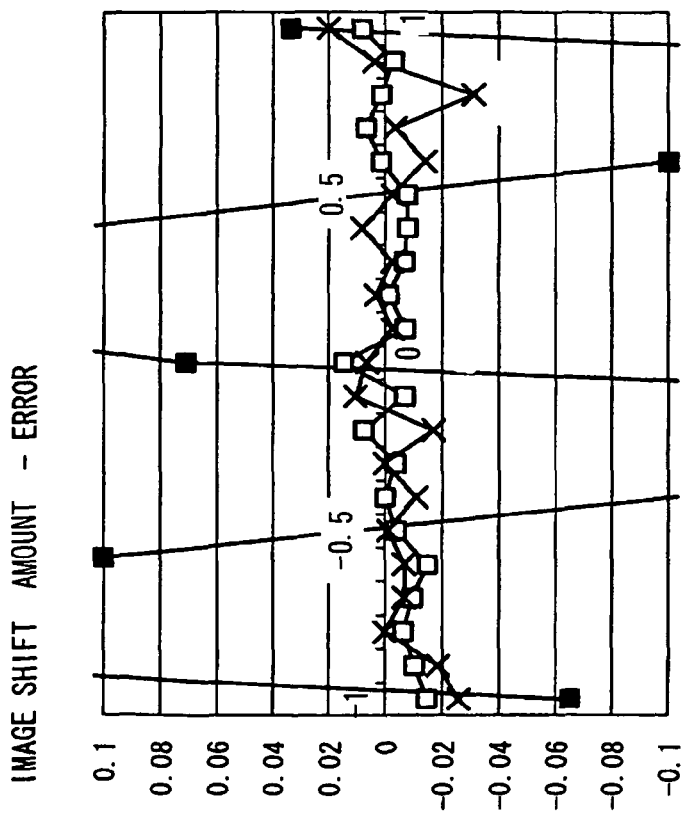

When a pair of sets of image data manifesting $0^{th}$ order vignetting contain noise, as shown in FIG. 23C, the correlation graphs presented in FIGS. 27C and 28C, respectively obtained by using the correlation operation expressions EB and EC, each contain a distinct minimal value indicating a sharp dip at the true image shift amount and there is only a slight extent of error in the image shift amount calculation results obtained based upon the correlation calculation expression EB, but there is some increase in the extent of error in the image shift amount calculation results obtained by using the correlation operation expression EC, as indicated in FIGS. 24C and 25C.

The correlation graph obtained in correspondence to the pair of sets of image data manifesting $0^{th}$ order vignetting and also containing noise, as shown in FIG. 23C by using the correlation operation expression EA does not dip distinctly near the true image shift amount, as shown in FIG. 26C. In addition, there is a significant error in the image shift amount calculation results, as shown in FIGS. 24C and 25C.

When a pair of sets of image data manifesting $1^{st}$ order vignetting contain noise, as shown in FIG. 23D, the correlation graph presented in FIG. 28D, obtained by using the correlation operation expression EC, contains a distinct minimal value indicating a sharp dip at the true image shift amount and there is only a slight extent of error in the image shift amount calculation results, as indicated in FIGS. 24D and 25D.

When a pair of sets of image data manifesting $1^{st}$ order vignetting contain noise, as shown in FIG. 23D, the correlation graph presented in FIG. 27D, obtained by using the correlation operation expression EB, contains a distinct minimal value indicating a sharp dip near the true image shift amount, but the extent of error (parallel displacement component) in the image shift amount calculation results is significant, as shown in FIGS. 24D and 25D.

The correlation graph obtained in correspondence to the pair of sets of image data manifesting $1^{st}$ order vignetting and also containing noise, as shown in FIG. 23D by using the correlation operation expression EA does not dip distinctly near the true image shift amount, as shown in FIG. 26D. In addition, there is a significant error in the image shift amount calculation results, as shown in FIGS. 24D and 25D.

Next, the optimal correlation operation expression that may be used in correspondence to the spatial frequency of the image data is described. FIG. 29 presents a table comparing the relationships between the operation parameter spn in the correlation operation expressions EB and EC and varying data frequency levels. As the table clearly indicates, very accurate image shift detection results can be obtained in conjunction with a pair of sets of image data containing a significant low-frequency component by setting the operation parameter spn in the correlation operation expressions EB and EC to a large value. In contrast, very accurate image shift detection results can be obtained in conjunction with a pair of sets of image data containing a significant high-frequency component by setting the operation parameter spn in the correlation operation expressions EB and EC to a small value.

FIGS. 30A, 30B and 31A~31D present simulation data provided to facilitate an explanation of the characteristics of the operation parameter spn in the correlation operation expressions EB and EC. FIGS. 30A and 30B each present a graph of a pair of sets of image data (indicated by symbol "■" and symbol "□") with the data position indicated along the horizontal axis and the data value indicated along the vertical axis. It is to be noted that one set of image data is offset relative to the other set of image data in each pair of sets of image data by a single data position to provide a clearer presentation without any overlap of the sets of image data in FIGS. 30A and 30B. FIG. 30A shows a pair of sets of image data (high-frequency sine waveform) manifesting $1^{st}$ order vignetting and FIG. 30B shows a pair of sets of image data (low-frequency sine waveform) manifesting $1^{st}$ order vignetting.

Figure 31A:
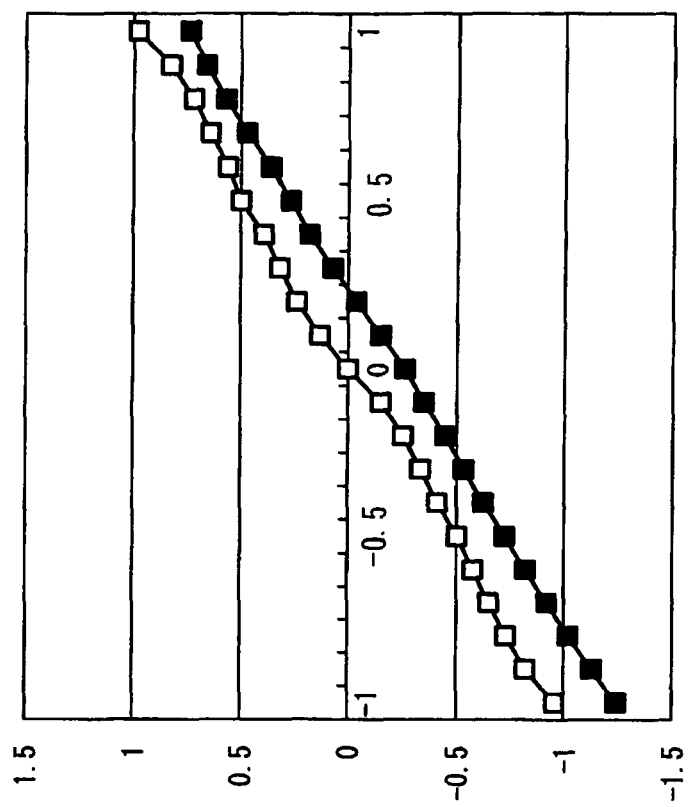
FIGS. 31A~31D each present the calculation results obtained from image shift detection executed using the correlation operation expression EB (spn=1, 10) on image data in a state of image shift achieved by shifting a given pair of sets of image data in FIG. 30 relative to each other by −1~+1 when the shift increment unit is set to match the data pitch.
Figure 31B:
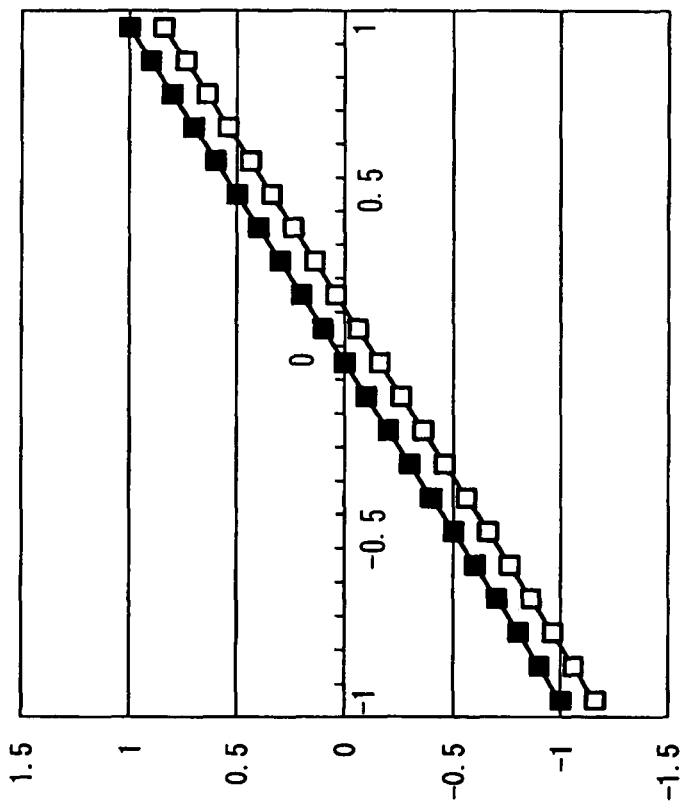

FIGS. 31A and 31B present graphs of calculation results (calculation results obtained by setting spn to 1 indicated by symbol "■" and calculation results obtained by setting spn to 10 indicated by symbol "□") obtained through image shift detection based upon the correlation operation expression EB (spn=1, 10) in a state of image shift achieved by shifting the pairs of sets of image data in FIGS. 30A and 30B relative to each other by −1~+1 when the shift increment unit is set to match the data pitch. The actual image shift amount (unit: data pitch) is indicated along the horizontal axis and the image shift amount ascertained based upon the calculation results is indicated along the vertical axis in these graphs.

Figure 31D:
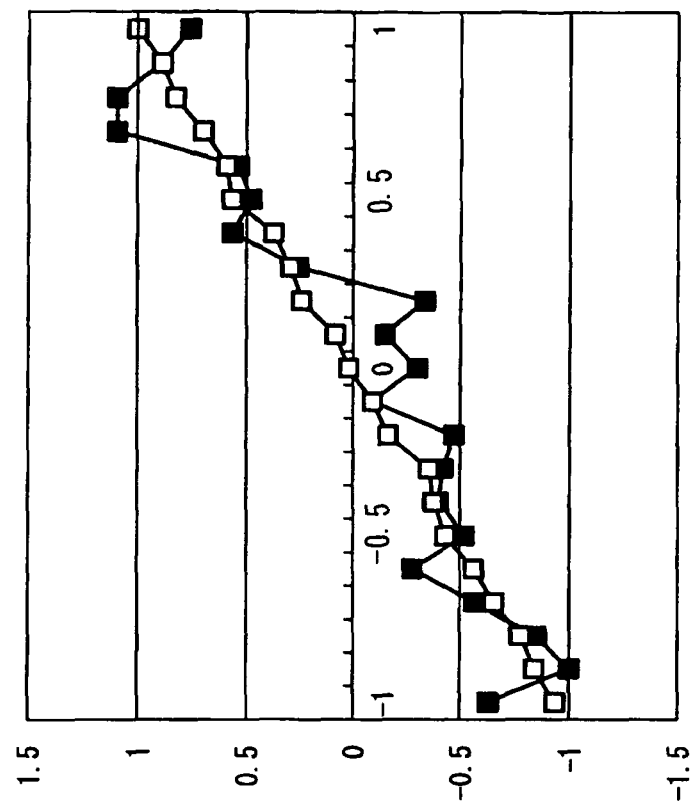
Figure 31C:
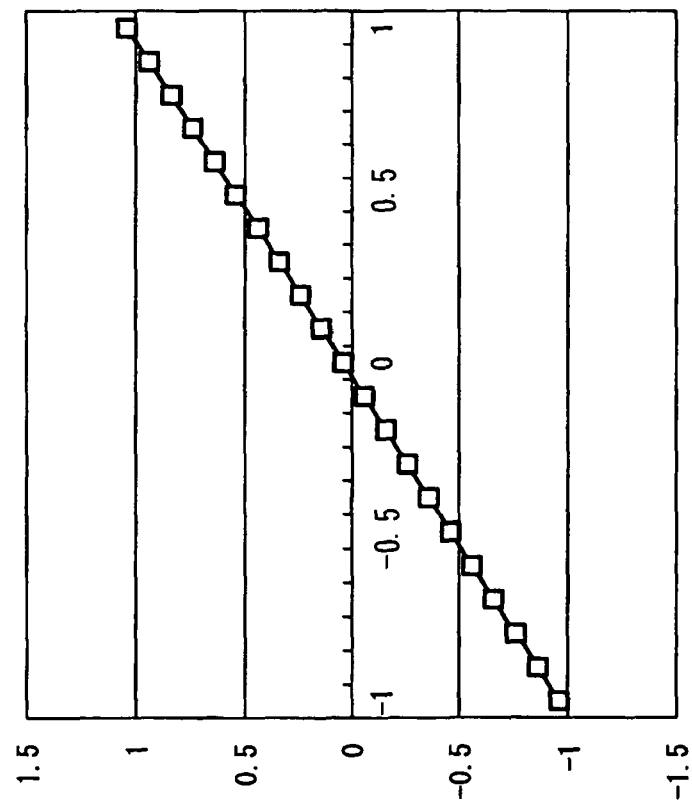

FIG. 31C presents a graph of calculation results (calculation results obtained by setting spn to 1 indicated by symbol "■" and calculation results obtained by setting spn to 10 indicated by symbol "□") obtained through image shift detection based upon the correlation operation expression EC (spn=1, 10) in a state of image shift achieved by shifting the pair of sets of image data in FIG. 30B relative to each other by −1~+1 when the shift increment unit is set to match the data pitch. The actual image shift amount (unit: data pitch) is indicated along the horizontal axis and the image shift amount ascertained based upon the calculation results is indicated along the vertical axis in the graph.

FIG. 31D presents a graph of calculation results (calculation results obtained by setting spn to 1 indicated by symbol "■" and calculation results obtained by setting spn to 10 indicated by symbol "□") obtained through image shift detection based upon the correlation operation expression EC (spn=1, 10) in a state of image shift achieved by shifting the pair of sets of image data in FIG. 30B with superimposed noise, relative to each other by −1~+1 when the shift increment unit is set to match the data pitch. The actual image shift amount (unit: data pitch) is indicated along the horizontal axis and the image shift amount ascertained based upon the calculation results is indicated along the vertical axis in the graph.

As FIGS. 31A and 31B clearly indicate, the extent of shifting manifesting in the image shift detection calculation results due to $1^{st}$ order vignetting can be reduced by adjusting the operation parameter spn in the correlation operation expression EB in correspondence to the frequency of the image data (by setting spn to a large value when processing low-frequency image data and setting spn to a small value when processing high-frequency image data).

In addition, as FIGS. 31C and 31D clearly indicate, the extent of inconsistency in the image shift detection calculation results due to noise can be reduced by adjusting the operation parameter spn in the correlation operation expression EC in correspondence to the frequency of the image data (by setting spn to a large value when processing low-frequency image data).

Generally speaking, the adverse effects of vignetting and noise can be reduced by adjusting spn in a correlation operation expression that includes a multiplication of data strings, such as the correlation operation expression EB or EC, in correspondence to the frequency of the image data (by setting spn to a large value when processing low-frequency image data and setting spn to a small value when processing high-frequency image data).

Figure 12B:
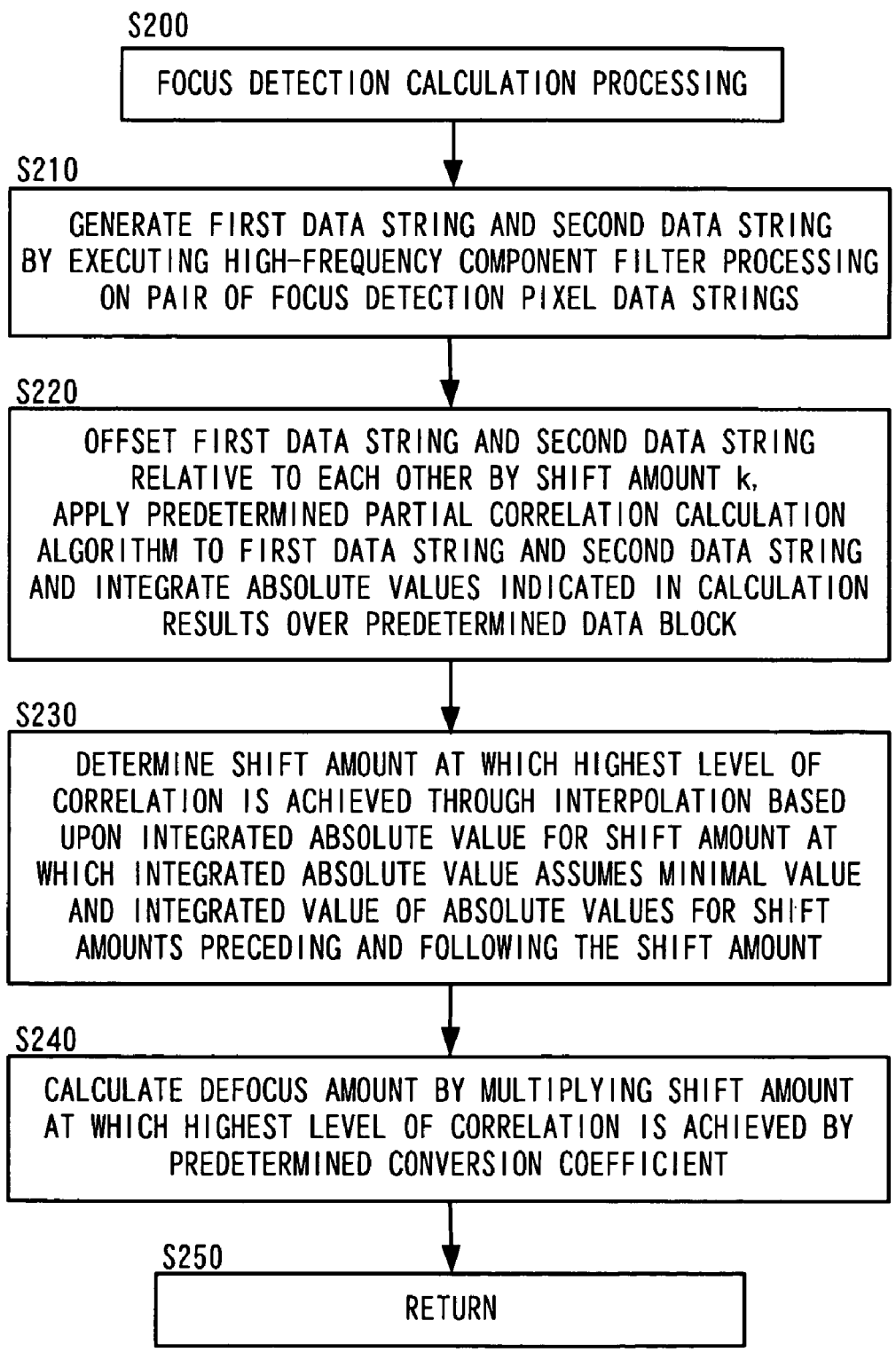
Figure 32:
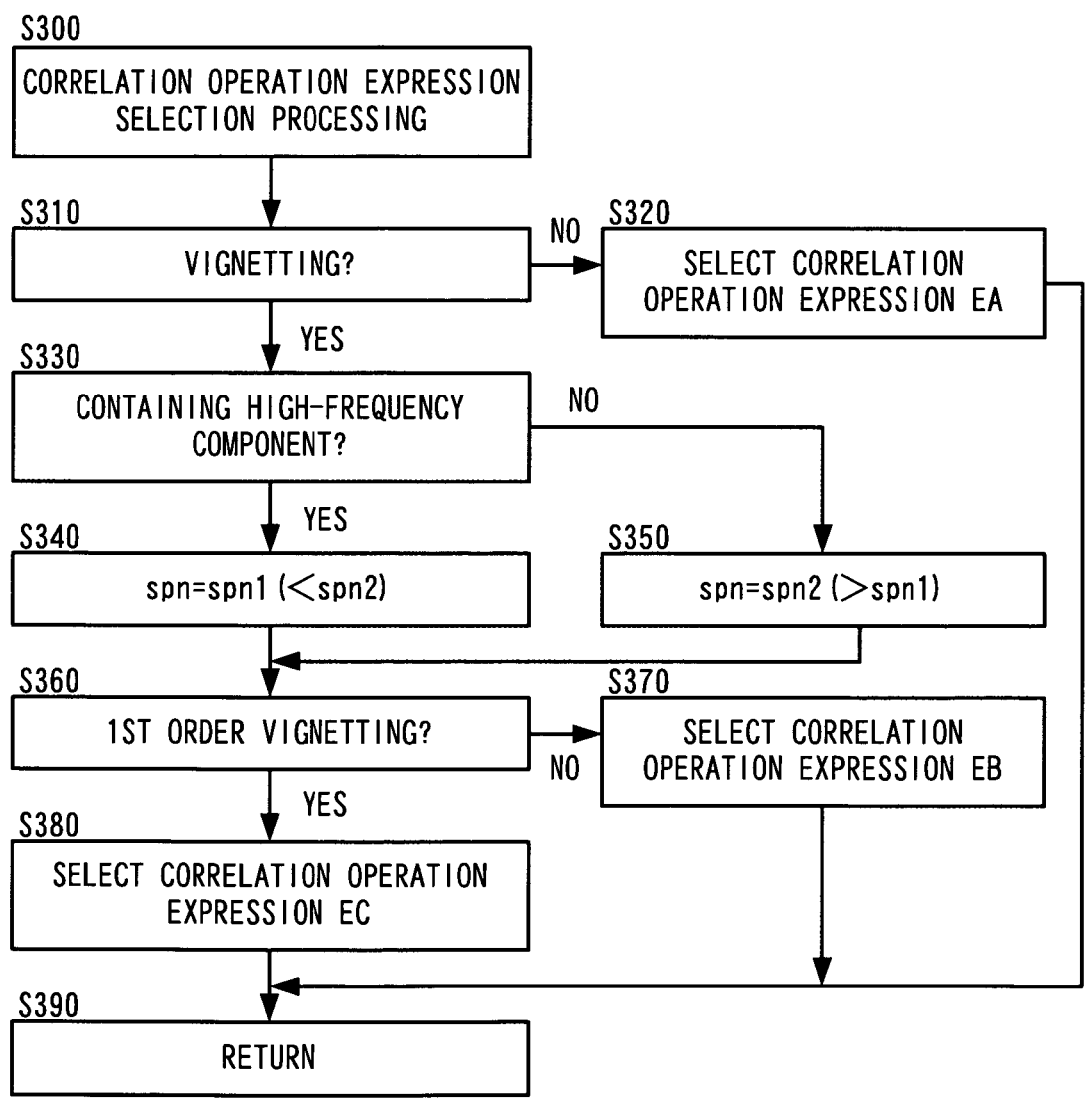
FIG. 32 presents a flowchart of the correlation operation expression selection routine.

Based upon the concept described above, the body drive control device 214 executes the focus detection calculation processing shown in FIG. 12B and the correlation operation expression selection processing shown in FIG. 32, which is part of the focus detection calculation processing. FIG. 12B presents a detailed flowchart of focus detection calculation processing that may be executed in step S130 in FIG. 11. The body drive control device 214 starts the focus detection calculation processing (correlation arithmetic processing) in step S200. The processing differs from that shown in FIG. 12A described earlier only in that partial correlation arithmetic processing in step S225 is executed in place of the processing in step S220.

More specifically, the optimal correlation operation expression is selected through the processing flow shown in FIG. 32. The correlation operation expression selection processing starts in step S300 and then a decision is made in step S310 as to whether or not vignetting is detected. If it is decided that no vignetting has occurred, the operation proceeds to step S320 to select the correlation calculation expression EA. If, on the other hand, it is decided that vignetting has manifested, the operation proceeds to step S330 to make a decision as to whether or not a significant high-frequency component is detected in the image data. If it is decided that the rate of the high-frequency component in the image data is greater than the rate of the low-frequency component, the operation proceeds to step S340 to set spn to spn1 (e.g., 1). However, if it is decided that the rate of the high-frequency component is smaller than that of the low-frequency component, the operation proceeds to step S350 to set spn to spn2 (e.g., 10).

Next, a decision is made in step S360 as to whether or not an occurrence of $1^{st}$ order vignetting is detected. If it is decided that no $1^{st}$ order vignetting has occurred, the operation proceeds to step S370 to select the correlation operation expression EB. If, on the other hand, it is decided that $1^{st}$ order vignetting has occurred, the operation proceeds to step S380 to select the correlation operation expression EC.

When making a decision in step S310 as to whether or not vignetting is detected and making a decision in step S360 as to whether or not 1st order vignetting is detected in the flowchart presented in FIG. 32, the state of vignetting, such as that shown in FIG. 14, is designated with a specific numerical value among 0, 1 and 2 for purposes of convenience based upon data indicating, for instance, the projection distance d to the focus detection pupil areas 93 and 94, the shape and size of the focus detection pupil areas 93 and 94, the exit pupil distance d1 measured in relation to the optical system, the shape and size of the exit pupil and the image height h measured in relation to focus detection pixels, as shown in FIG. 13.

Namely, the vignetting state can be classified as one of three different stages, i.e., no vignetting→$0^{th}$ order vignetting→$1^{st}$ order vignetting, in correspondence to the level of vignetting with 0 indicating no vignetting, 1 indicating $0^{th}$ order vignetting and 2 indicating $1^{st}$ order vignetting. If the numerical value designated in relation to the vignetting state is equal to or greater than 1, the current condition is judged to manifest vignetting and if the numerical value is equal to or greater than 2, the current condition is judged to manifest $1^{st}$ order vignetting.

In an alternative vignetting detection method, one of the correlation operation expressions may be used to first detect an approximate image shift amount (shift amount k), the pair of sets of image data may be offset relative to each other by the shift amount k so as to substantially align them and data indicating the ratio of the pair of sets of data strings in this state may be ascertained through calculation. If the ratio data indicate a value substantially equal to 1 regardless of the data position, it is decided that no vignetting manifests. If the ratio data indicate a substantially constant value equal to and greater than 1 or equal to or greater than smaller than 1 regardless of the data position, it is decided that $0^{th}$ order vignetting manifests. If the value indicated by the ratio data changes in a specific uniform pattern depending upon the data position, it is decided that $1^{st}$ order vignetting manifests.

The decision as to whether or not a significant high-frequency component is detected in the image data may be made in step S330 in FIG. 32 based upon a value representing the sum of the components over a specific high-frequency range, obtained by executing a Fourier transform on the image data or a value representing the total sum of the filtered data obtained by filtering the image data with a digital filter that extracts the components over a predetermined high-frequency range.

Third Embodiment

In the embodiment described above, the vignetting state, the noise condition and the spatial frequency component in the data are detected and the defocus amount is calculated by using the optimal correlation operation expression selected from a plurality of correlation operation expressions in correspondence to the detected vignetting state, noise condition and spatial frequency component. As an alternative, a plurality of defocus quantities may be calculated in correspondence to a plurality of correlation operation expressions first, defocus quantities assuring a high level of reliability may then be extracted from the calculated defocus quantities and an ultimate defocus amount may be calculated by averaging the extracted defocus quantities. In such a case, the body drive control device 214 executes focus detection calculation processing through the flow shown in FIG. 33. The focus detection calculation processing starts in step S300 and then in the following step S315, the pair of data strings provided via the focus detection pixels undergo filter processing so as to clip a high-frequency component equal to or higher than the Nyquist frequency from the data strings, thereby generating a first data string and a second data string.

In step S325, a plurality of correlation calculation expressions (EA, EB:spn set to a small value, EB: spn set to a large value, EC: spn set to a small value, EC: spn set to a large value) are applied to the first data string and the second data string and thus defocus quantities are calculated in correspondence to the individual correlation operation expressions. In step S335, the reliability of the defocus amount having been calculated based upon each correlation operation expression is judged based upon the correlation parameter C(x) or SLOP shown in FIG. 21 and reliable defocus quantities are extracted.

In step S345, the extracted defocus quantities are averaged and the correlation parameter values corresponding to the extracted defocus quantities are averaged before the focus detection calculation processing ends.

Figure 34:
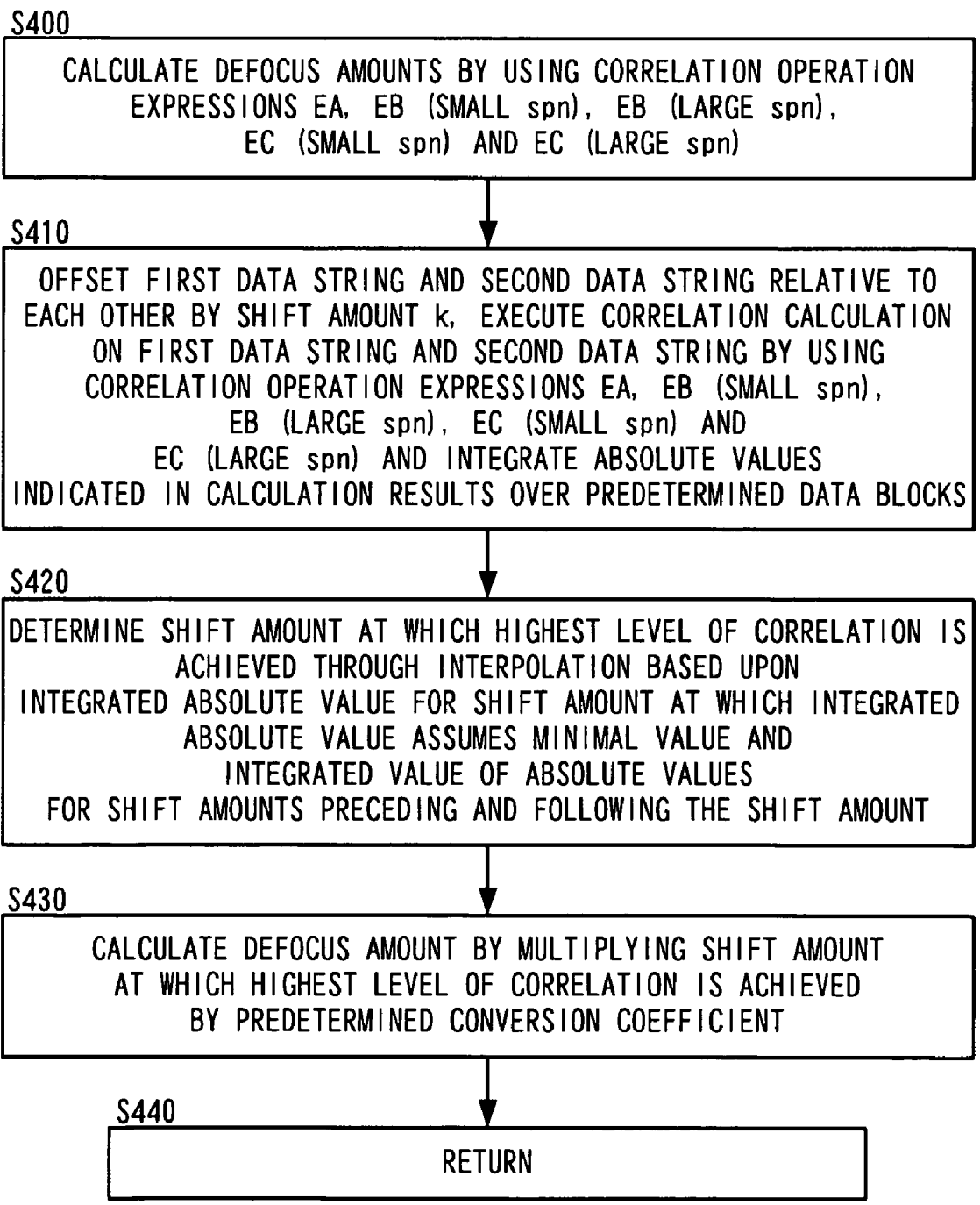
FIG. 34 presents a flowchart of focus detection calculation processing.

FIG. 34 presents a flowchart of defocus amount calculation processing executed based upon each of the plurality of correlation operation expressions (EA, EB:spn set to a small value, EB: spn set to a large value, EC: spn set to a small value, EC: spn set to a large value). Each of the processing steps in the flowchart is executed by the body drive control device 214. The defocus amount calculation processing starts in step S400, and then in the following step S410, the first data string ($A_1$~$A_n$) and the second data string ($B_1$~$B_n$) are offset relative to each other (by the shift amount k), the first data string and the second data string are then processed by using the correlation operation expressions (EA, EB: spn set to a small value, EB: spn set to a large value, EC: spn set to a small value, EC: spn set to a large value) and the absolute values indicated by the calculation results are integrated over predetermined data blocks.

In step S420, an image shift amount is calculated based upon the minimum value assumed for the correlation quantity C(k) through the three-point interpolation method described in reference to FIG. 21 and then, the image shift amount is converted to a defocus amount in step S430 before ending the defocus amount calculation processing.

In the embodiment described above, a plurality of defocus quantities are calculated in correspondence to a plurality of correlation operation expressions first, reliable defocus quantities among the calculated defocus quantities are then extracted and the ultimate defocus amount is calculated by averaging the extracted defocus quantities. As a result, highly accurate and reliable focus detection is enabled regardless of the vignetting state, the noise condition or the spatial frequency component in the data. Furthermore, unlike the processing described earlier, in which the vignetting state, the noise condition and the spatial frequency component in the data are first detected and the defocus amount is calculated based upon the optimal correlation operation expression selected from a plurality of correlation operation expressions in correspondence to the vignetting state, the noise condition and the spatial frequency component in the data having been detected, the processing achieved in the embodiment does not require detection processing for detecting the vignetting state, the noise condition and the spatial frequency component in the data and moreover, is never adversely affected by any erroneous detection of the vignetting state, the noise condition or the spatial frequency component in the data.

Fourth Embodiment

In the second embodiment described above, the correlation operation expression EA (15), the correlation operation expression EB (16) or the correlation operation expression EC (17) is selectively used based upon the vignetting-related characteristics of the individual expressions and the parameter spn in the correlation operation expressions EB and EC is adjusted in correspondence to the spatial frequency component in the image data. However, the present invention may be adopted in conjunction with correlation operation expressions other than (15)~(17) and it may be adopted in conjunction with correlation operation expressions assuming forms other than those of expressions (15)~(17). A specific correlation operation expression among a plurality of such alternative correlation operation expressions can be selectively used based upon the vignetting-related characteristics of the individual correlation operation expressions and a parameter in a given correlation operation expression can be adjusted in correspondence to the spatial frequency component in the image data.

For instance, correlation operation expressions ED (18) and EE (19) may be used in place of the correlation operation expressions EB (16) and EC (17).

$$C(k) = \Sigma |(A_i - A_{i+spnb}) \cdot (B_{i+spna+k} - B_{i+spna+spnb+k}) - (B_{i+k} - B_{i+spnb+k}) \cdot (A_{i+spna} - A_{i+spna+spnb})| \quad (18)$$

$$C(k) = \Sigma |A_i \cdot A_{i+spna+spnb} \cdot B_{i+spnb+k} \cdot B_{i+spna+k} - A_{i+spna} \cdot A_{i+spnb} \cdot B_{i+k} \cdot B_{i+spna+spnb+k}| \quad (19)$$

It is to be noted that spna and spnb in expressions (18) and (19) each represents a constant parameter taking on a value assuming an incremental unit matching the data pitch.

—Variations—

A specific correlation operation expression among a plurality of correlation operation expressions may be selected based upon the characteristics of the individual correlation operation expression other than their vignetting-related characteristics, or a parameter in a correlation operation expression may be adjusted in correspondence to characteristics other than the spatial frequency component in the image data.

For instance, the correlation operation expressions EA, EB and EC or the correlation operation expressions EB and EC with the parameter spn therein assuming different values have different noise withstanding characteristics (the correlation operation expressions EA, EB and EC assure varying noise withstanding performance levels in the order of EA>EB>EC and a higher level of noise withstanding performance is assured when spn is set to a larger value). Accordingly, the correlation operation expression EA, EB or EC may be selected in correspondence to noise added into the image data or characteristics related to such noise, or the parameter spn in the correlation operation expressions EB and EC may be adjusted in correspondence to the noise or the noise related characteristics.

The level of noise is dependent upon the gain assumed at an amplifier built into the image sensor to amplify the pixel signals (the noise increases when the gain is set higher). FIG. 35 presents a table showing how the optimal correlation operation expression EA, EB or EC should be selected in correspondence to the gain at the amplifier, indicating that the expression EA should be selected when the gain at the amplifier is high and the noise level is high, that the correlation operation expression EB should be selected when the gain setting at the amplifier is at medium and the noise level is medium and that the correlation operation expression EC should be selected when the gain at the amplifier is low and the noise level is low.

Figure 36:
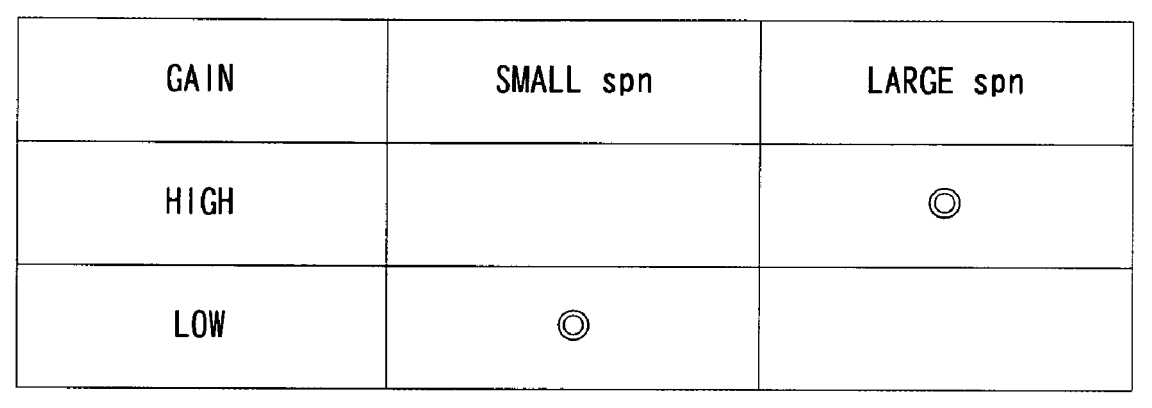

FIG. 36 presents a table showing how the parameter spn in the correlation operation expressions EB and EC should be adjusted in correspondence to the gain set at the amplifier, indicating that spn should be set to a large value when the gain at the amplifier is high and the noise level is high and that spn should be set to a small value when the gain at the amplifier is low and the noise level is low.

The noise level is also dependent upon the brightness in the visual field where the image data are obtained (the noise level increases when the brightness level is lower). FIG. 37 presents a table showing how the optimal correlation operation expression EA, EB or EC should be selected in correspondence to the brightness, indicating that the expression EA should be selected when the brightness is low and the noise level is high, that the correlation operation expression EB should be selected when the brightness is at medium and the noise level is medium and that the correlation operation expression EC should be selected when the brightness is high and the noise level is low.

Figure 38:
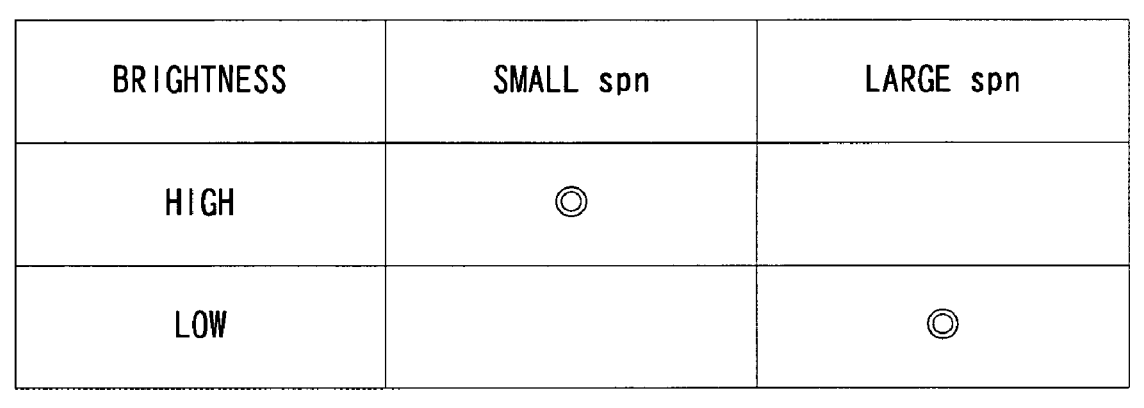

FIG. 38 presents a table showing how the parameter spn in the correlation operation expressions EB and EC should be adjusted in correspondence to the brightness, indicating that spn should be set to a large value when the brightness is low and the noise level is high and that spn should be set to a small value when the brightness is high and the noise level is low. It is to be noted that information indicating the brightness can be obtained via a photometering means (not shown)

The noise influence factor influence factor increases when the contrast is lower is also dependent upon the contrast in the image data. FIG. 39 presents a table showing how the optimal correlation operation expression EA, EB or EC should be selected in correspondence to the contrast, indicating that the correlation operation expression EA should be selected when the contrast is low and the noise influence factor is high, that the correlation operation expression EB should be selected when the contrast is at medium and the noise influence factor is medium and that the correlation operation expression EC should be selected when the contrast is high and the noise influence factor is low.

Figure 40:
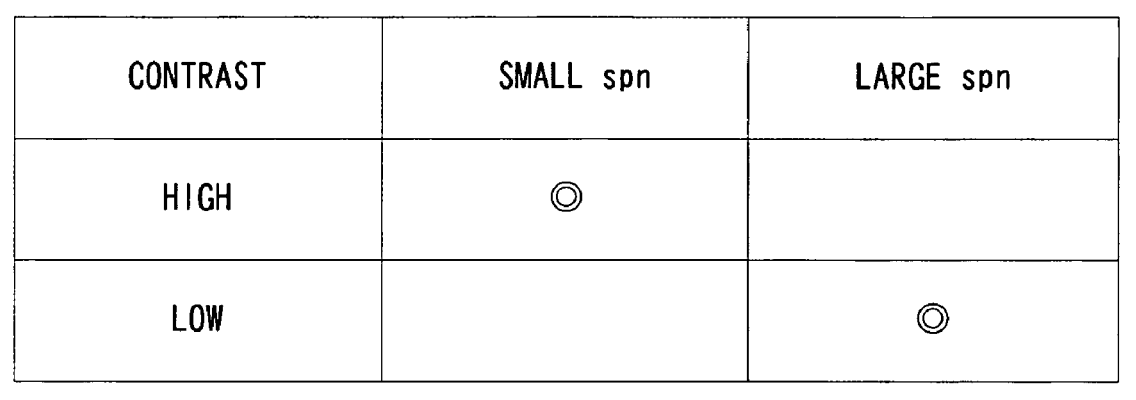

FIG. 40 presents a table showing how the parameter spn in the correlation operation expressions EB and EC should be adjusted in correspondence to the contrast, indicating that spn should be set to a large value when the contrast is low and the noise influence factor is high and that spn should be set to a small value when the contrast is high and the noise influence factor is low. It is to be noted that the image data contrast can be determined through arithmetic operation by calculating the sum of the absolute values of the differences between values indicated at adjacent pixels in the image data or the difference between the maximum value and the minimum value indicated in the image data.

The contrast in the image data (the noise influence factor) is dependent upon the state of focus adjustment (the defocus amount) at the optical system (when the defocus amount is greater, the contrast is lowered and the noise influence factor increases). FIG. 41 presents a table showing how the correlation operation expression EA, EB or EC should be selected in correspondence to the defocus amount, indicating that the correlation operation expression EA should be selected when the defocus amount is large and the noise influence factor is high, that the correlation operation expression EB should be selected when the defocus amount is at medium and the noise influence factor is medium and that the correlation operation expression EC should be selected when the defocus amount is small and the noise influence factor is low.

Figure 42:
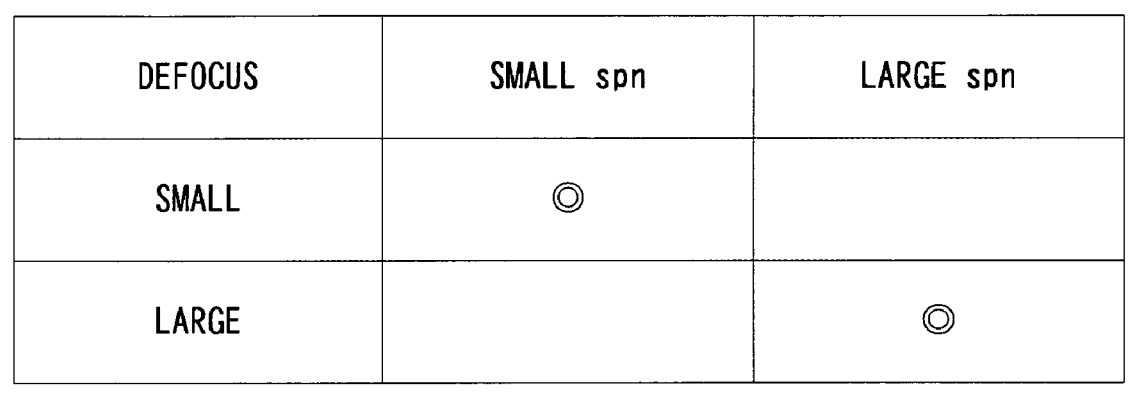

FIG. 42 presents a table showing how the parameter spn in the correlation operation expressions EB and EC should be adjusted in correspondence to the defocus amount, indicating that spn should be set to a large value when the defocus amount is large and the noise influence factor is high and that spn should be set to a small value when the defocus amount is small and the noise influence factor is low. It is to be noted that the defocus amount can be ascertained from the latest focus detection results in the focus detection cycle.

Since the defocus amount indicating the extent of defocus at the optical system is likely to be large immediately after turning on the power to the image-capturing apparatus, the correlation operation expression EA may be automatically selected for the parameter spn in the correlation operation expressions EB or EC may be set to a large value immediately after turning on the power.

In addition, if the correlation operation expressions EA, EB and EC or the correlation operation expressions EB and EC with the parameter spn therein set to different values assume different characteristics depending upon the image pattern (e.g., an edge, a single line or a multiple-line image pattern), the characteristic pattern of the image may be extracted based upon the image data and the optimal correlation operation expression EA, EB or EC may be selected or the parameter spn in the correlation operation expressions EB and EC may be adjusted in correspondence to the extraction results.

Figure 33:
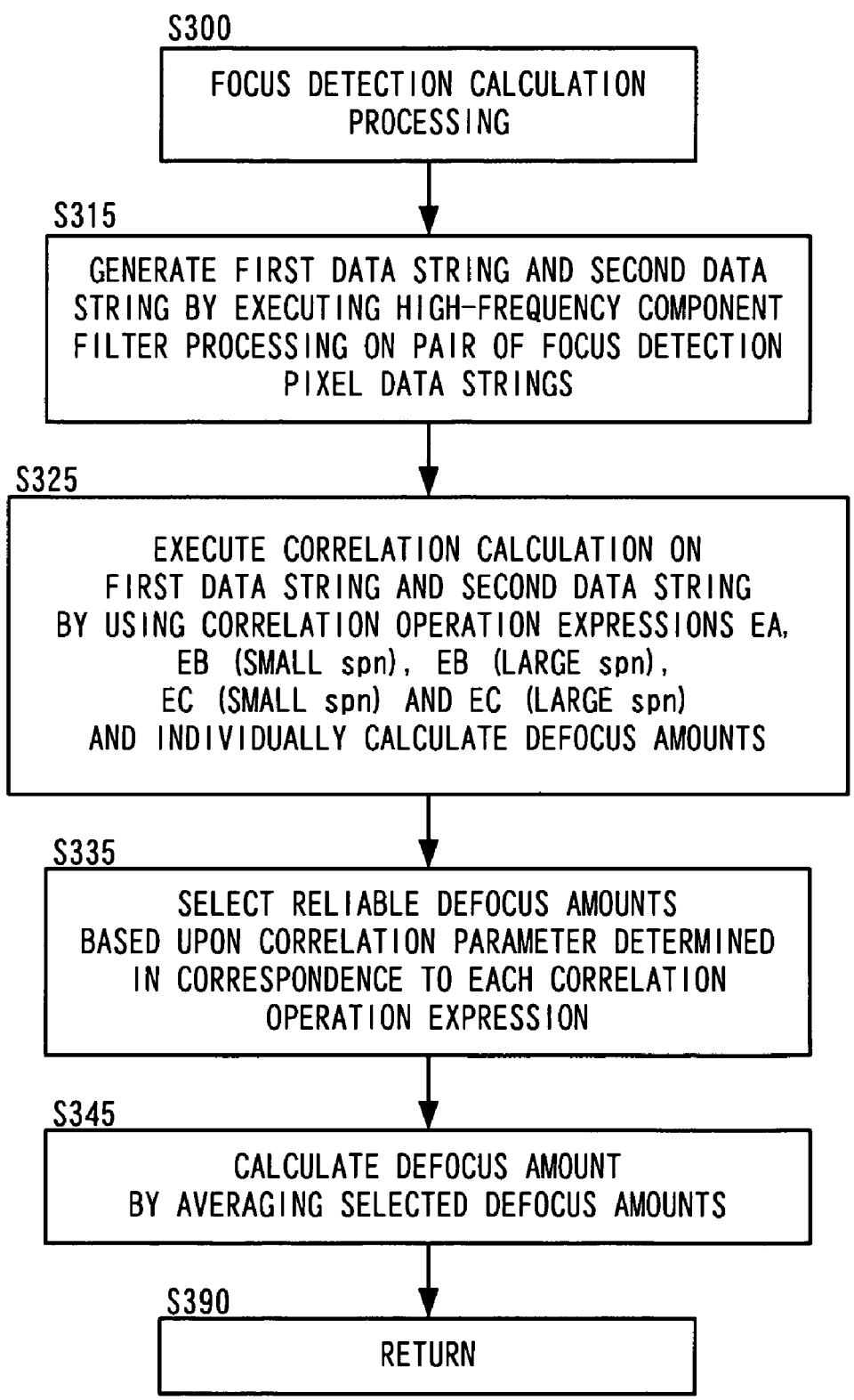
FIG. 33 presents a flowchart of focus detection calculation processing.

While defocus quantities are calculated in correspondence to the individual expressions in the processing executed as shown in FIGS. 33 and 34, image shift amounts may be calculated in correspondence to the individual correlation operation expressions, reliable image shift amounts among the calculated image shift amounts may be extracted, the extracted image shift amounts may then be averaged and finally the image shift amount average may be converted to a defocus amount, instead.

A plurality of defocus quantities are calculated in correspondence to the plurality of correlation operation expressions and then reliable defocus quantities among the plurality of defocus quantities having been calculated are extracted in the processing executed as shown in FIG. 33. As an alternative, image shift detection may be executed by using a plurality of correlation operation expressions in a predetermined sequence and the image shift detection processing may end once a reliable defocus amount has been calculated as in the focus detection calculation processing shown in FIG. 43.

Figure 43:
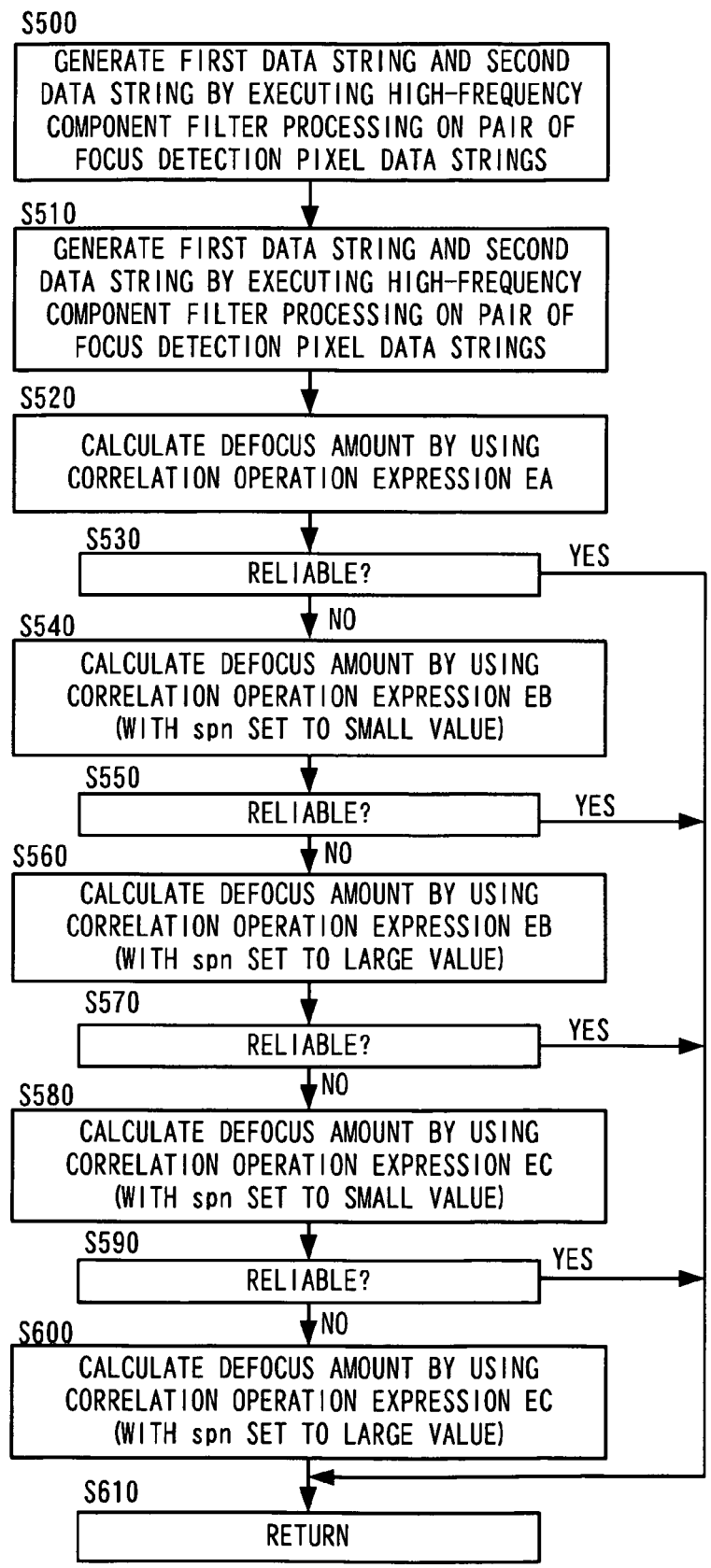
FIG. 43 presents a flowchart of focus detection calculation processing.

The individual processing steps in the flowchart presented in FIG. 43 are executed by the body drive control device 214. The focus detection calculation processing starts in step S500 and then in the following step S510, the pair of sets of data strings provided via the focus detection pixels undergo filter processing so as to clip a high-frequency component equal to or higher than the Nyquist high frequency from that data strings, thereby generating a first data string and a second data string. In step S520, a defocus amount is calculated by applying the correlation operation expression EA to the first data string and the second data string.

In step S530, a decision is made as to whether or not the calculated defocus amount is reliable and if it is decided that it is reliable, the operation proceeds to step S610 to end the focus detection calculation processing. If, on the other hand, the calculated defocus amount is judged to be not reliable, the operation proceeds to step S540 to calculate a defocus amount by applying the correlation operation expression EB (with spn set to a small value) to the first data string and the second data string.

In step S550, a decision is made as to whether or not the calculated defocus amount is reliable and if it is decided that it is reliable, the operation proceeds to step S610 to end the focus detection calculation processing. If, on the other hand, the calculated defocus amount is judged to be not reliable, the operation proceeds to step S560 to calculate a defocus amount by applying the correlation operation expression EB (with spn set to a large value) to the first data string and the second data string.

In step S570, a decision is made as to whether or not the calculated defocus amount is reliable and if it is decided that it is reliable, the operation proceeds to step S610 to end the focus detection calculation processing. If, on the other hand, the calculated defocus amount is judged to be not reliable, the operation proceeds to step S580 to calculate a defocus amount by applying the correlation operation expression EC (with spn set to a small value) to the first data string and the second data string.

In step S590, a decision is made as to whether or not the calculated defocus amount is reliable and if it is decided that it is reliable, the operation proceeds to step S610 to end the focus detection calculation processing. If, on the other hand, the calculated defocus amount is judged to be not reliable, the operation proceeds to step S600 to calculate a defocus amount by applying the correlation operation expression EC (with spn set to a large value) to the first data string and the second data string before ending the focus detection processing in step S610.

In the focus detection calculation processing shown in FIG. 43, a plurality of correlation operation expressions are used one at a time in a specific sequence (correlation calculation expression EA→EB with small spn→EB with large spn→EC with small spn→EC with large spn) so that standard data manifesting no vignetting, containing no noise but containing a significant high-frequency component are first processed with the correlation operation expression assuring the highest level of image shift detection accuracy and requiring the smallest scale of arithmetic processing, and thus, highly accurate focus detection is achieved within a shorter period of time over the processing shown in FIG. 34.

While the defocus amount is calculated in correspondence to each correlation operation expression in the focus detection processing shown in FIG. 43, image shift amounts may be calculated in correspondence to the individual correlation operation expressions and only an image shift amount judged to be reliable among the image shift amounts having been calculated may be converted to a defocus amount, instead.

While the processing described in reference to the first embodiment is executed by using different correlation arithmetic expressions (7)~(9), the processing described in reference to the second and the third embodiments is executed by using different correlation arithmetic expressions EA, EB with small spn, EB with large spn, EC with small spn and EC with large spn in (15) through (17) and the processing described in reference to the fourth embodiment is executed by using correlation operation expressions assuming forms other than those of the expression used in the earlier embodiments, the present invention may instead be adopted in conjunction with correlation operation expressions assuming forms different from either.

While the sum of the absolute value of the partial correlation quantities is calculated by setting the operation parameter spn in a given correlation operation expression and the correlation quantity C(k) is calculated by integrating the sum over the predetermined data blocks in the focus detection calculation processing shown in FIG. 12A, the correlation quantity C(k) may instead be determined by adding up the absolute values of partial correlation quantities calculated based upon correlation operation expressions (e.g., expressions (15), (16) and (17)) in different forms and integrating the sum over a predetermined data block instead. In such a case, the partial correlation quantity calculated by using each correlation operation expression should be standardized by dividing it by a specific value corresponding to the particular correlation operation expression so as to assure uniformity among the levels of the partial correlation quantities. Such a specific value corresponding to each correlation operation expression may be, for instance, the maximum value of the correlation quantity C(k) determined by applying the specific correlation operation expression to a pair of sets of standard data.

The focus detection areas may be set at positions other than those shown in FIG. 2 at the image sensor and focus detection areas ranging along the horizontal direction and the vertical direction may be set along the diagonal directions or at other positions.

Figure 44:
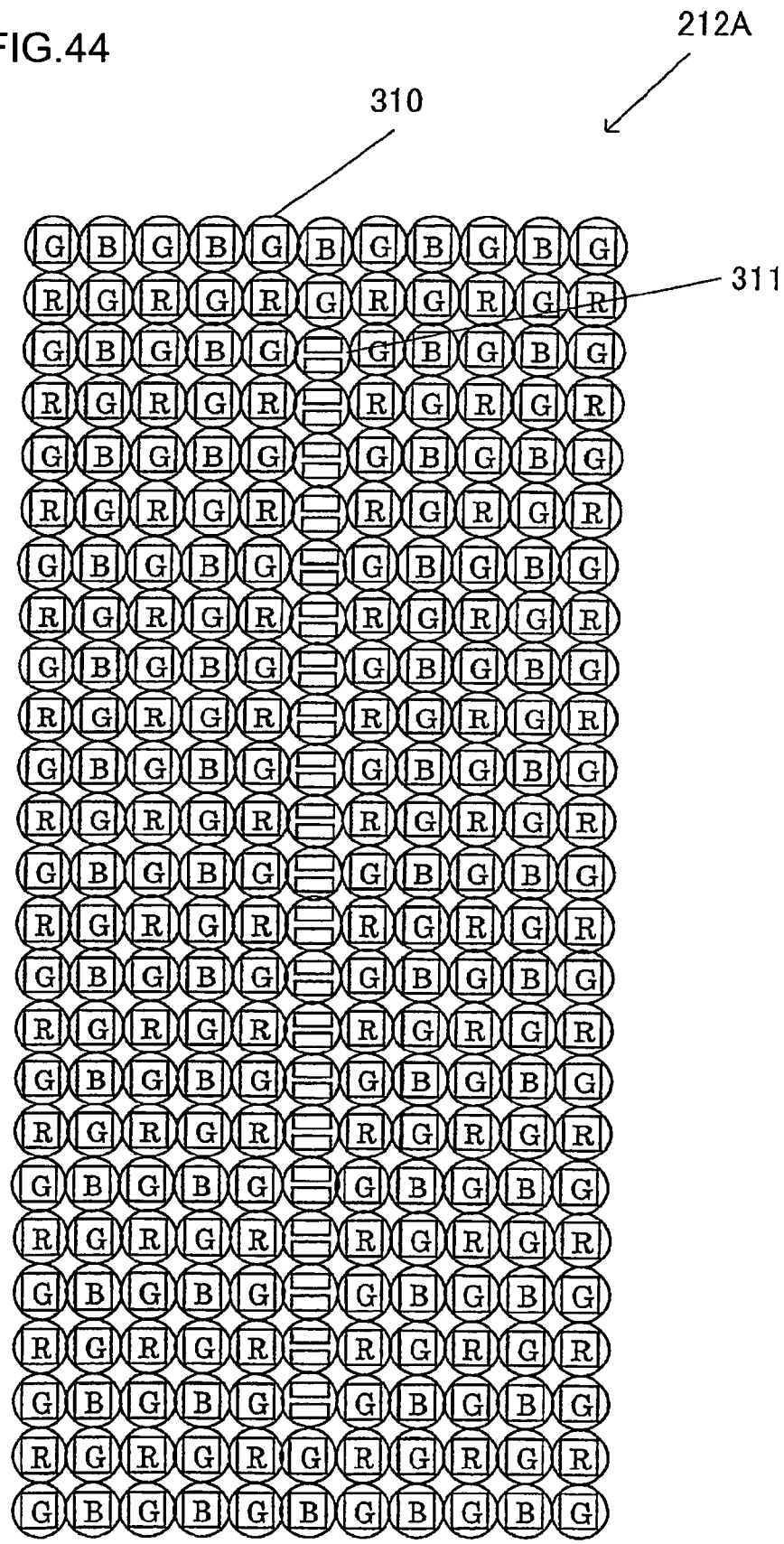
FIG. 44 shows an image sensor achieved in a variation.

While the focus detection pixels 313 and 314 in the image sensor 212 shown in FIG. 3 each include a single photoelectric conversion unit, the present invention may be adopted in conjunction with focus detection pixels each equipped with a pair of photoelectric conversion units. FIG. 44 is a partial enlargement of an image sensor 212A similar to the image sensor 212 shown in FIG. 3. Focus detection pixels 311 in FIG. 44 each include a pair of photoelectric conversion units. Each focus detection pixel 311 in FIG. 44 fulfills a function achieved by a pair of focus detection pixels 313 and 314 in FIG. 3.

Figure 45:
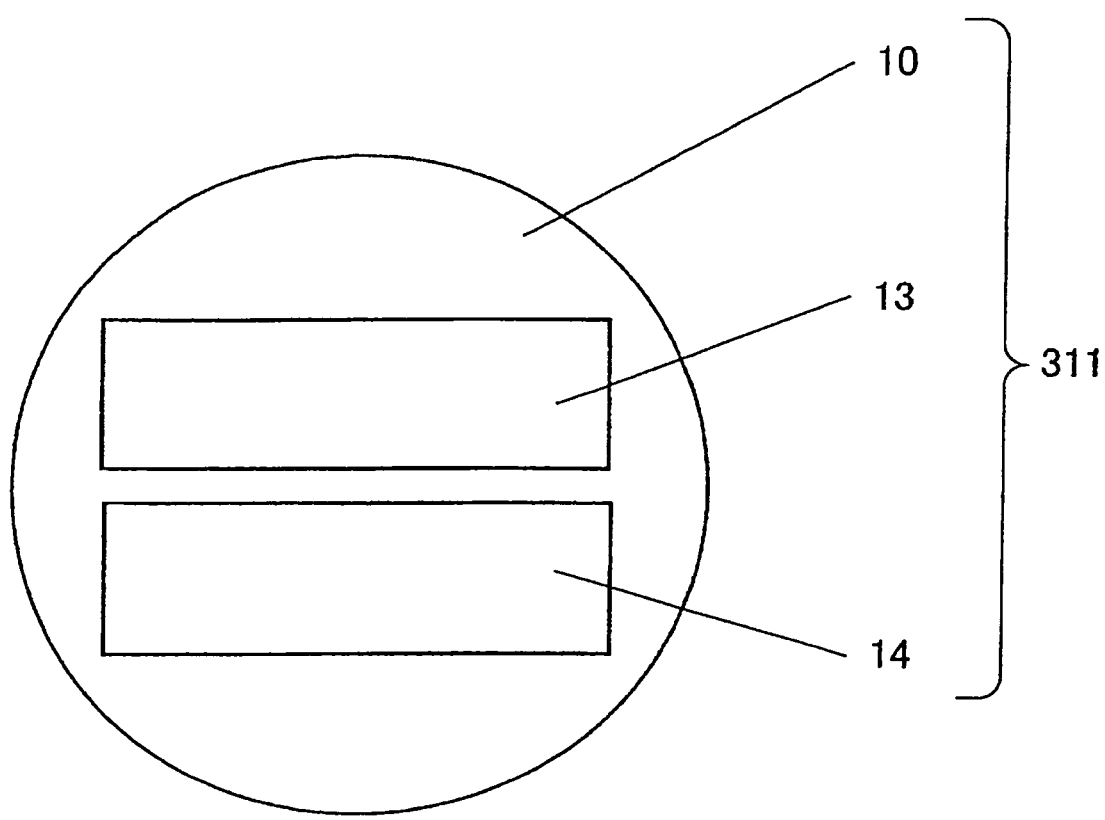
FIG. 45 is a front view of a focus detection pixel included in the image sensor in the variation shown in FIG. 44.

As shown in FIG. 45, the focus detection pixels 311 each include a micro-lens 10 and a pair of photoelectric conversion units 13 and 14. In order to assure a sufficient light quantity, no color filters are disposed at the focus detection pixels 311. The focus detection pixels have the spectral sensitivity characteristics (see FIG. 7), which are achieved by integrating the spectral sensitivity of the photodiodes engaged in photoelectric conversion and the spectral sensitivity characteristics of the infrared filters (not shown). Namely, the spectral sensitivity characteristics are similar to the sum of the spectral sensitivity characteristics of the green pixels, the red pixels and the blue pixels shown in FIG. 6, which indicate sensitivity in a light wavelength range containing the light wavelength ranges corresponding to the sensitivity characteristics of all the pixels, i.e., the green pixels, the red pixels and the blue pixels.

Figure 46:
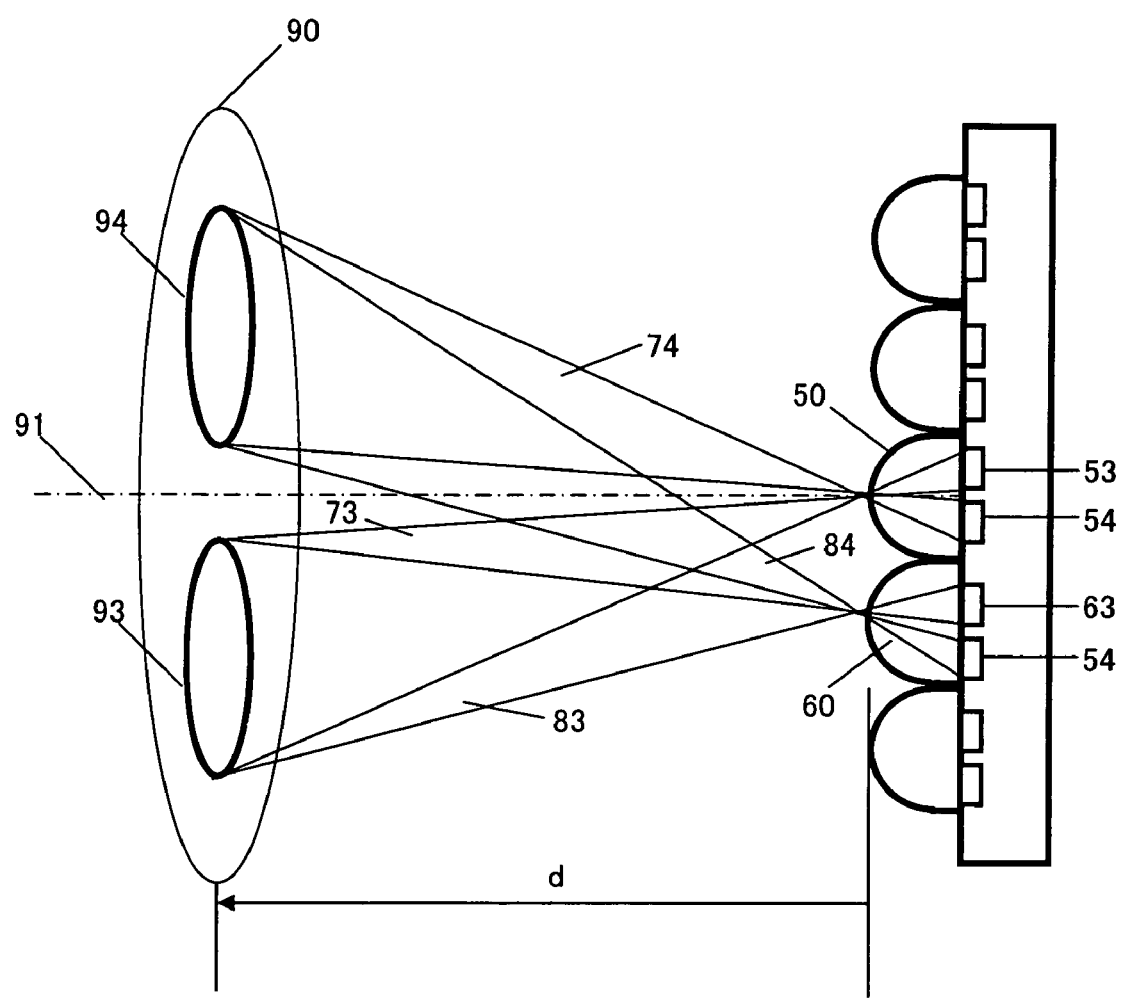
FIG. 46 illustrates the focus detection operation executed by adopting a split-pupil phase difference detection method at focus detection pixels in the image sensor shown in FIG. 44.

FIG. 46 shows the focus detection operation executed through a split-pupil phase difference detection method via the focus detection pixels at the image sensor 212A in FIG. 42. An exit pupil 90 is set over a distance d along the frontward direction from the micro-lenses disposed at the estimated imaging plane of the exchangeable lens in FIG. 46. The distance d is determined in correspondence to the curvature of the micro-lenses, the refractive index of the micro-lenses, the distance between the micro-lenses and the photoelectric conversion units and the like, and is hereafter referred to as a focus detection pupil distance. FIG. 46 also shows an optical axis 91 of the exchangeable lens, micro-lenses 50 and 60, pairs of photoelectric conversion units (53, 54) and (63, 64) at focus detection pixels 311 and focus detection light fluxes 73, 74, 83 and 84.

In addition, a focus detection pupil 93 is defined by the shapes of the photoelectric conversion units 53 and 63 projected via the micro-lenses 50 and 60. Likewise, a focus detection pupil 94 is defined by the shapes of the photoelectric conversion units 54 and 64 projected via the micro-lenses 50 and 60. While FIG. 46 schematically shows the focus detection pixel 311 (constituted with the micro-lens 50 and the pair of photoelectric conversion units 53 and 54) disposed on the optical axis 91 and an adjacent focus detection pixel 311 (constituted with the micro-lens 60 and the pair of photoelectric conversion units 63 and 64), the pairs of photoelectric conversion units of other focus detection pixels 311 disposed in the periphery, too, receive light fluxes arriving at their micro-lenses 50 and 60 from the pair of focus detection pupils 93 and 94. The focus detection pixels are arrayed in a direction matching the direction in which the pair of focus detection pupils 93 and 94 are set side-by-side.

The micro-lenses 50 and 60 are disposed near the predetermined imaging plane of the exchangeable lens 202. The shapes of the pair of photoelectric conversion units 53 and 54 disposed behind the micro-lens 50 set on the optical axis 91 are projected via the micro-lens 50 onto the exit pupil 90 set apart from the micro-lens 50 by the focus detection pupil distance d, and the projected shapes define the focus detection pupils 93 and 94. The shapes of the pair of photoelectric conversion units 63 and 64 disposed behind the micro-lens 60 adjacent to the micro-lens 50 are projected via the micro-lens 60 onto the exit pupil 90 set apart by the projection distance d, and the projected shapes define the focus detection pupils 93 and 94. Namely, the positional relationship between the micro-lens and the photoelectric conversion units at each pixel is determined so that the projected shapes (focus detection pupils 93 and 94) of the photoelectric conversion units at the various focus detection pixels are aligned on the exit pupil 90 located over the projection distance d.

The photoelectric conversion unit 53 outputs a signal corresponding to the intensity of an image formed on the micro-lens 50 with the light flux 73 having passed through the focus detection pupil 93 and having advanced toward the micro-lens 50. The photoelectric conversion unit 54 outputs a signal corresponding to the intensity of an image formed on the micro-lens 50 with the focus detection light flux 74 having passed through the focus detection pupil 94 and having advanced toward the micro-lens 50. Likewise, the photoelectric conversion unit 63 outputs a signal corresponding to the intensity of an image formed on the micro-lens 60 with the light flux 83 having passed through the focus detection pupil 93 and having advanced toward the micro-lens 60. The photoelectric conversion unit 64 outputs a signal corresponding to the intensity of an image formed on the micro-lens 60 with the focus detection light flux 84 having passed through the focus detection pupil 94 and having advanced toward the micro-lens 60.

By linearly disposing a large number of focus detection pixels each structured as described above and integrating the outputs from the pairs of photoelectric conversion units at the individual focus detection pixels into output groups each corresponding to one of the two focus detection pupils 93 and 94, information related to the intensity distribution of the pair of images formed on the focus detection pixel row with the individual focus detection light fluxes passing through the focus detection pupil 93 and the focus detection pupil 94, is obtained. Image shift detection arithmetic processing (correlation arithmetic processing, phase difference detection processing), to be detailed above, is subsequently executed by using the information thus obtained so as to detect an adjacent shift amount indicating the extent of image shift manifested by the pair of images through the split-pupil phase difference detection method. Then, by executing a specific type of conversion processing on the image shift amount, the deviation (defocus amount) of the current imaging plane (the actual imaging plane at the focus detection position on the imaging plane 100) relative to the predetermined imaging plane (the position of the micro-lens array) is calculated.

While the imaging pixels 310 in the image sensor 212 shown in FIG. 3 is equipped with color filters set in a Bayer array, color filters adopting a structure and set in an array other than those shown in the figure may be used in conjunction with the present invention. For instance, an image sensor that includes complementary color (green; G, yellow; Ye filters, magenta; Mg, cyan; Cy) filters, may be used. In addition, while the focus detection pixels 313 and 314 in the image sensor 212 shown in FIG. 3 are not equipped with color filters, the present invention may be adopted in conjunction with focus detection pixels equipped with color filters, the color of which matches one of the colors of the color filters at the imaging pixels 310 (e.g., green filters).

Furthermore, while the photoelectric conversion units disposed at the focus detection pixels 311, 313 and 314 in FIGS. 5 and 45, achieved in the embodiments described above, assume a semicircular shape and a rectangular shape, the photoelectric conversion units in focus detection pixels may assume a shape other than these. For instance, focus detection pixels may include photoelectric conversion units assuming an elliptical shape or a polygonal shape.

While the image sensor 212 in FIG. 3 assumes a dense square grid array constituted with imaging pixels and focus detection pixels, it may instead adopt a dense hexagonal grid (honeycomb) array.

While the focus detection operation is executed in the embodiments described above by adopting the split-pupil phase difference detection method by using micro-lenses, the present invention may be adopted when executing focus detection through a method other than the particular detection method and it may also be adopted in a focus detection device that executes focus detection through a split-pupil phase difference detection method achieved via a polarizing element, such as that disclosed in Japanese Laid Open Patent Publication No. 2008-15157.

Figure 47:
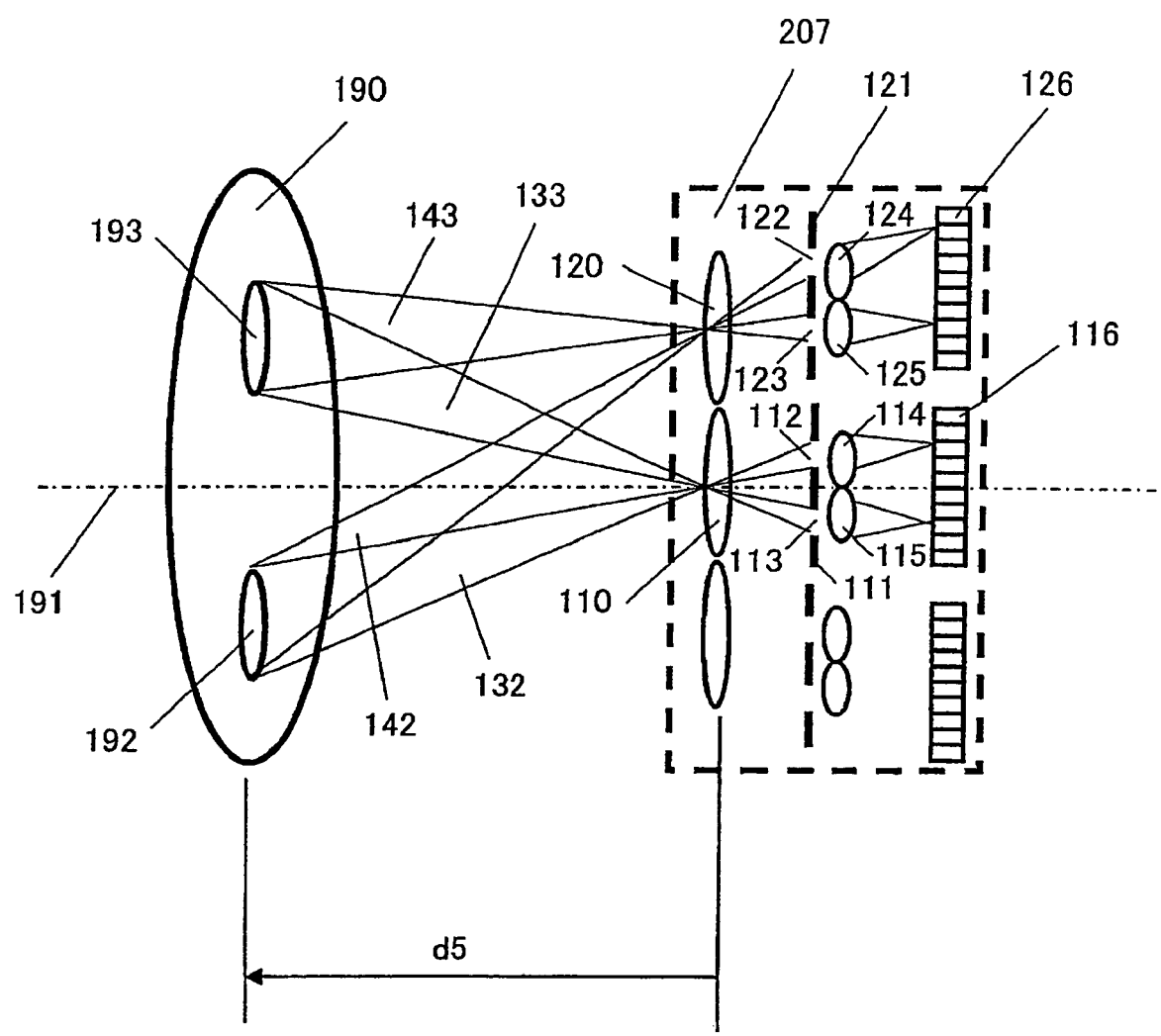
FIG. 47 illustrates a focus detection operation executed by adopting a image reforming split-pupil phase difference detection method.

While the focus detection operation described in reference to the embodiments is executed through a split-pupil phase difference detection method by using micro-lenses, the present invention is not limited to focus detection using this method, and it may be adopted instead in focus detection adopting an image reforming split-pupil phase difference detection method. In reference to FIG. 47, focus detection executed by adopting the image reforming split-pupil phase difference detection method is described. In FIG. 47, reference numerals 191 indicates the optical axis of the exchangeable lens, reference numerals 110 and 120 each indicate a condenser lens, reference numerals 111 and 121 each indicate an aperture mask, reference numerals 112, 113, 122 and 123 each indicate an aperture opening, reference numerals 114, 115, 124 and 125 each indicate an image reforming lens and reference numerals 116 and 126 each indicate a focus detection image sensor (CCD).

In addition, focus detection light fluxes 132, 133, 142 and 143 exit an exit pupil 190 assuming a position set over a distance d5 further to the front relative to the predetermined imaging plane of the exchangeable lens. The distance d5, which is determined in correspondence to the focal lengths of the condenser lenses 110 and 120, the distances to the aperture openings 112, 113, 122 and 123 from the condenser lenses 110 and 120 and the like, is referred to as a focus detection pupil distance in the following description. A focus detection pupil 192 is defined with the shape of the aperture openings 112 and 122 projected via the condenser lenses 110 and 120. Likewise, a focus detection pupil 192 is defined by the shape of the aperture openings 113 and 123 projected via the condenser lenses 110 and 120. The condenser lens 110, the aperture mask 111, the aperture openings 112 and 113, the image reforming lenses 114 and 115 and the image sensor 116 constitute a focus detection unit that executes focus detection through split-pupil phase difference detection method at a given position by adopting the image reforming method.

FIG. 47 schematically illustrates a focus detection unit present on the optical axis 191 and a focus detection unit present off the optical axis. By using a plurality of focus detection units in combination, a focus detection device capable of executing focus detection through split-pupil phase difference detection method adopting the image reforming method at three different focus detection positions, as indicated by 101 through 103 in FIG. 2, may be realized.

The focus detection unit 207 includes the condenser lens 110 disposed near the predetermined imaging plane of the exchangeable lens, the image sensor 116 disposed to the rear of the condenser lens, the pair of image reforming lenses 114 and 115 disposed between the condenser lens 110 and the image sensor 116 to reform a primary image having been formed near the predetermined imaging plane onto the image sensor 116 and the aperture mask 121 that includes the pair of aperture openings 112 and 113 disposed near the pair of image reforming lenses (to the front of the lenses in FIG. 47).

The image sensor 116 is a line sensor constituted with a plurality of photoelectric conversion units densely disposed along a straight line. The photoelectric conversion units in the image sensor are disposed along a direction matching the direction along which the pair of focus detection pupils are separated from each other (the direction along which the aperture openings are set side-by-side). Information corresponding to the intensity distributions in the pair of images reformed on the image sensor 116 is output from the image sensor 116. Through the image shift detection arithmetic processing (correlation processing, phase difference detection processing) executed on the information, the image shift amount indicating the extent of shift of the pair of images is detected via the image reforming split-pupil phase difference detection method. The image shift amount is then multiplied by a predetermined conversion coefficient so as to calculate the extent of deviation (defocus amount) of the current imaging plane relative to the predetermined imaging plane.

The image sensor 116 is projected onto the predetermined imaging plane via the image reforming lenses 114 and 115, and the accuracy with which the defocus amount (image shift amount) is detected is determined in correspondence to the image shift amount detection pitch (the pitch at which the photoelectric conversion units, projected onto the predetermined imaging plane, are disposed in the case of detection executed by adopting the image reforming method).

The aperture openings 112 and 113 at the aperture mask 111 are projected via the condenser lens 110 onto the exit pupil 190, defining the areas 192 and 193. The areas 192 and 193 are referred to as focus detection pupils. Namely, the pair of images reformed on the image sensor 116 are formed with light fluxes passing through the pair of focus detection pupils 192 and 193 on the exit pupil 190. The light fluxes 132 and 133 passing through the pair of focus detection pupils 192 and 193 on the exit pupil 190 are referred to as focus detection light fluxes.

In the split-pupil phase difference detection method adopting the image reforming method as described above, too, vignetting at the focus detection pupils results in an imbalance between the pair of images formed on the image sensor 116 and accordingly, the present invention may be adopted to significant advantage when processing the output signals from the image sensor 116.

It is to be noted that the image-capturing apparatus according to the present invention may be embodied as an apparatus other than the digital still camera or a film still camera with the exchangeable lens 202 mounted at the camera body 203. The present invention may also be adopted in a digital still camera or a film still camera with an integrated lens or in a video camera. It may also be adopted in a compact camera module built into a portable telephone or the like, a visual recognition device in a surveillance camera or robotics applications, an on-vehicle camera or the like.

While an explanation is given above in reference to the embodiments on an example in which focus detection is executed through a split-pupil phase difference detection method by executing the correlation calculation described above on a pair of signal strings corresponding to a pair of light fluxes passing through different areas of the pupil of the imaging optical system, obtained based upon signals generated via focus detection pixels disposed in an array of imaging pixels, the present invention may be adopted in a hybrid focus detection device that executes focus detection through a contrast method of the known art based upon the outputs from the imaging pixels and also executes focus detection through a split-pupil phase difference detection method based upon the outputs from the focus detection pixels as well.

The present invention may also be adopted in a focus detection device, a range finding device or a stereo range finding device in applications other than camera applications. Furthermore, it may be adopted in a device that detects the motion of a subject image or a camera vibration by detecting the correlation between image sensor signals generated at different times. As a further alternative, the present invention may be adopted in pattern matching operation executed to match the pattern indicated in an image signal from an image sensor with the pattern of a specific image signal.

Moreover, the present invention is not limited to applications in which the correlation between different sets of image signal data is detected, and it may be adopted in a broader range of applications in which the correlation between two signals must be detected, i.e., the correlation between different sets of audio data.

The above described embodiments are examples, and various modifications can be made without departing from the scope of the invention.

What is claimed is:

1. A focus detection device, comprising:
a light-receiving unit that receives a pair of images formed with a pair of light fluxes passing through an optical system and outputs a first signal string and a second signal string corresponding to the pair of images;
a decision-making unit that determines a condition assumed as the light-receiving unit receives the pair of images;
a selection unit that selects a correlation operation expression among a plurality of correlation operation expressions, to be used to calculate a correlation between the first signal string and the second signal string, in correspondence to the condition determined by the decision-making unit;
a correlation calculation unit that calculates a correlation quantity indicating an extent of correlation between a plurality of first signals included in the first signal string and a plurality of second signals included in the second signal string by applying the correlation operation expression selected by the selection unit to the plurality of first signals and the plurality of second signals;
a shift amount detection unit that detects a shift amount indicating an extent of shift between the pair of images based upon an extent of relative shift between the first signal string and the second signal string manifesting when the correlation quantity calculated by the correlation calculation unit assumes an extreme value; and
a focus detection unit that detects a focusing condition for the optical system based upon the shift amount detected by the shift amount detection unit, wherein:
the selection unit selects the correlation operation expression so as to reduce an extent to which signal intensity difference between the first signal string and the second signal string affects the correlation quantity indicating the extent of correlation between the plurality of first signals and the plurality of second signals.

2. A focus detection device according to claim 1 wherein:
at least one correlation operation expression among the plurality of correlation operation expressions includes a multiplication operation in which at least one of the plurality of first signals is multiplied by at least one of the plurality of second signals.

3. A focus detection device according to claim 2, wherein:
the plurality of correlation operation expressions differ from one another in the number of times the multiplication operation is executed.

4. A focus detection device according to claim 2, wherein:
the multiplication operation is an operation in which one of the plurality of first signals is multiplied by one of the plurality of second signals.

5. A focus detection device according to claim 2, wherein:
the plurality of first signals and the plurality of second signals each include at least three signals; and
the multiplication operation is an operation in which at least three signals are multiplied, including at least one of the plurality of first signals and at least one of the plurality of second signals.

6. A focus detection device according to claim 1, wherein:
the signal intensity difference is attributable to signal distortion having occurred in at least either the first signal string or the second signal string; and
the selection unit selects a plurality of correlation operation expressions assuming different characteristics in relation to the signal distortion from one another.

7. A focus detection device according to claim 1, wherein:
the signal intensity difference is related to noise having occurred in at least either the first signal string or the second signal string; and
the selection unit selects a plurality of correlation operation expressions assuming different characteristics in relation to the noise from one another.

8. A focus detection device according to claim 1, wherein:
the condition is at least one of; a state of vignetting of the pair of light fluxes manifesting in the optical system, an image height assumed at the light-receiving unit that receives the pair of images, noise having occurred in at least either the first signal string or the second signal string, a brightness level of a subject, the focusing condition for the optical system, a spatial frequency component in the pair of images and characteristics of the pair of images.

9. A focus detection device according to claim 1, wherein:
a plurality of focus detection pixels are arrayed at the light-receiving unit;
the plurality of focus detection pixels each include a micro lens and a photoelectric conversion unit that receives light from the optical system via the micro lens; and the light-receiving unit generates the first signal string and the second signal string based upon outputs from the plurality of focus detection pixels.

10. An image-capturing apparatus, comprising:
a focus detection device according to claim 9; and
an image sensor.

11. An image-capturing apparatus according to claim 10, wherein:
a plurality of imaging pixels that capture an image formed via the optical system and the plurality of focus detection pixels are arrayed on a single substrate; and
the image sensor includes the single substrate.

12. A correlation calculation method, comprising:
creating a relative displacement one-dimensionally in a positional relationship between a first signal string that includes a plurality of first signals arranged one-dimensionally and a second signal string that includes a plurality of second signals arranged one-dimensionally; and
calculating correlation quantities between the first signal string and the second signal string, by using a plurality of correlation operation expressions as a displacement extent of the relative displacement is altered.

13. A correlation calculation method according to claim 12, wherein:
at least one correlation operation expression among the plurality of correlation operation expressions includes a multiplication operation in which at least one of the plurality of first signals is multiplied by at least one of the plurality of second signals.

14. A correlation calculation method according to claim 13, wherein:
the plurality of correlation operation expressions include a first correlation operation expression containing a multiplication operation, in which a given first signal among the plurality of first signals in the first signal string and a specific second signal in the second signal string assuming a position separated from the given first signal by a first displacement quantity are multiplied by each other, and a second correlation operation expression containing a multiplication operation, in which the given first signal is multiplied by a specific second signal in the second signal string assuming a position separated from the given first signal by a second displacement quantity.

15. A correlation calculation method according to claim 12, further comprising:
determining a total sum of the correlation quantities calculated with the plurality of correlation operation expressions.

16. A correlation calculation method according to claim 12, further comprising:
judging reliability of each of the correlation quantities calculated by using the plurality of correlation operation expressions; and
extracting a correlation quantity judged to be highly reliable.

17. A correlation calculation method according to claim 16, wherein:
the correlation quantities are calculated by using the plurality of correlation operation expressions in a predetermined order; and
once the correlation quantity judged to be highly reliable is extracted, calculation of the correlation quantities ends.

18. A correlation calculation device, comprising:
a calculation unit that calculates the correlation quantities by adopting the correlation calculation method according to claim 12 and then calculates the displacement extent corresponding to an extreme value of the correlation quantities.

19. A focus detection device, comprising:
a light-receiving unit that receives a pair of light fluxes passing through an optical system to form a pair of images and outputs pairs of light reception signals with each pair of light reception signals made up with one of a plurality of first signals included in a first signal string corresponding to one of the pair of images and one of a plurality of second signals included in a second signal string corresponding to another image in the pair, each assuming a displacement relative to one of the first signals;
the correlation calculation device according to claim 18 that calculates the displacement extent corresponding to the extreme value; and
a focus detection unit that detects a focusing condition for the optical system based upon the displacement extent.

20. A focus detection device, comprising:
a light-receiving unit that receives a pair of images formed with a pair of light fluxes passing through an optical system and outputs a first signal string and a second signal string corresponding to the pair of images;
a decision-making unit that determines a condition assumed as the light-receiving unit receives the pair of images, the condition corresponding to a state of vignetting of the pair of light fluxes manifesting in the optical system;
a selection unit that selects a correlation operation expression among a plurality of correlation operation expressions, to be used to calculate a correlation between the first signal string and the second signal string, in correspondence to the condition determined by the decision-making unit;
a correlation calculation unit that calculates a correlation quantity indicating an extent of correlation between a plurality of first signals included in the first signal string and a plurality of second signals included in the second signal string by applying the correlation operation expression selected by the selection unit to the plurality of first signals and the plurality of second signals;
a shift amount detection unit that detects a shift amount indicating an extent of shift between the pair of images based upon an extent of relative shift between the first signal string and the second signal string manifesting when the correlation quantity calculated by the correlation calculation unit assumes an extreme value; and
a focus detection unit that detects a focusing condition for the optical system based upon the shift amount detected by the shift amount detection unit, wherein:
the selection unit selects the correlation operation expression so as to reduce an extent to which the state of vignetting affects the correlation quantity indicating the extent of correlation between the plurality of first signals and the plurality of second signals.

* * * * *